(12) United States Patent
Weissacher et al.

(10) Patent No.: US 8,763,962 B2
(45) Date of Patent: Jul. 1, 2014

(54) CRADLE AND CABLE HANDLER FOR A TEST HEAD MANIPULATOR

(75) Inventors: Hermann Josef Weissacher, Rimsting (DE); Benoit Jean Michel Goeuriot, Aschau im Chiemgau (DE); Wei Guan, Rosenheim (DE); Christopher L. West, Medford, NJ (US); Charles Paul Nappen, Woodbury, NJ (US)

(73) Assignee: inTEST Corporation, Cherry Hill, NJ (US)

( * ) Notice: Subject to any disclaimer, the term of this patent is extended or adjusted under 35 U.S.C. 154(b) by 1240 days.

(21) Appl. No.: 12/598,984

(22) PCT Filed: May 6, 2008
(Under 37 CFR 1.47)

(86) PCT No.: PCT/US2008/005906
§ 371 (c)(1),
(2), (4) Date: Aug. 9, 2010

(87) PCT Pub. No.: WO2008/137182
PCT Pub. Date: Nov. 13, 2008

(65) Prior Publication Data
US 2011/0174098 A1      Jul. 21, 2011

Related U.S. Application Data

(60) Provisional application No. 60/916,380, filed on May 7, 2007, provisional application No. 61/037,065, filed on Mar. 17, 2008.

(51) Int. Cl.
*A47F 5/00* (2006.01)

(52) U.S. Cl.
USPC .......................... 248/123.2; 248/325; 212/196

(58) Field of Classification Search
USPC .............. 248/58, 60, 123.2, 125.7, 325, 324; 212/299, 196, 240, 246, 347; 414/142.8, 543
See application file for complete search history.

(56) References Cited

U.S. PATENT DOCUMENTS 1,470,296 A * 10/1923 Stedman ..................... 248/123.2
1,486,120 A *  3/1924 Bayles .......................... 248/648
(Continued)

FOREIGN PATENT DOCUMENTS

| CN | 1483146 A | 3/2004 |
|---|---|---|
| JP | 2006-322944 A | 11/2006 |

OTHER PUBLICATIONS

Chinese Office Action 200880015142.8 w/English Translation, Jul. 20, 2011.

(Continued)

*Primary Examiner* — Bradley Duckworth
(74) *Attorney, Agent, or Firm* — RatnerPrestia

(57) ABSTRACT

In one aspect, a cradle system for supporting a load, the cradle system comprising a first arm with a first carriage assembly axially adjustable therealong and a second arm, opposite the first arm, with a second carriage assembly axially adjustable therealong. An actuator is associated with the first and second carriage assemblies and configured such that actuation of the actuator causes the first and second carriage assemblies to move axially in opposite directions. In another aspect, a cable support system comprising a support column and one or more tethers supported by the support column and configurable so that at least one tether is configured to move its supported cable in the same or opposite direction as the test head moves at a rate that is a constant multiplied by the test heads rate of motion where the constant may be greater than, equal to, or less than one.

11 Claims, 69 Drawing Sheets

(56) References Cited

U.S. PATENT DOCUMENTS

| | | | | |
|---|---|---|---|---|
| 2,041,242 | A * | 5/1936 | Goldfield | 248/123.2 |
| 2,592,993 | A * | 4/1952 | Adams | 414/543 |
| 4,187,949 | A * | 2/1980 | Komatsu | 212/307 |
| 4,271,970 | A * | 6/1981 | Miller et al. | 212/272 |
| 5,158,516 | A * | 10/1992 | Johnson | 482/95 |
| 5,348,172 | A * | 9/1994 | Wilson | 212/196 |
| 5,687,943 | A * | 11/1997 | Campbell | 248/331 |
| 6,152,675 | A * | 11/2000 | Compton | 414/543 |
| 6,821,075 | B2 * | 11/2004 | van der Horn | 414/462 |
| 6,838,868 | B1 | 1/2005 | Bosy | |
| 7,011,123 | B2 * | 3/2006 | Peterson | 144/195.1 |
| 7,354,384 | B2 * | 4/2008 | Martin et al. | 482/92 |
| 7,370,769 | B2 * | 5/2008 | Picard et al. | 212/292 |
| 7,416,169 | B2 * | 8/2008 | Noeske et al. | 254/275 |
| 8,212,578 | B1 * | 7/2012 | Gajda et al. | 324/750.16 |
| 2002/0168258 | A1 * | 11/2002 | Philipps et al. | 414/462 |
| 2006/0001416 | A1 | 1/2006 | West | |
| 2006/0177298 | A1 | 8/2006 | Mueller | |
| 2006/0276310 | A1 * | 12/2006 | Martin et al. | 482/92 |
| 2007/0290182 | A1 * | 12/2007 | Noeske et al. | 254/327 |

OTHER PUBLICATIONS

International Search Report for International Application No. PCT/US2008/005906, Feb. 13, 2009.

* cited by examiner

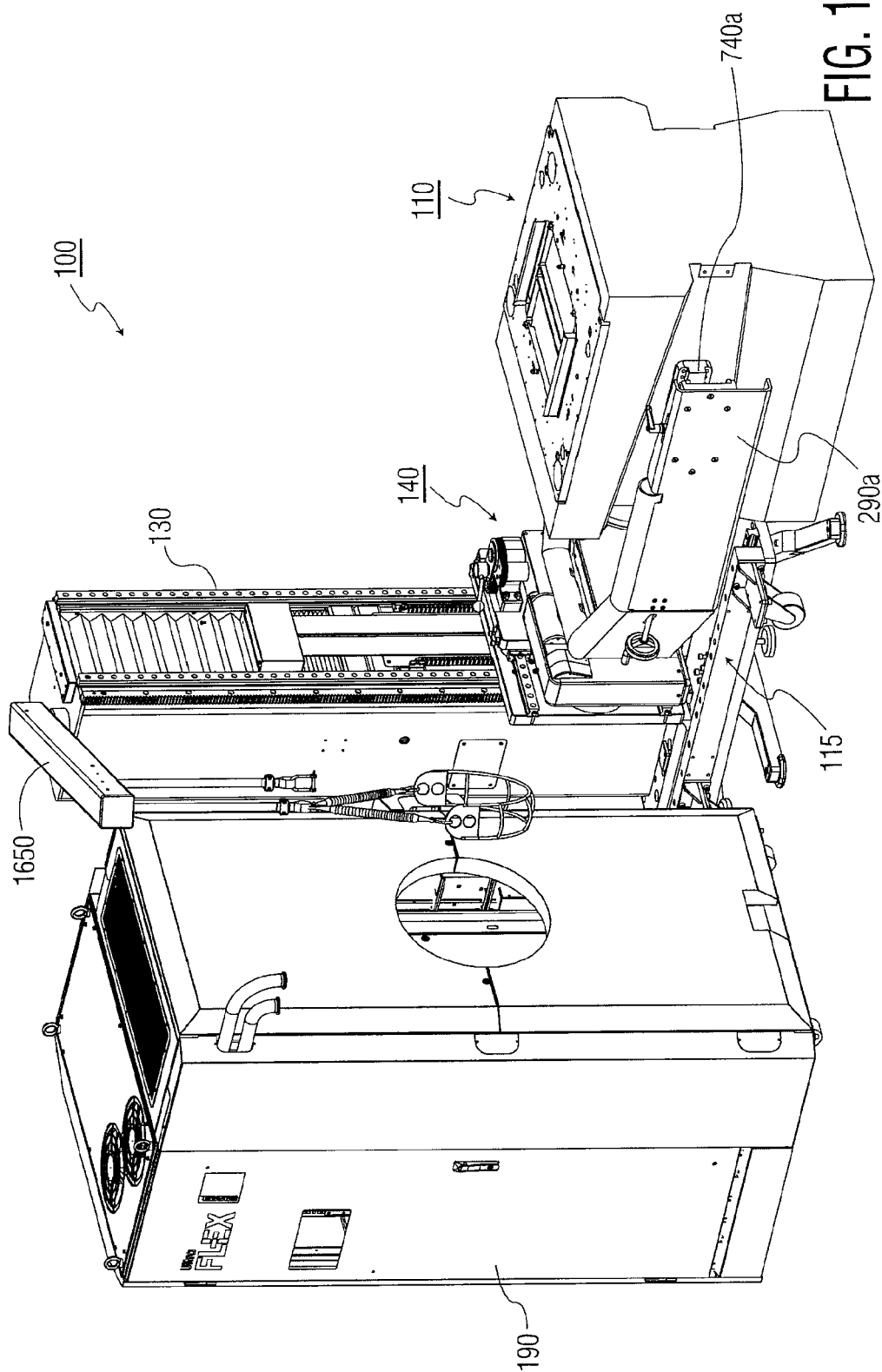

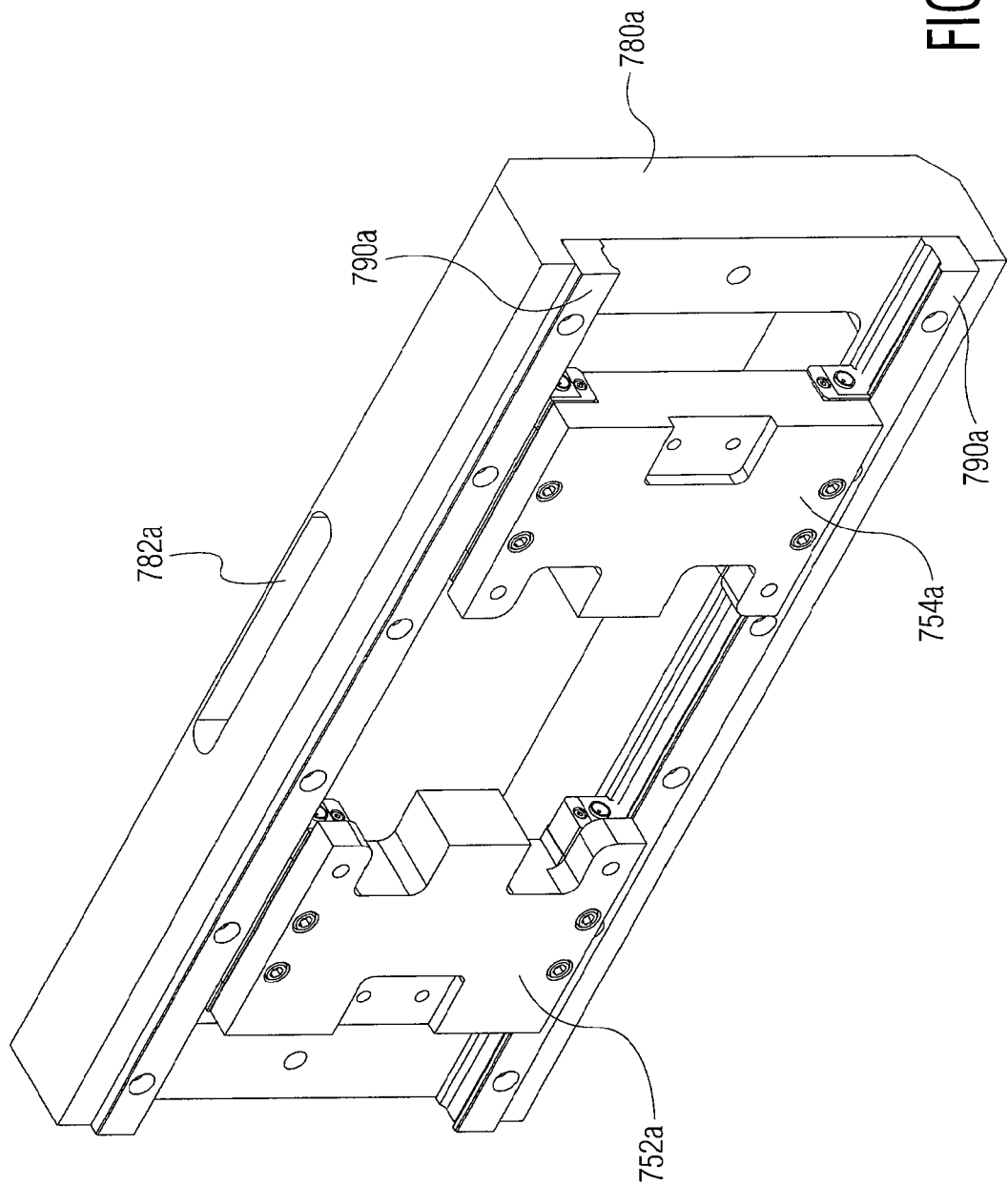

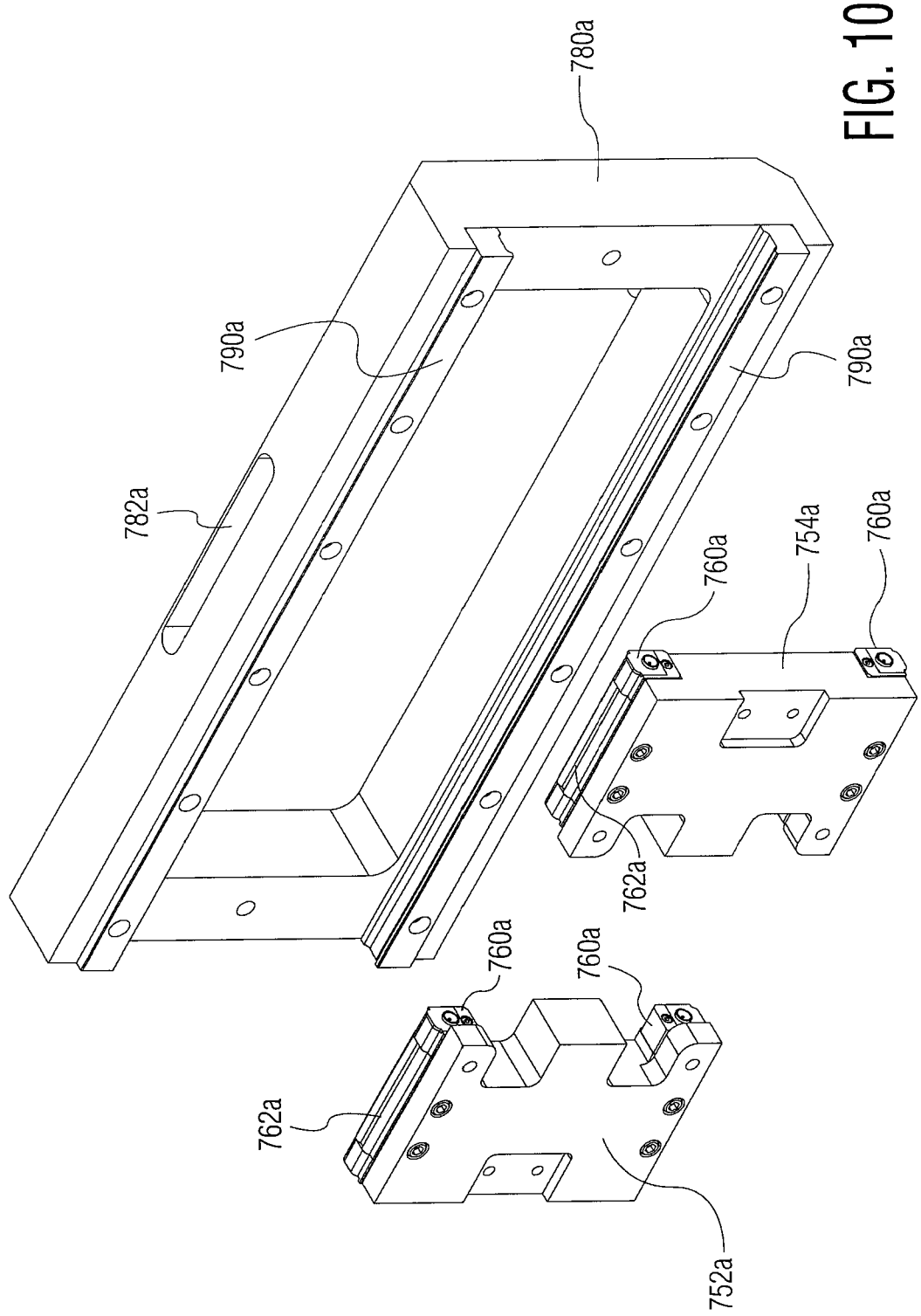

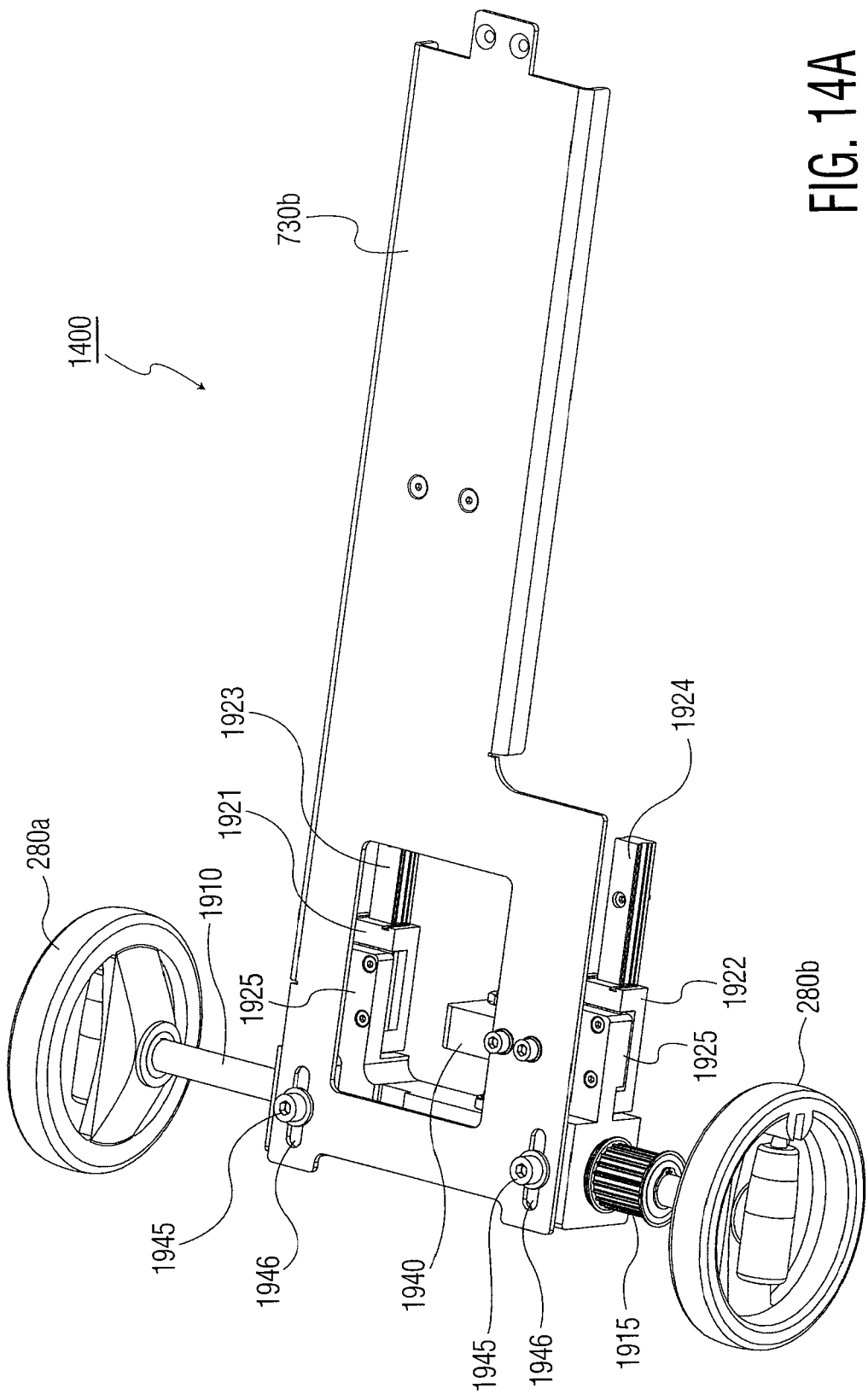

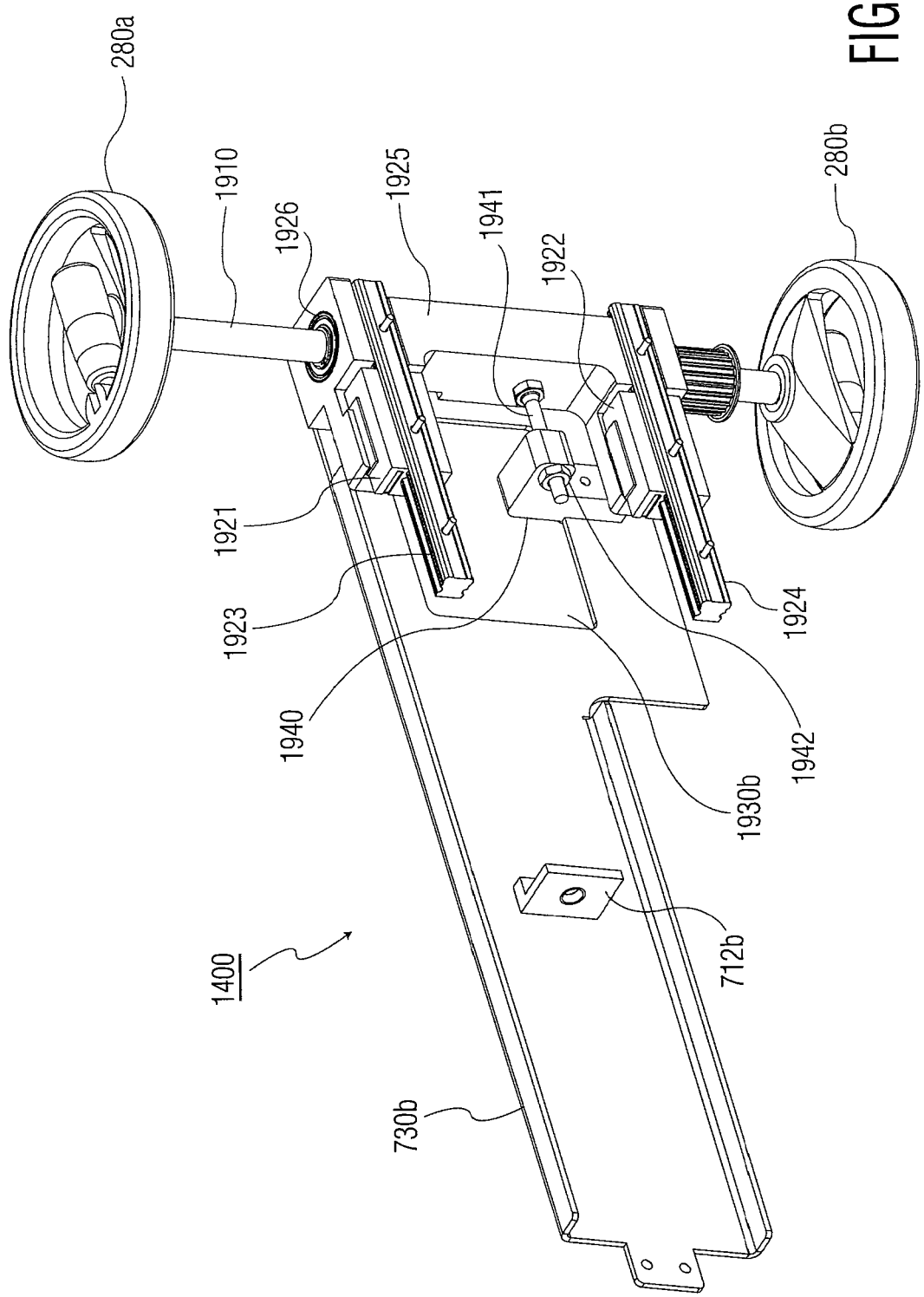

CRADLE AND CABLE HANDLER FOR A TEST HEAD MANIPULATOR

THIS APPLICATION IS A U.S. NATIONAL PHASE APPLICATION OF PCT INTERNATIONAL APPLICATION PCT/US2008/005906.

BACKGROUND OF THE INVENTION

The present invention relates to a testing device, and more particularly, to a cradle and cable handler for a test head manipulator.

U.S. Pat. No. 5,931,048 to Slocum, which is included for all of its teachings by reference, describes a test head positioner or manipulator that includes a cradle (FIG. 6 of '048) for holding a test head. Mechanisms within this cradle allow the test head to be moved in directions (defined in FIG. 2 of '048) In-Out, Nod Up-Down, and Theta Left-Right. (Nod motion may also be referred to as pitch or tumble elsewhere in the literature and herein. Theta motion may sometimes be referred to as yaw motion elsewhere in the literature and herein.) Each of the two sides of the test head is coupled to one of two cradle arms. A motorized actuator is provided in each of the two cradle arms to move that arm's test head coupling linearly along the arm. If the two actuators move their respective coupling in the same direction, In-Out motion is achieved. If the two actuators move their respective couplings in opposite directions, Theta Left-Right motions are achieved. The motor driven actuators include clutch mechanisms. With the clutches disengaged, a relatively small external force may be applied to move the test head slightly with respect to the cradle. This provides compliance to enable a test head dock to finely position the test head with respect to a test peripheral such as a package handler or wafer prober. This is a relatively complex and expensive solution in that it requires electromagnetic components and a controller to coordinate the motions of the two actuators. The '048 patent also identifies that the handling of the cable that connects the test head to a mainframe is difficult and complicates smooth positioning of the test head. As cables become increasingly large and awkward due to the inclusion of more conductors, air ducts for cooling, and hoses and tubing for conveying liquid coolants, this problem has grown increasingly difficult.

SUMMARY OF THE INVENTION

In an exemplary embodiment, a cradle includes theta motion by using a single actuator, which may be a manual crank or handle, or it may be motorized.

In one aspect of the invention, a cradle system for supporting a load is provided. The cradle system comprises a first arm with a first carriage assembly axially adjustable therealong and a second arm, opposite the first arm, with a second carriage assembly axially adjustable therealong. An actuator is associated with the first and second carriage assemblies and configured such that actuation of the actuator causes the first and second carriage assemblies to move axially in opposite directions.

In a further exemplary embodiment, integrated driven theta/tumble motion is provided within a cradle including compliance in theta, tumble and in-out degrees of freedom.

A further exemplary embodiment provides a scheme of cable handling. In one aspect of the invention, the cable support system comprises a support column and one or more tethers supported by the support column and configurable so that at least one tether is configured to move its supported cable in the same or opposite direction as the test head moves at a rate that is a constant multiplied by the test heads rate of motion where the constant may be greater than, equal to, or less than one.

BRIEF DESCRIPTION OF THE DRAWING FIGURES

FIGS. 1A and 1B are three-dimensional views of the overall test system.

Figure 10A:
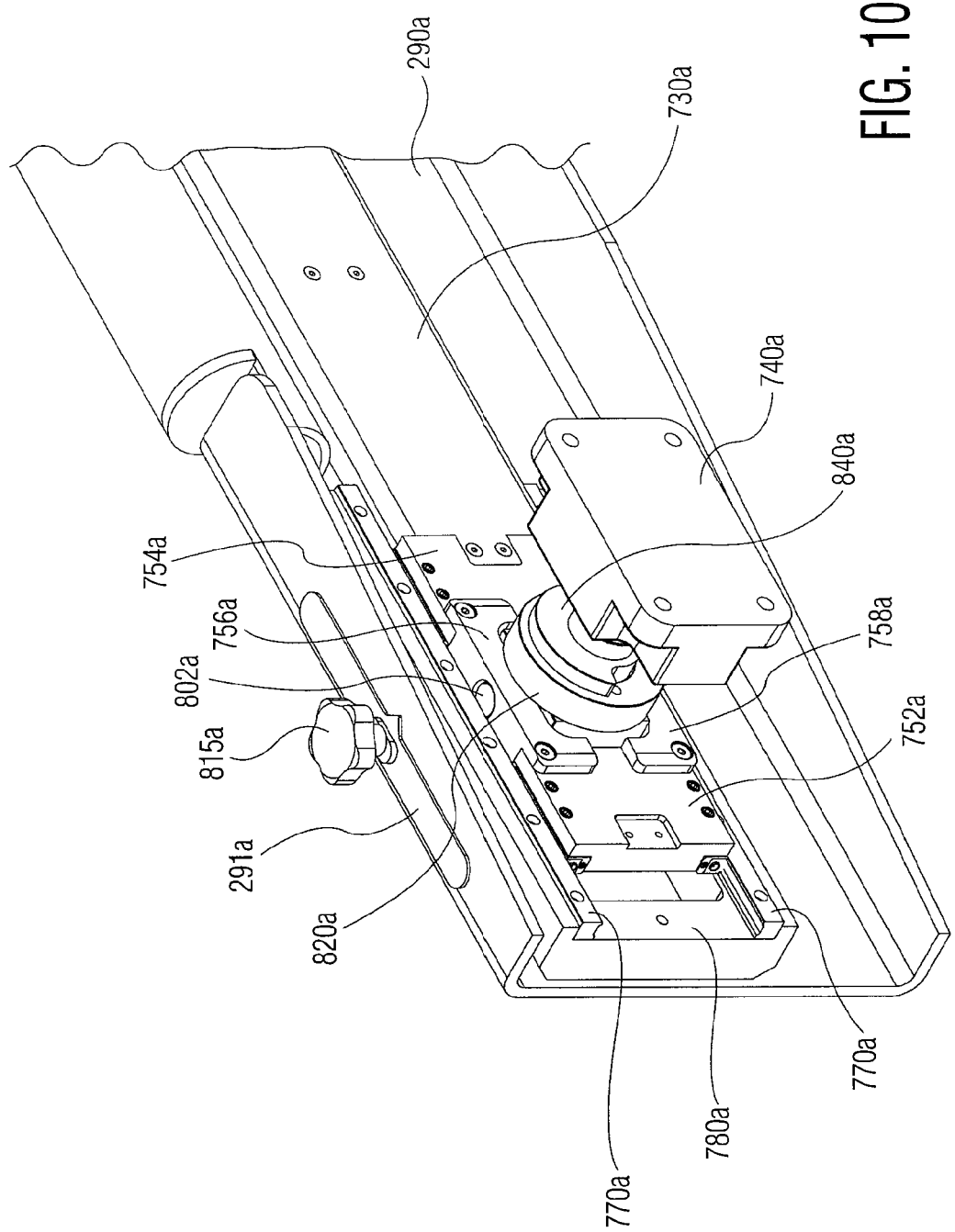
FIG. 10A is a three-dimensional view of the apparatus of FIGS. 8A and 8B coupled to the interior of a cradle arm.

FIG. 10B, derived from FIG. 10A, shows theta carriages slidingly attached to a mounting block.

FIG. 10C is a partially exploded view of FIG. 10B.

Figure 11A:
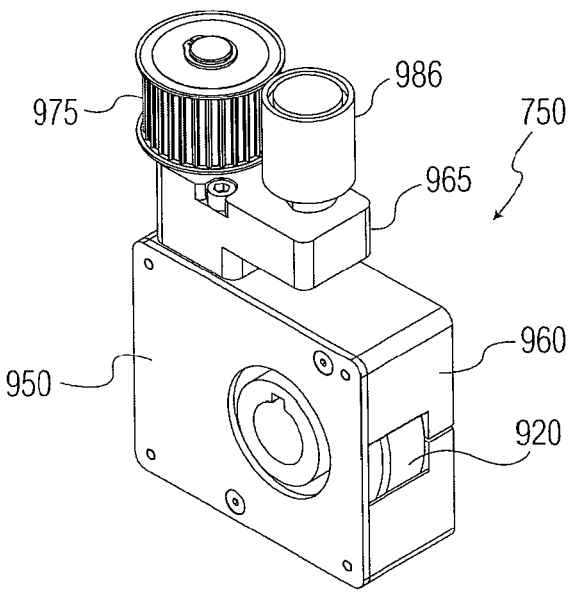

FIG. 11A is a three-dimensional view of a tumble drive gear box.

Figure 11B:
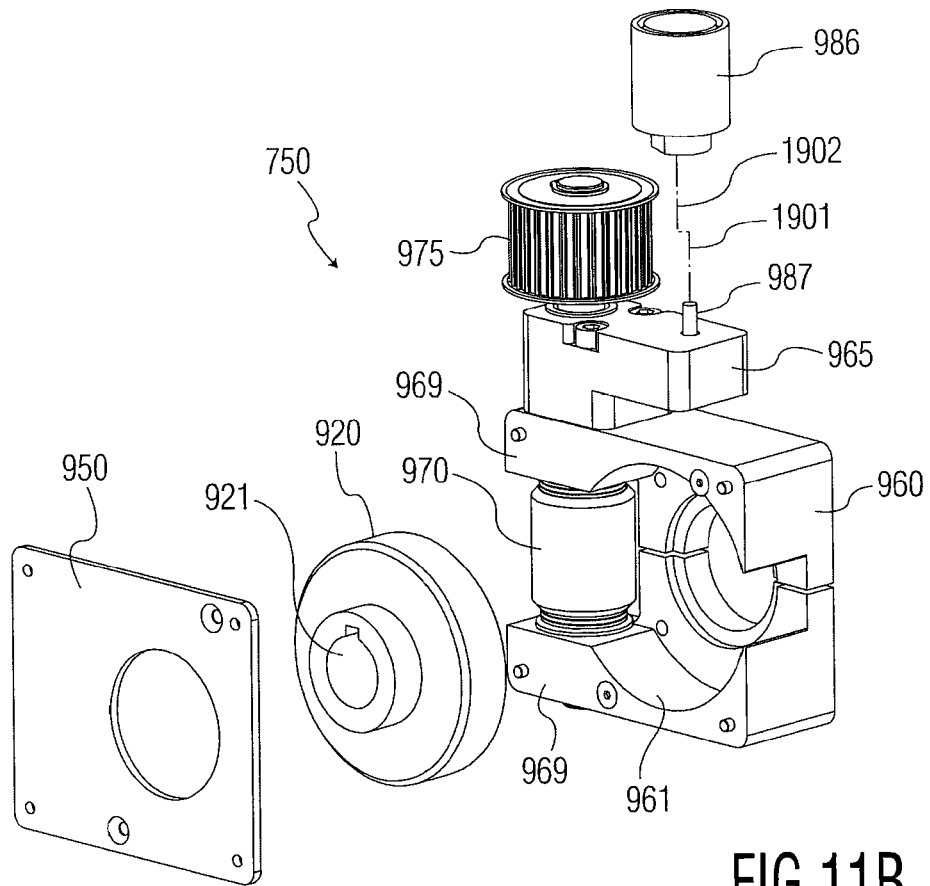

FIG. 11B is a partially exploded view of the apparatus in FIG. 11A.

Figure 12A:
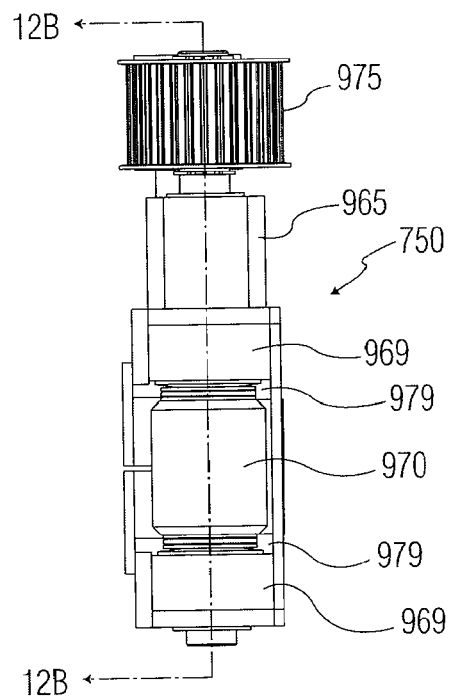
Figure 12B:
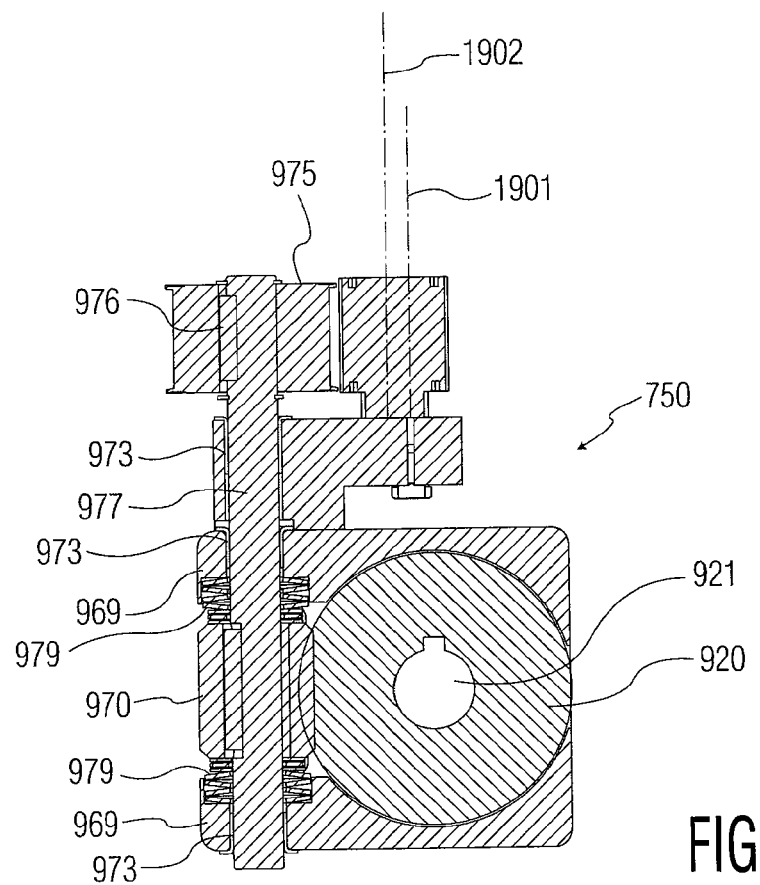

FIG. 12A is a side view of the apparatus shown in FIG. 11A defining a sectional view provided in FIG. 12B.

FIG. 12B is the sectional view defined in FIG. 12A.

Figure 13A:
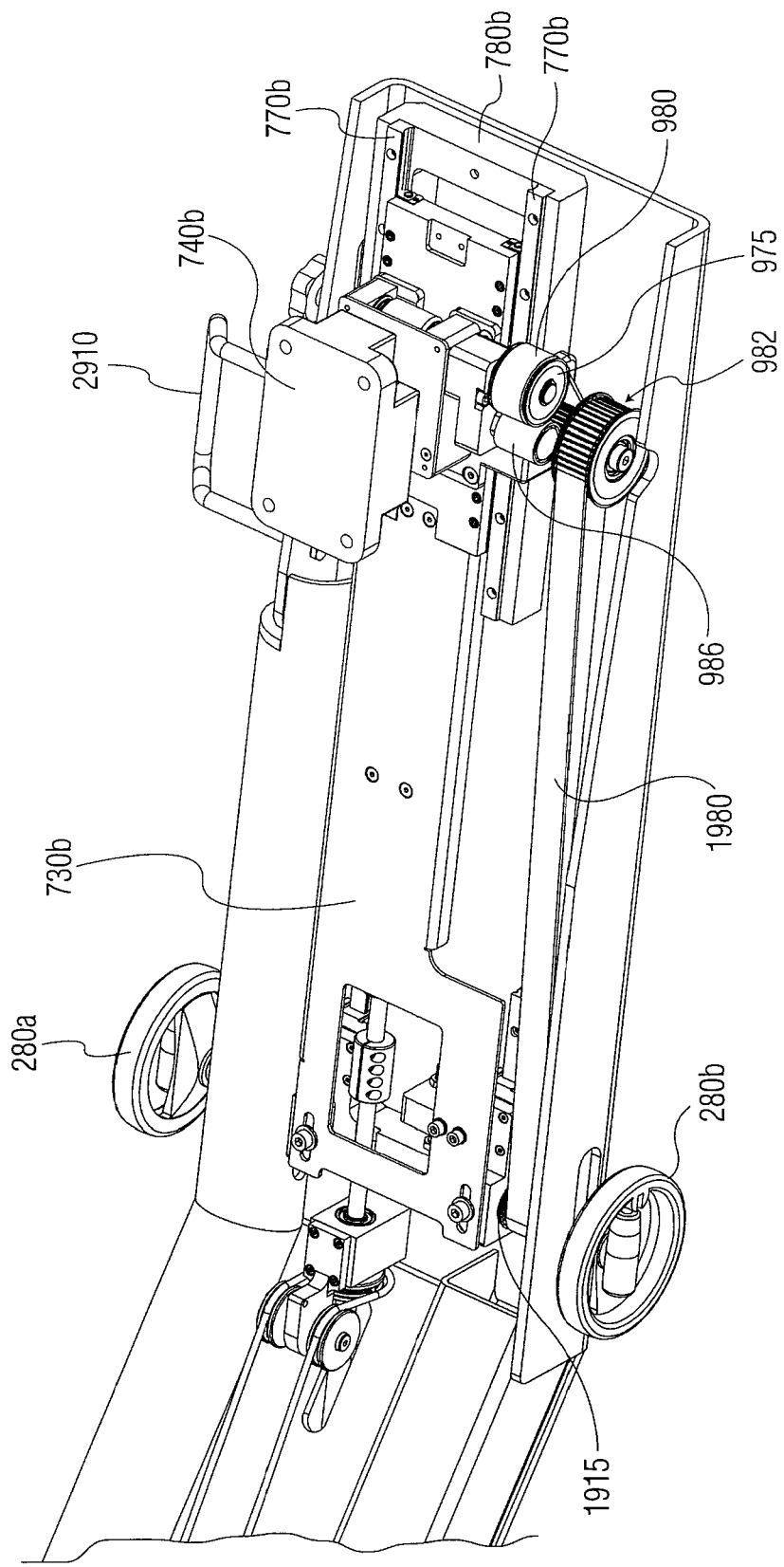

FIG. 13A is a three-dimensional view of the interior of a cradle arm where the tumble drive apparatus is located.

Figure 13B:
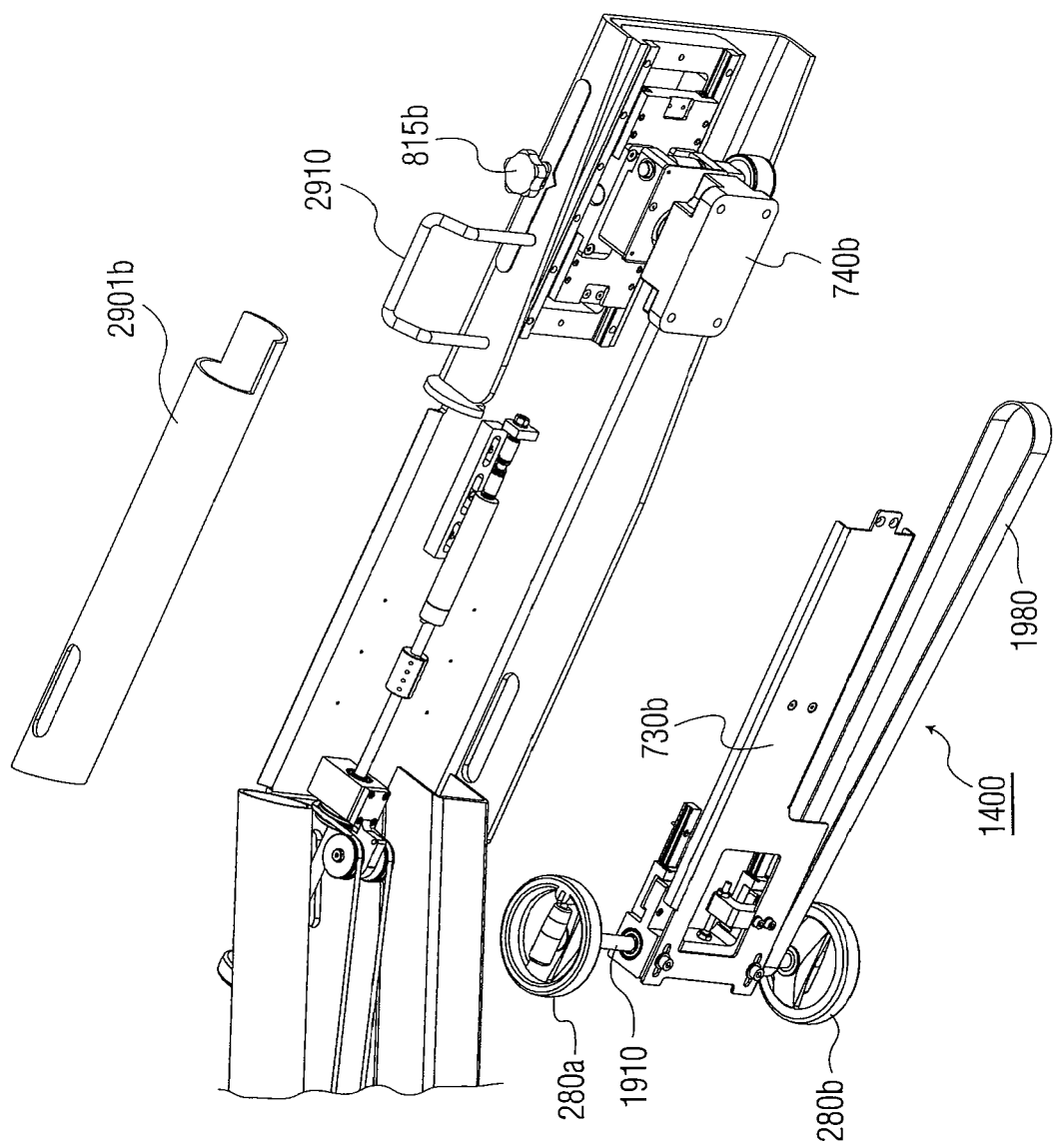

FIG. 13B is a partially exploded view of FIG. 13A.

FIG. 14A is a three-dimensional view of a theta carriage extension assembly that includes tumble drive apparatus and that is included in the view shown in FIGS. 13A and 13B.

FIG. 14B is an alternate view of the equipment shown in FIG. 14A.

Figure 15A:
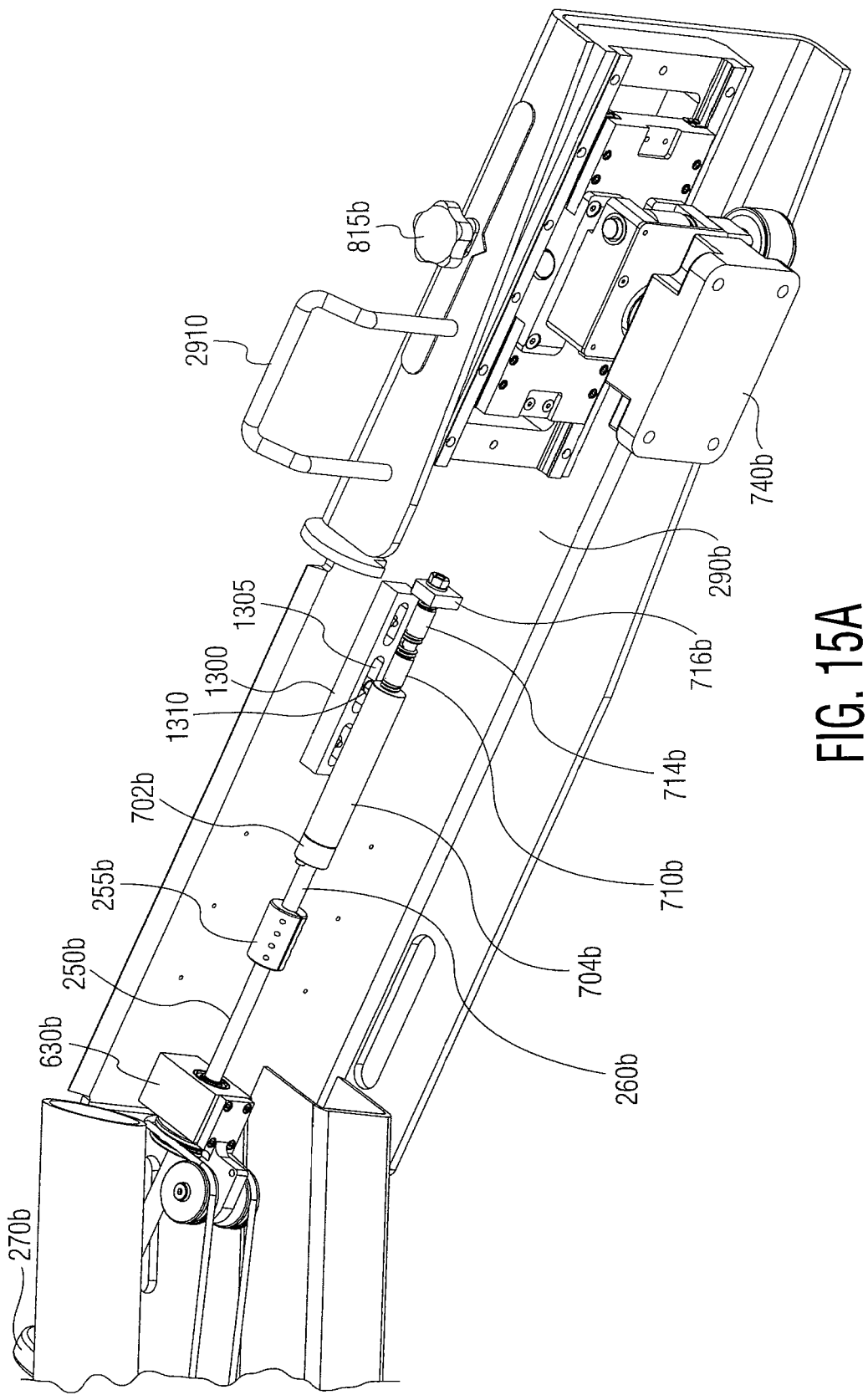

FIG. 15A is a three-dimensional view of the interior of the cradle arm shown in FIGS. 13A and 13B with the equipment of FIG. 14A removed.

Figure 15B:
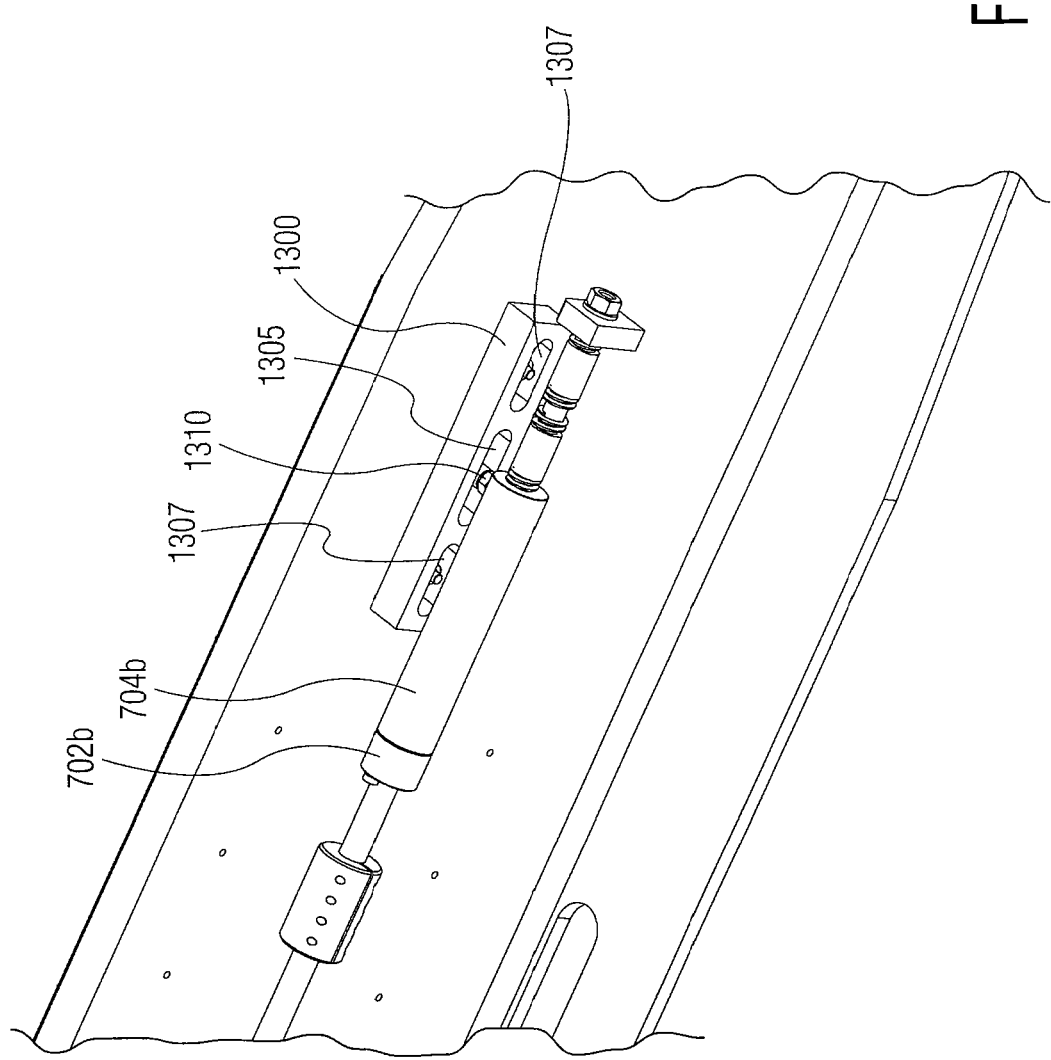

FIG. 15B is a close up taken from FIG. 15A to illustrate a theta limit apparatus.

Figure 15C:
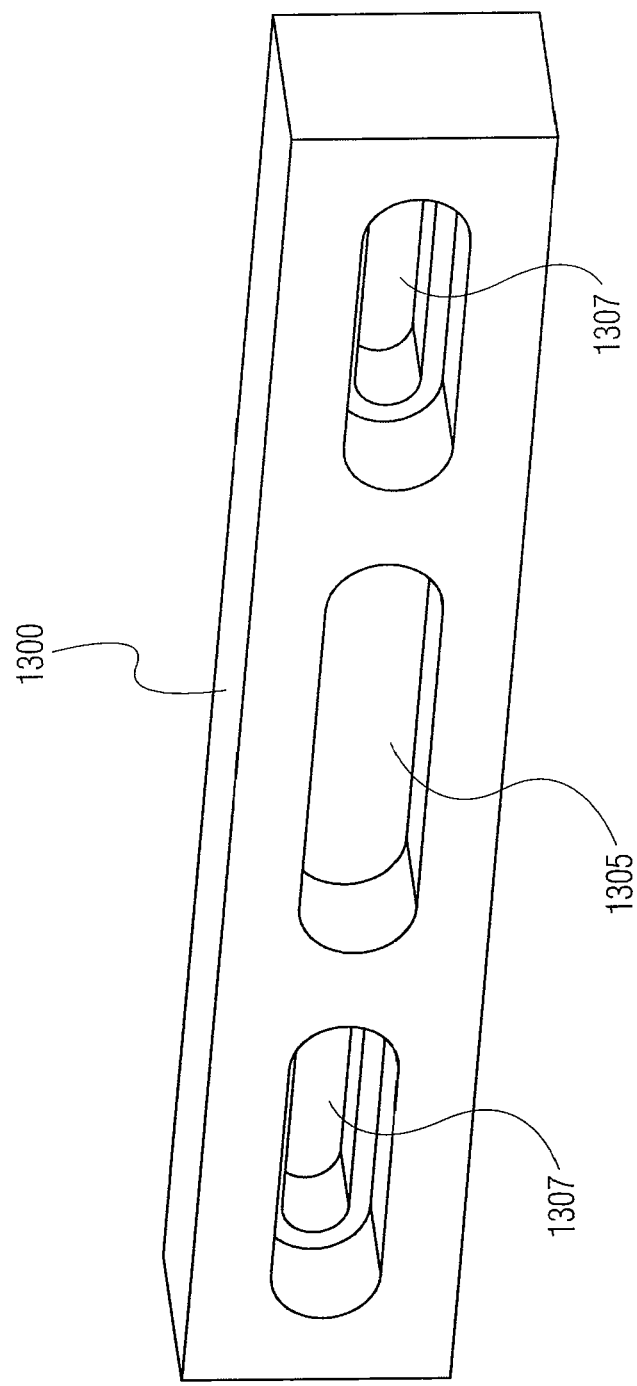

FIG. 15C is a three-dimensional view of a theta limit block.

Figure 16:
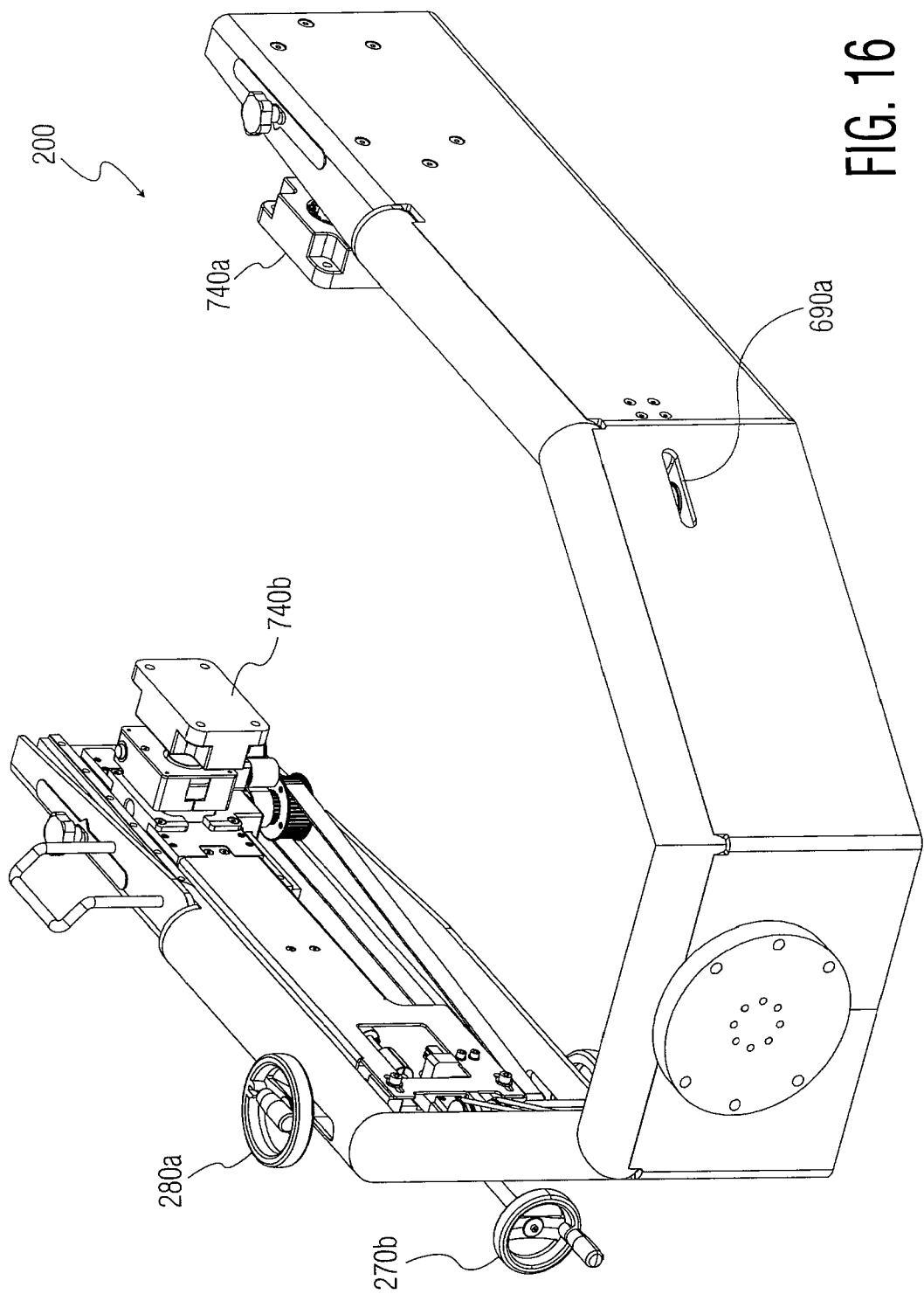

FIG. 16 is an alternate cradle having a single theta drive handle.

Figure 17A:
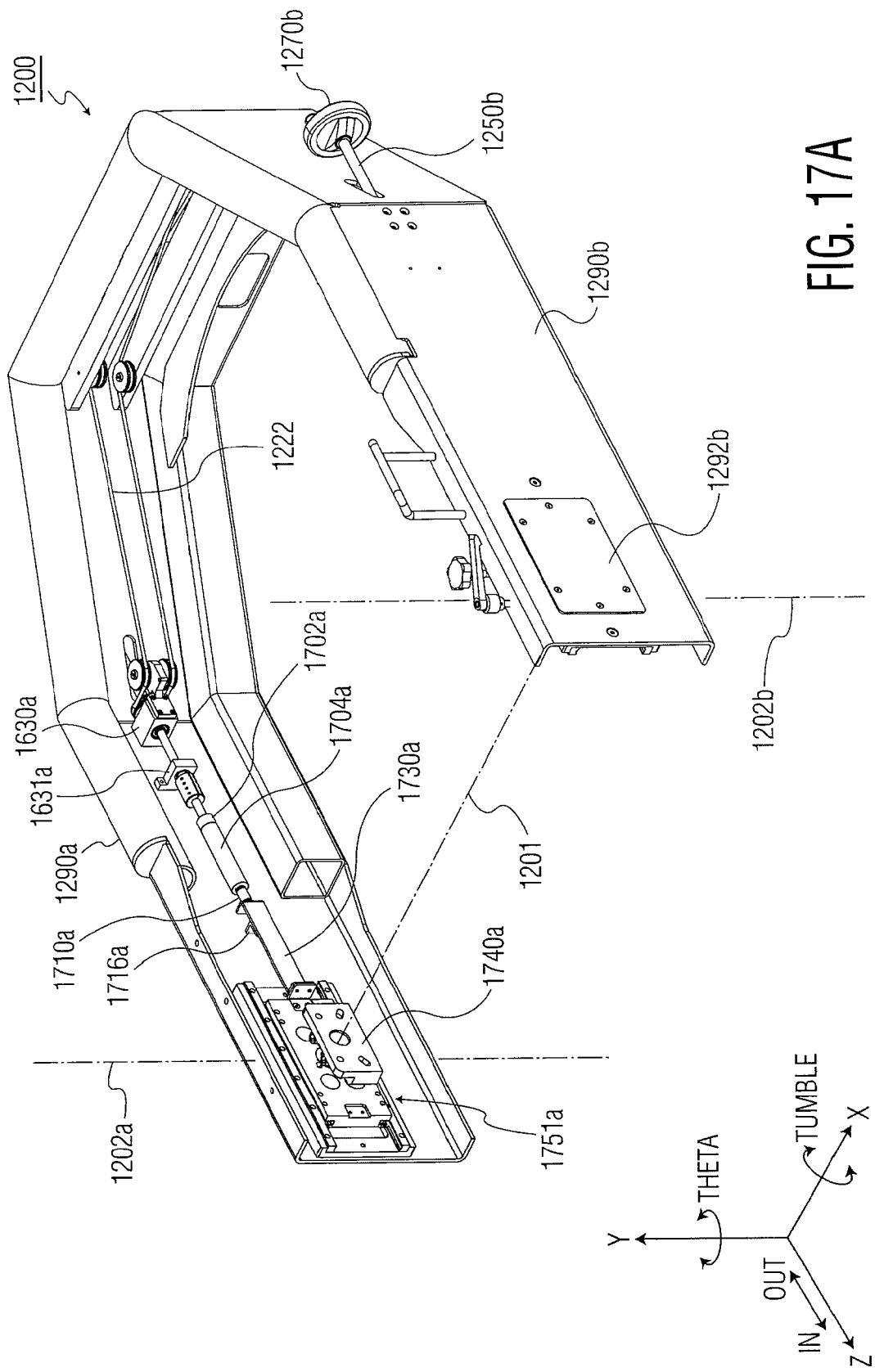
Figure 17B:
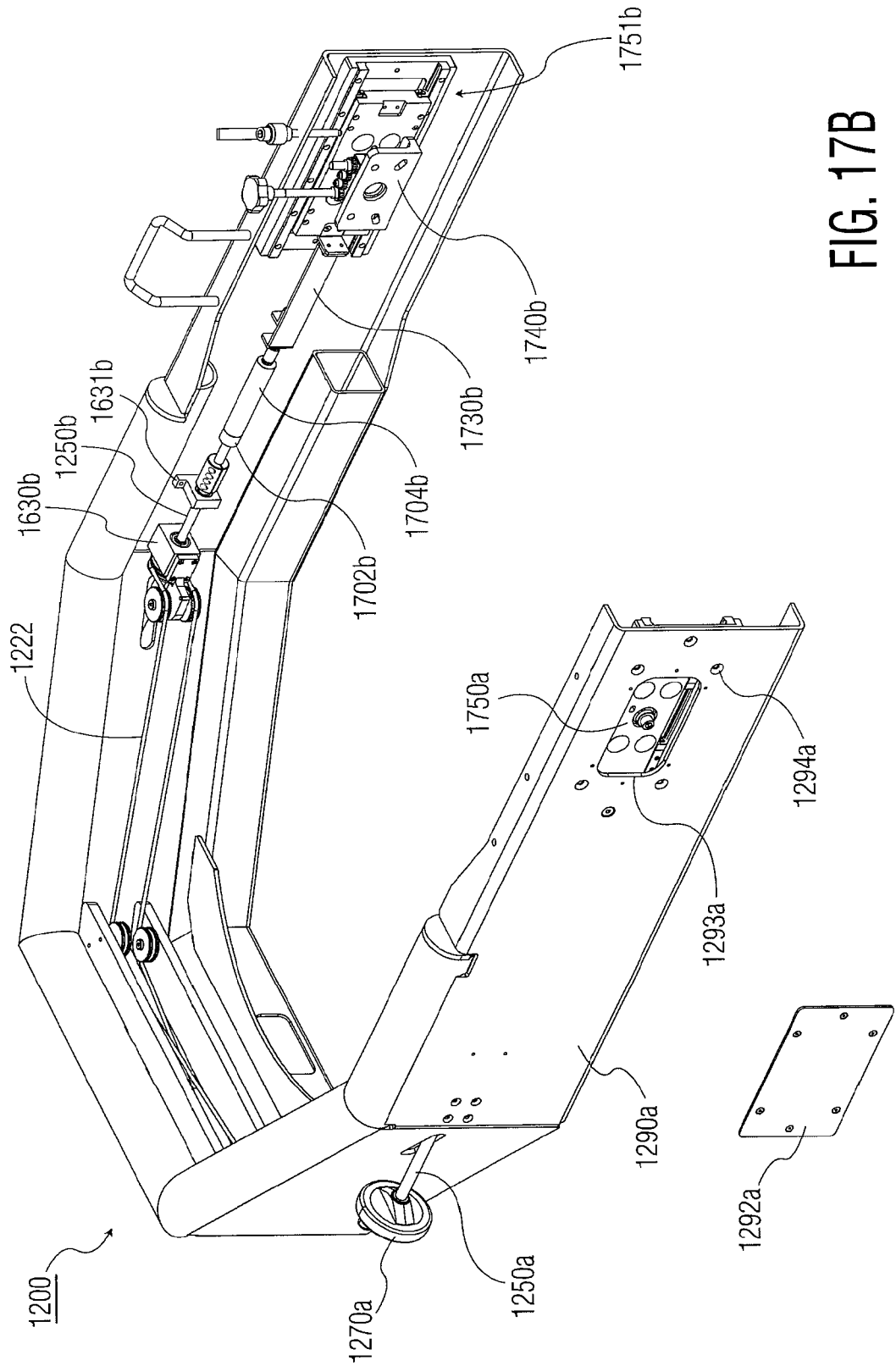

FIGS. 17A and 17B are three-dimensional views of a test head cradle that incorporates an alternative exemplary embodiment of the invention.

Figure 17C:
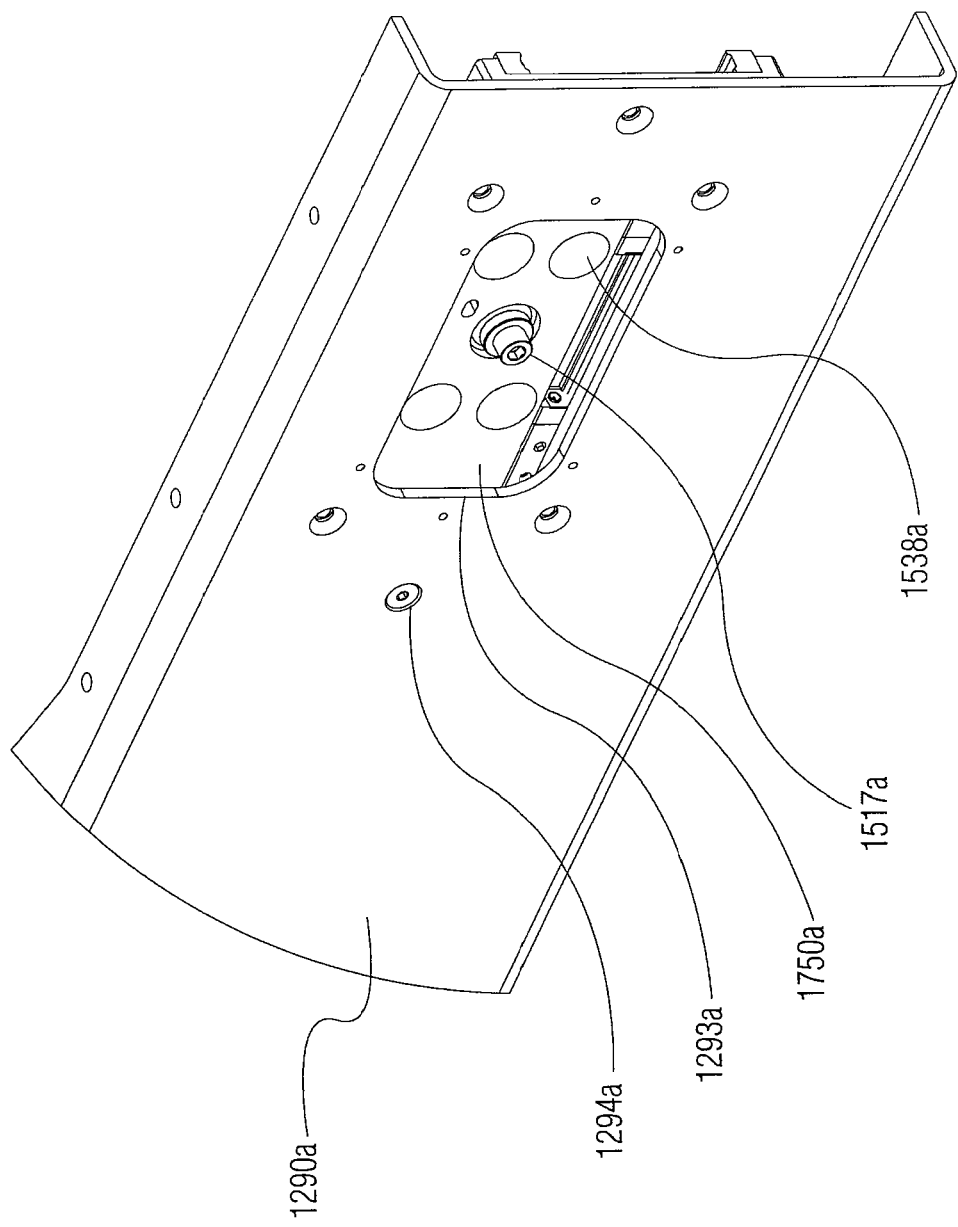

FIG. 17C is a more detailed view of a portion of one of the cradle arms of the test head cradle of FIGS. 17A and 17B.

Figure 17D:
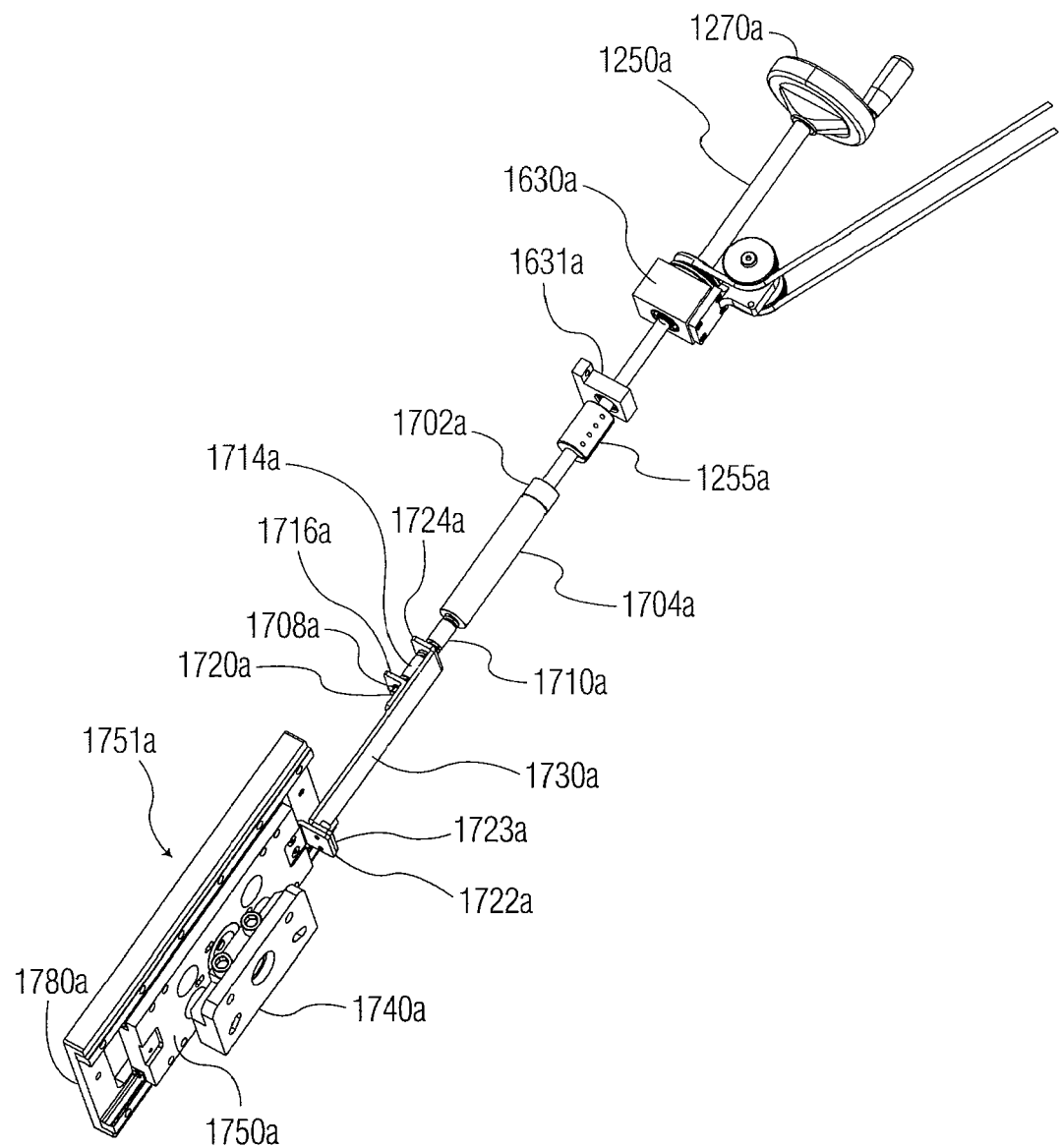

FIG. 17D is a three-dimensional view showing the connection between the theta drive handle and carriage assembly of the embodiment of FIGS. 17A and 17B with the cradle structure removed from view for clarity.

Figure 18A:
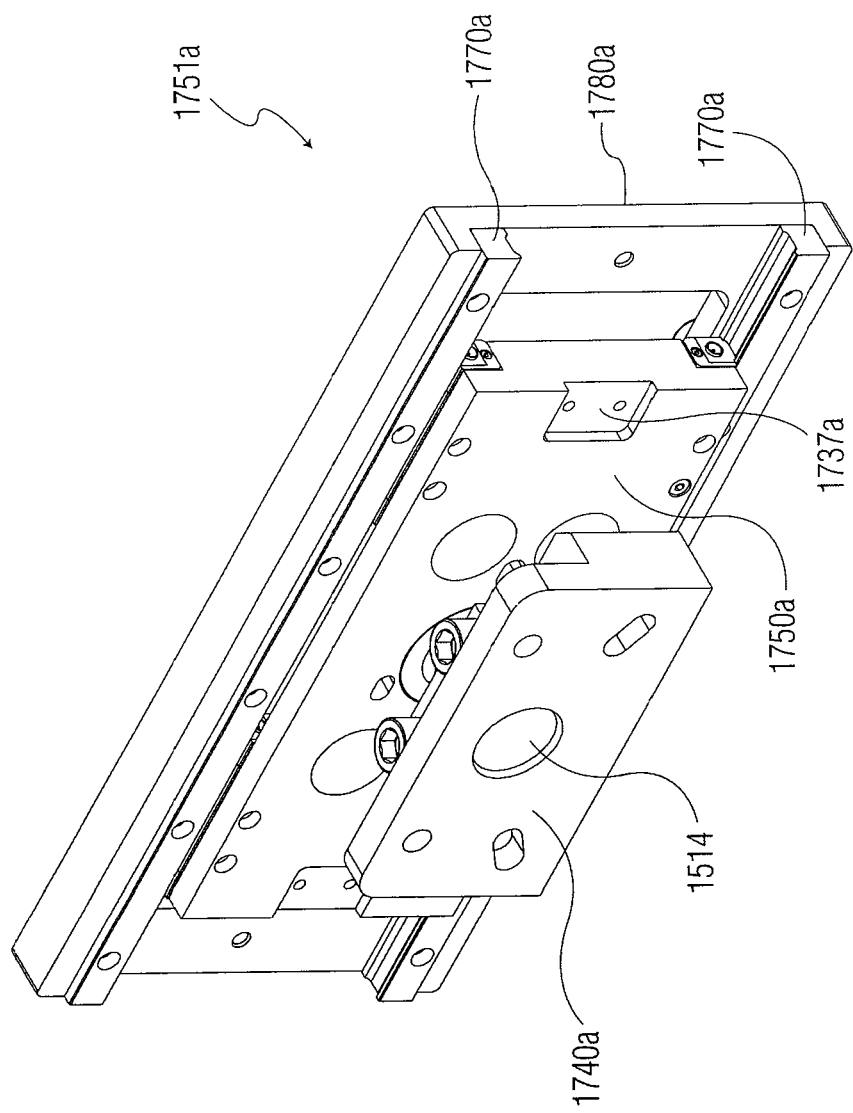

FIG. 18A is a three-dimensional view of a carriage assembly of the embodiment of FIGS. 17A and 17B.

Figure 18B:
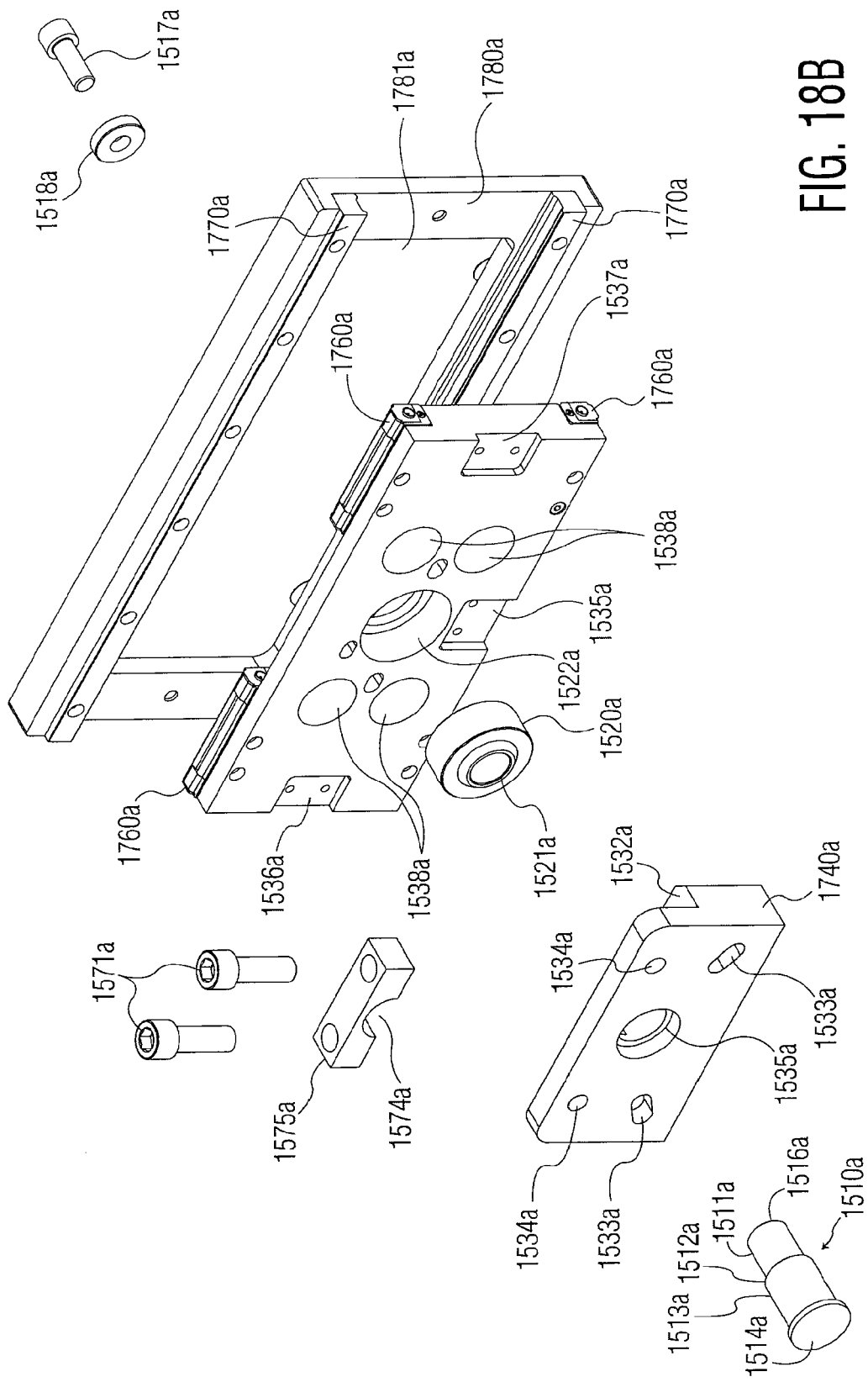

FIG. 18B is a exploded three-dimensional view of the carriage assembly of FIG. 18A.

Figure 18C:
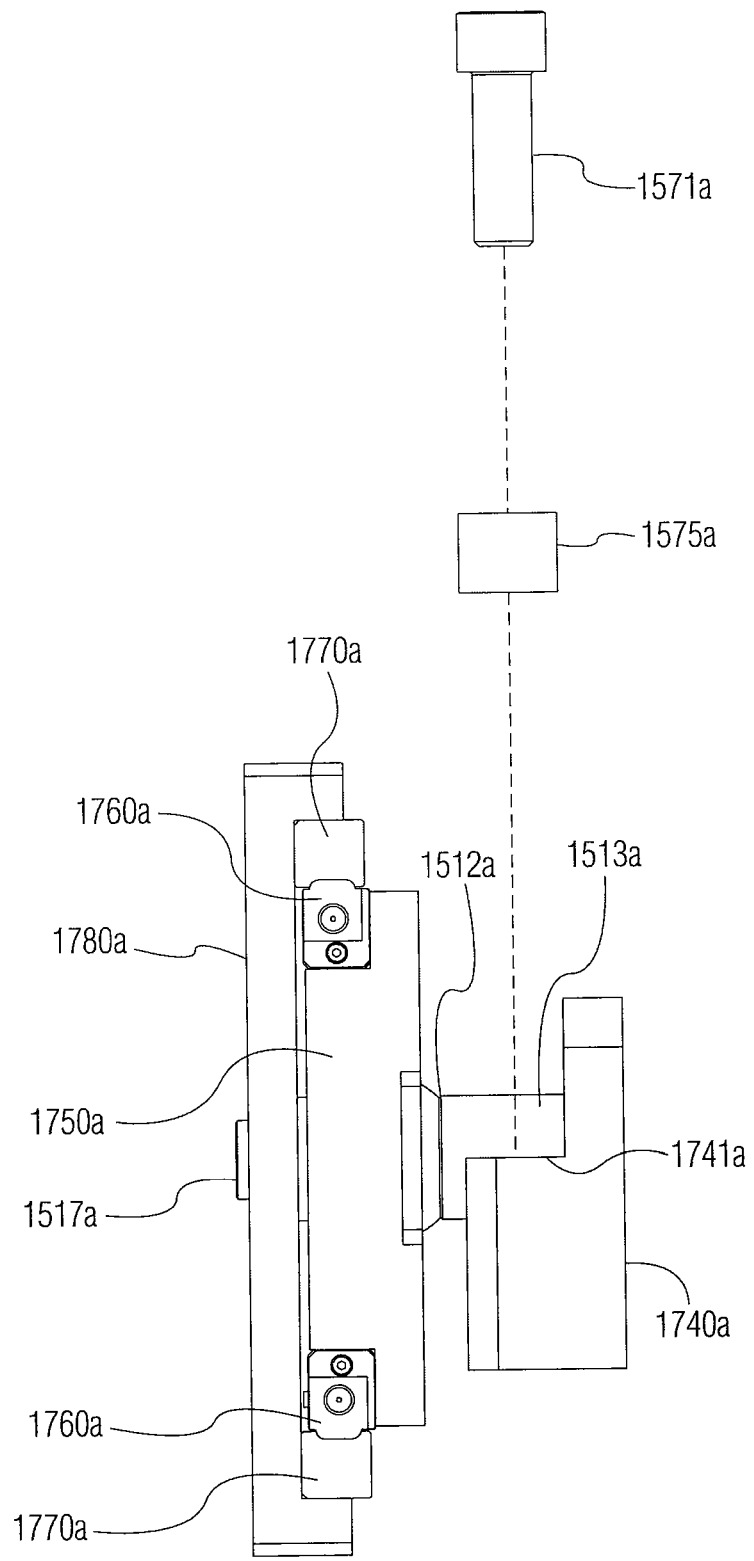

FIG. 18C is an end elevation view of the carriage assembly of FIG. 18A.

Figure 19A:
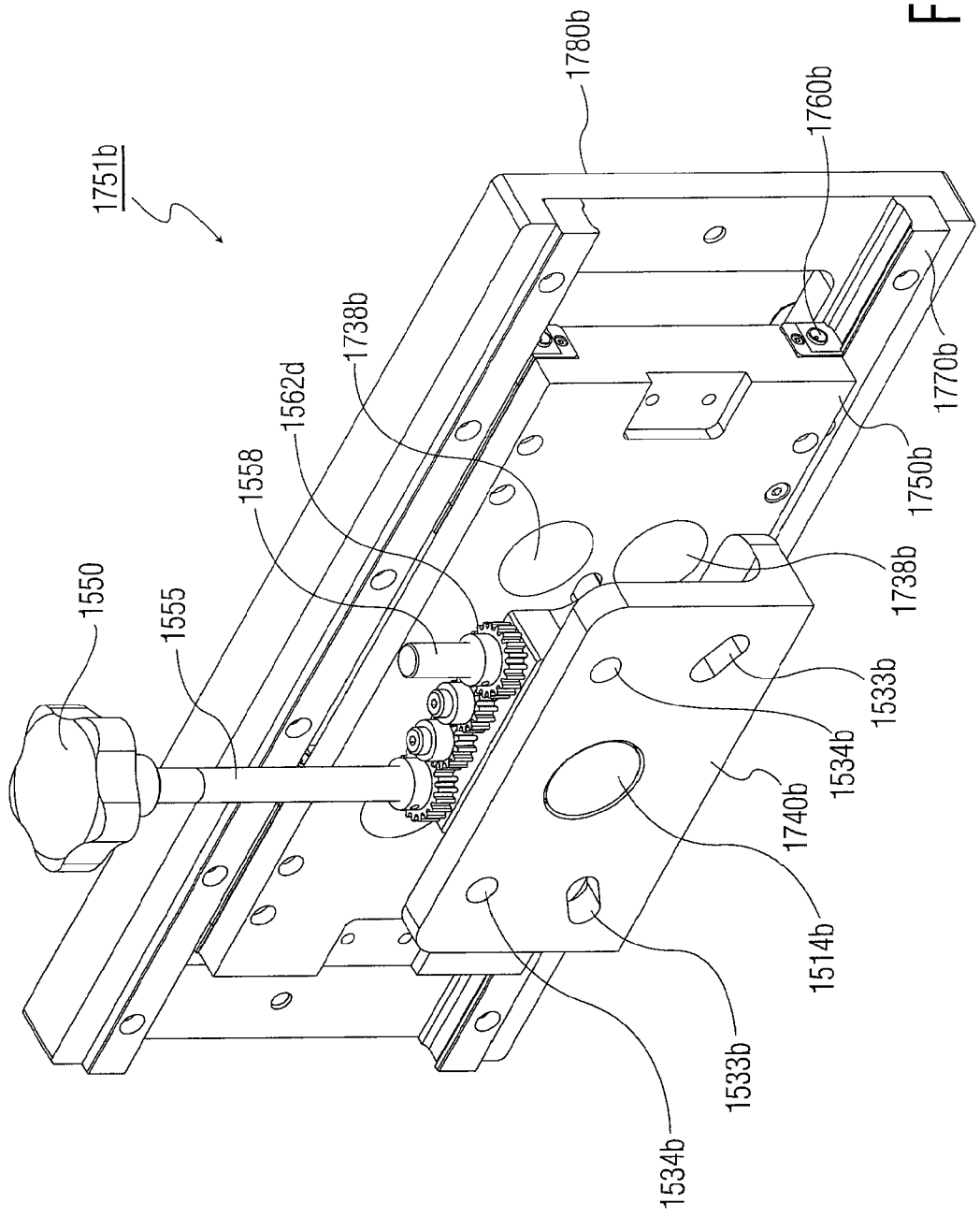

FIG. 19A is a three-dimensional view of another carriage assembly of the embodiment of FIGS. 17A and 17B.

Figure 19B:
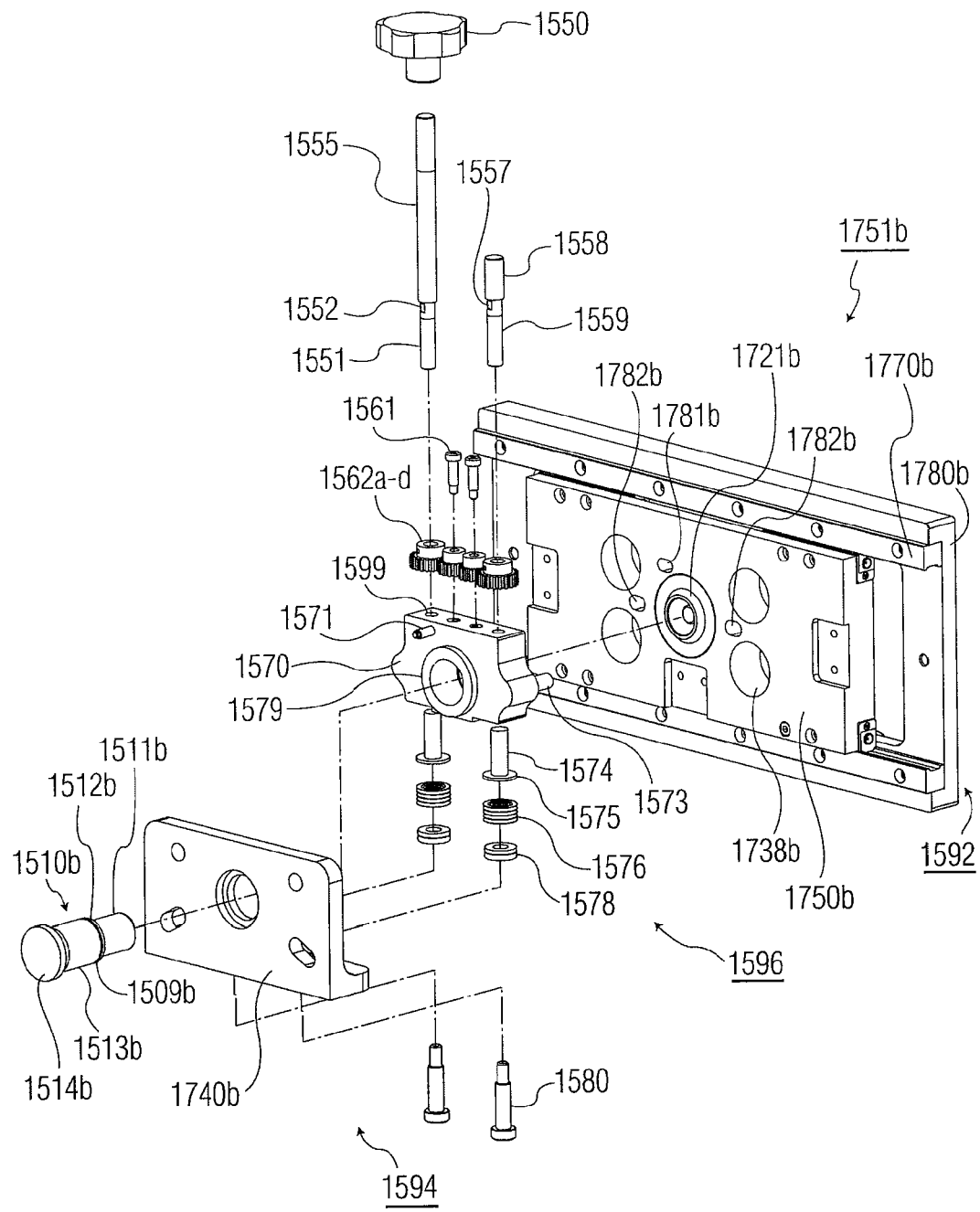
Figure 19C:
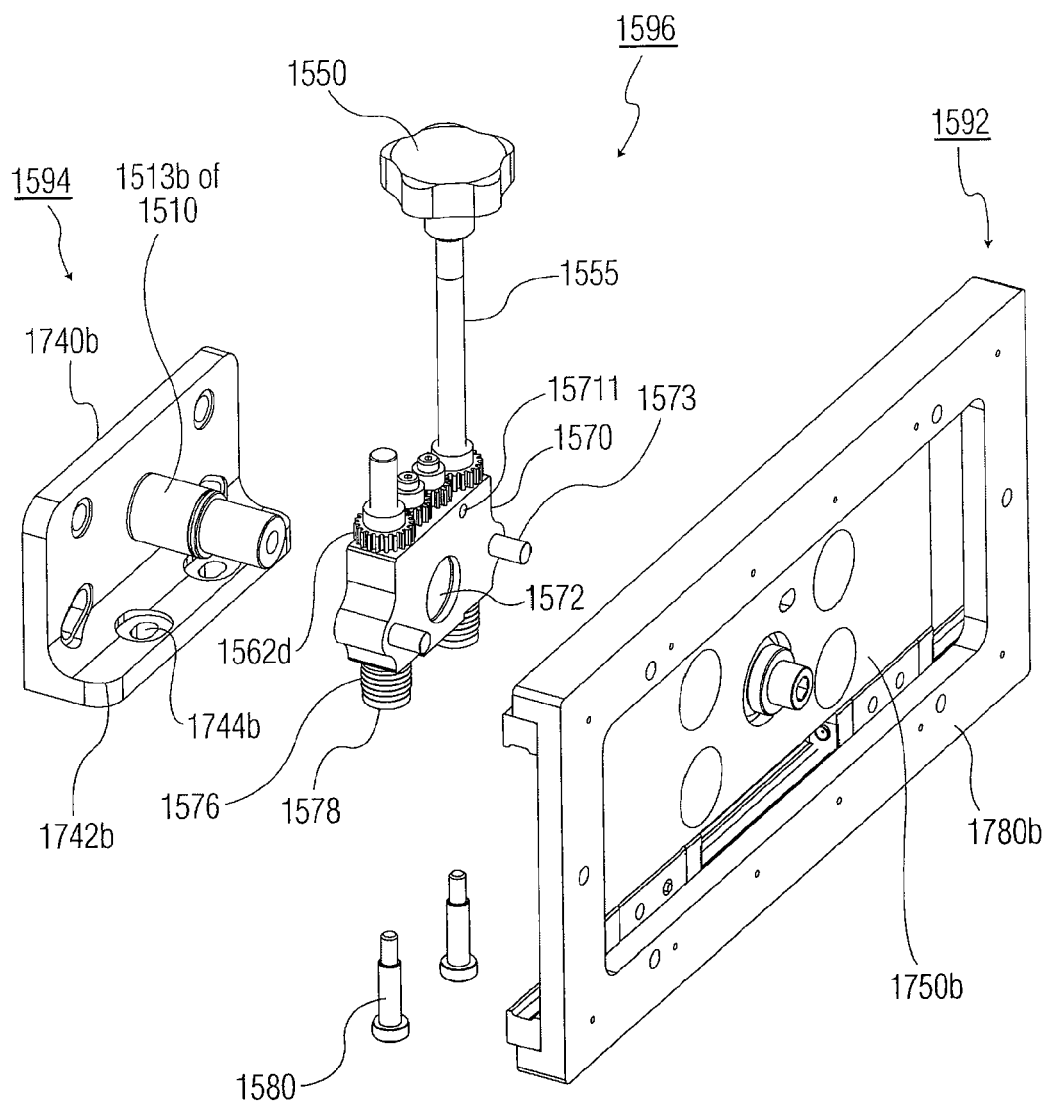
Figure 19D:
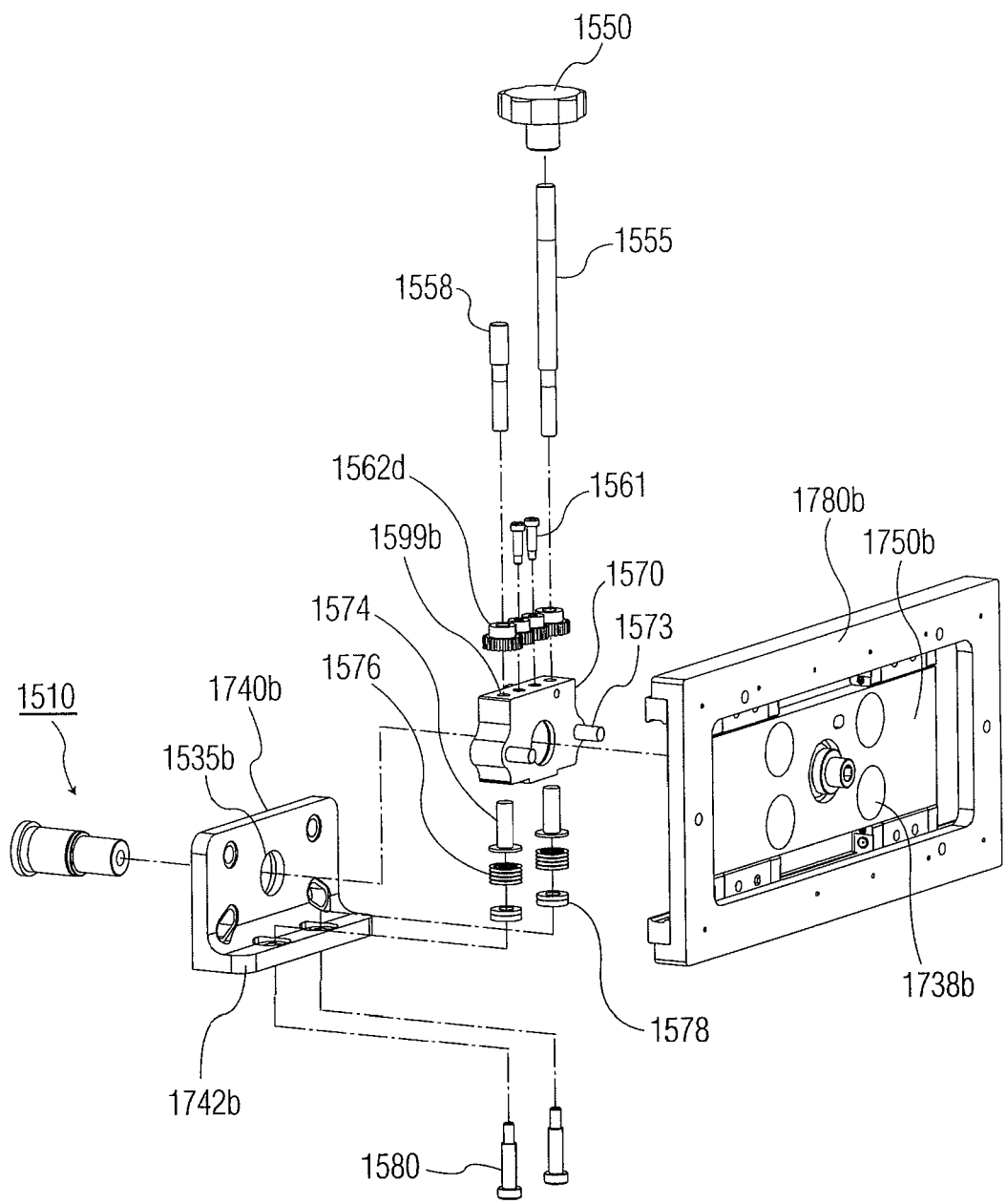

FIGS. 19B-19D are exploded three-dimensional views of the carriage assembly of FIG. 19A shown from different perspectives and different levels of explosion.

Figure 19E:
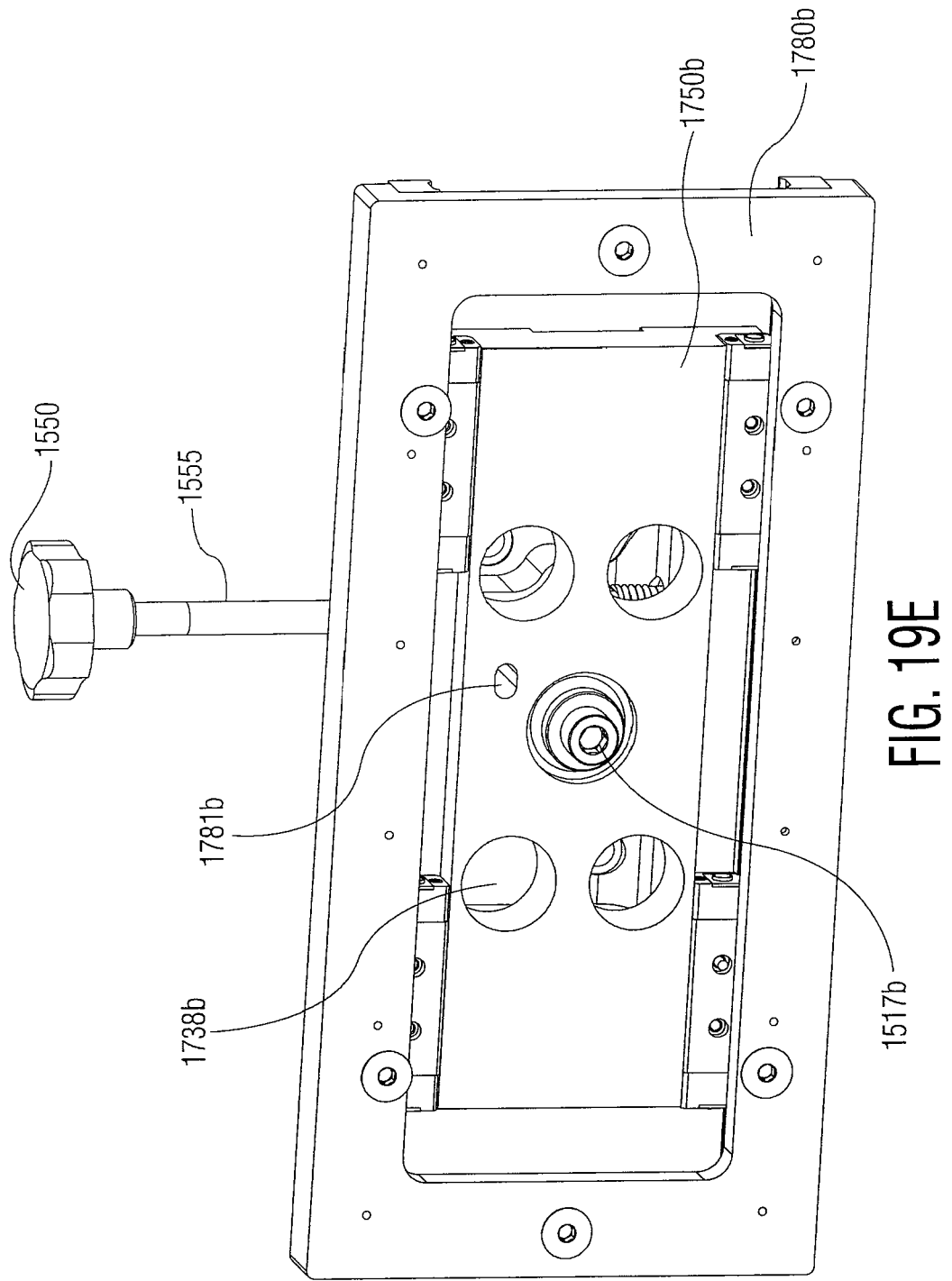

FIG. 19E is a plan view of the carriage assembly of FIG. 19A.

Figure 19F:
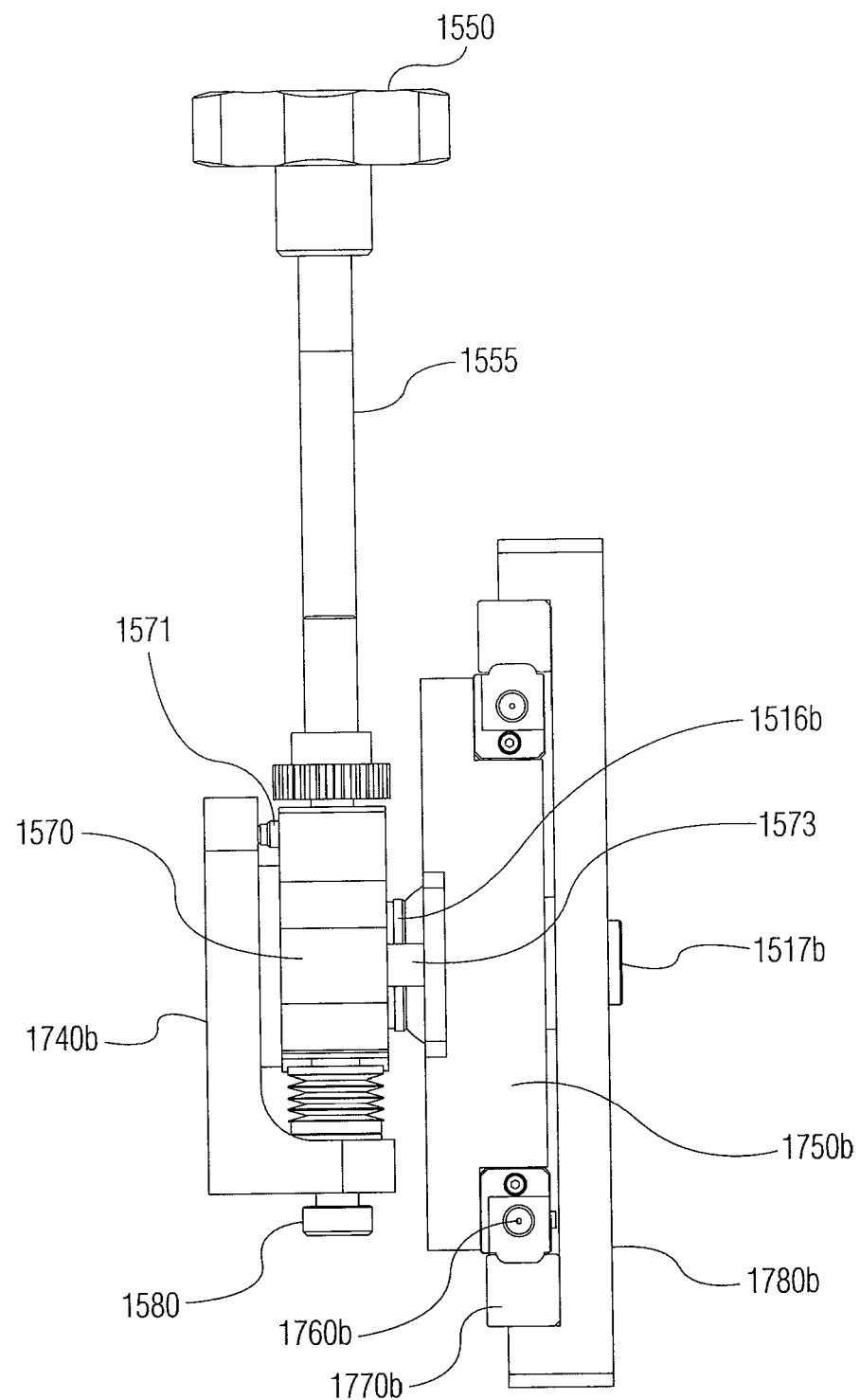

FIG. 19F is an end elevation view of the carriage assembly of FIG. 19A.

Figure 19G:
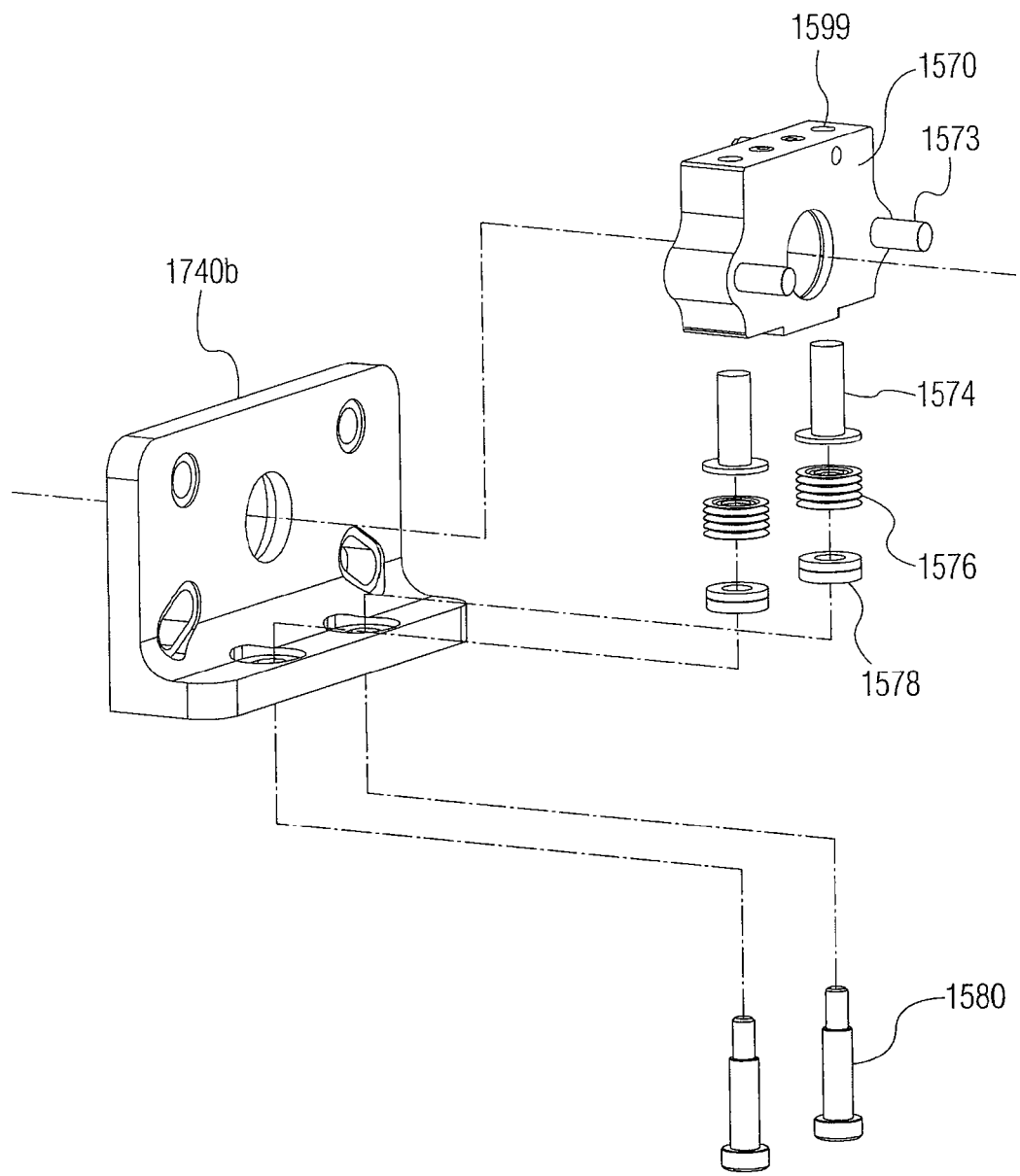

FIG. 19G is an exploded three-dimensional view of a side support assembly of the carriage assembly of FIG. 19A.

Figure 19H:
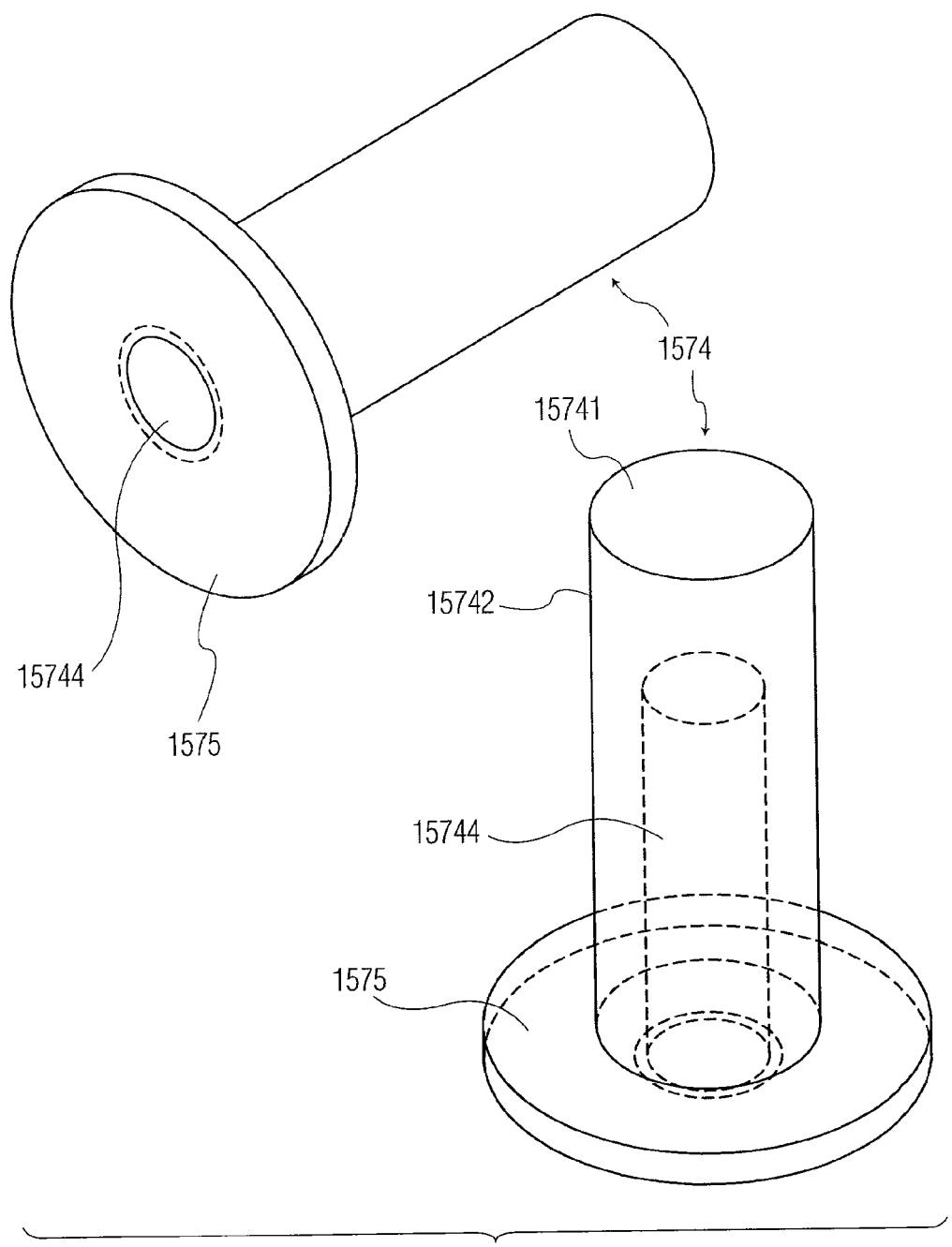

FIG. 19H provides three-dimensional views of a threaded compression insert of the carriage assembly of FIG. 19A.

Figure 19I:
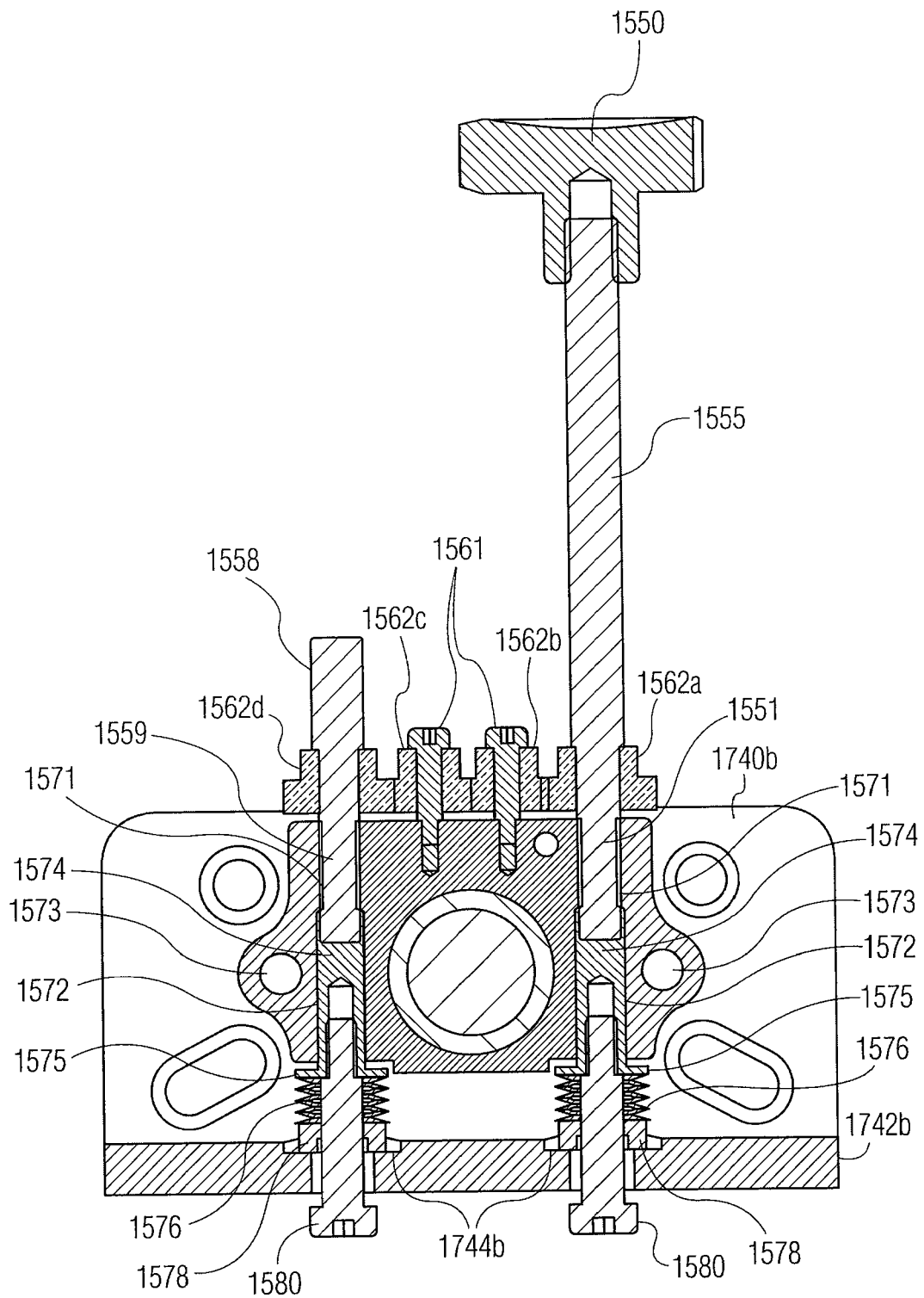

FIG. 19I is a cross sectional view of a control and compliance apparatus of the carriage assembly of FIG. 19A.

Figure 19J:
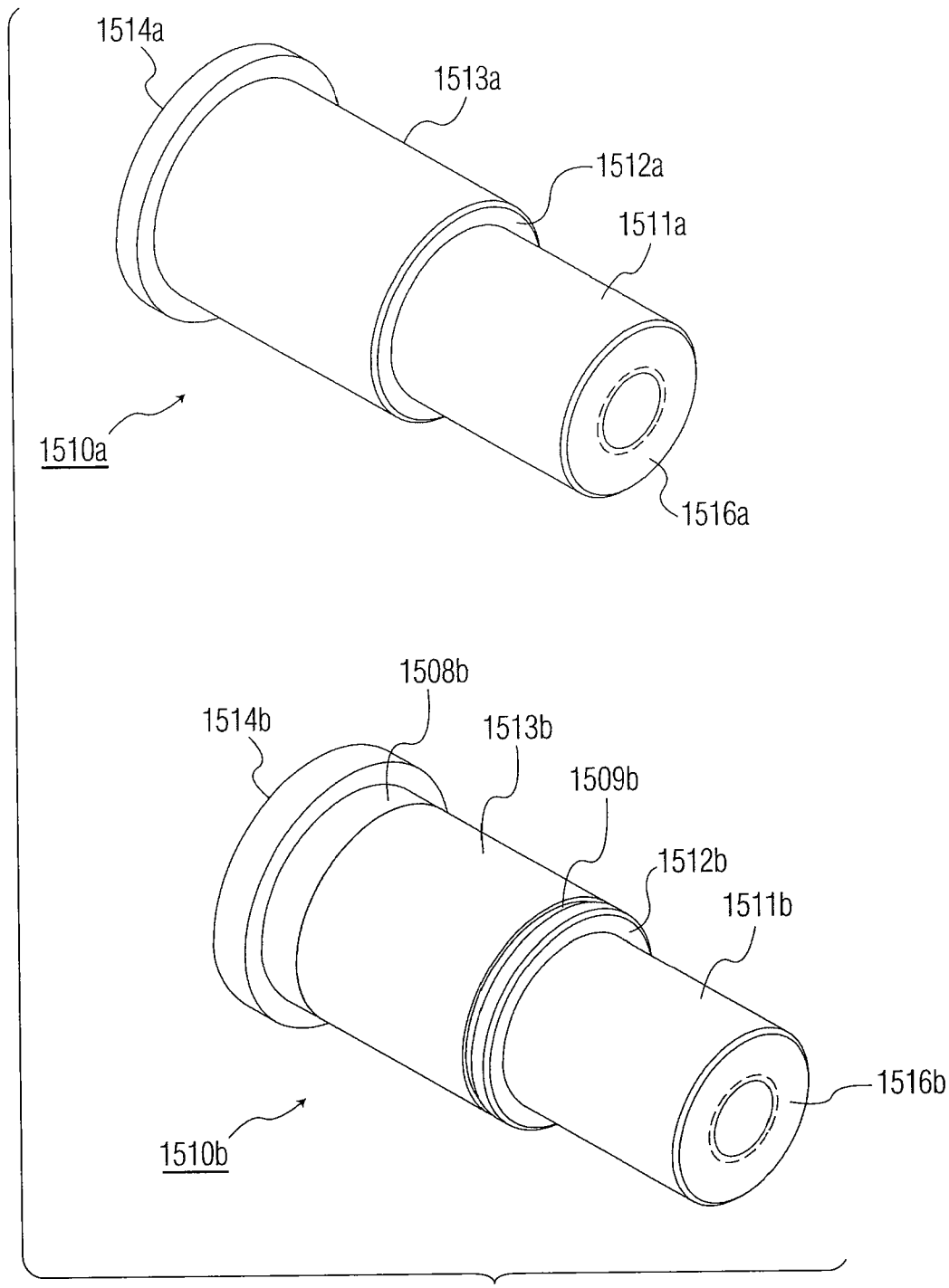

FIG. 19J provides three-dimensional views of stepped tumble shafts of the carriage assemblies of FIGS. 18A and 19A.

Figure 20A:
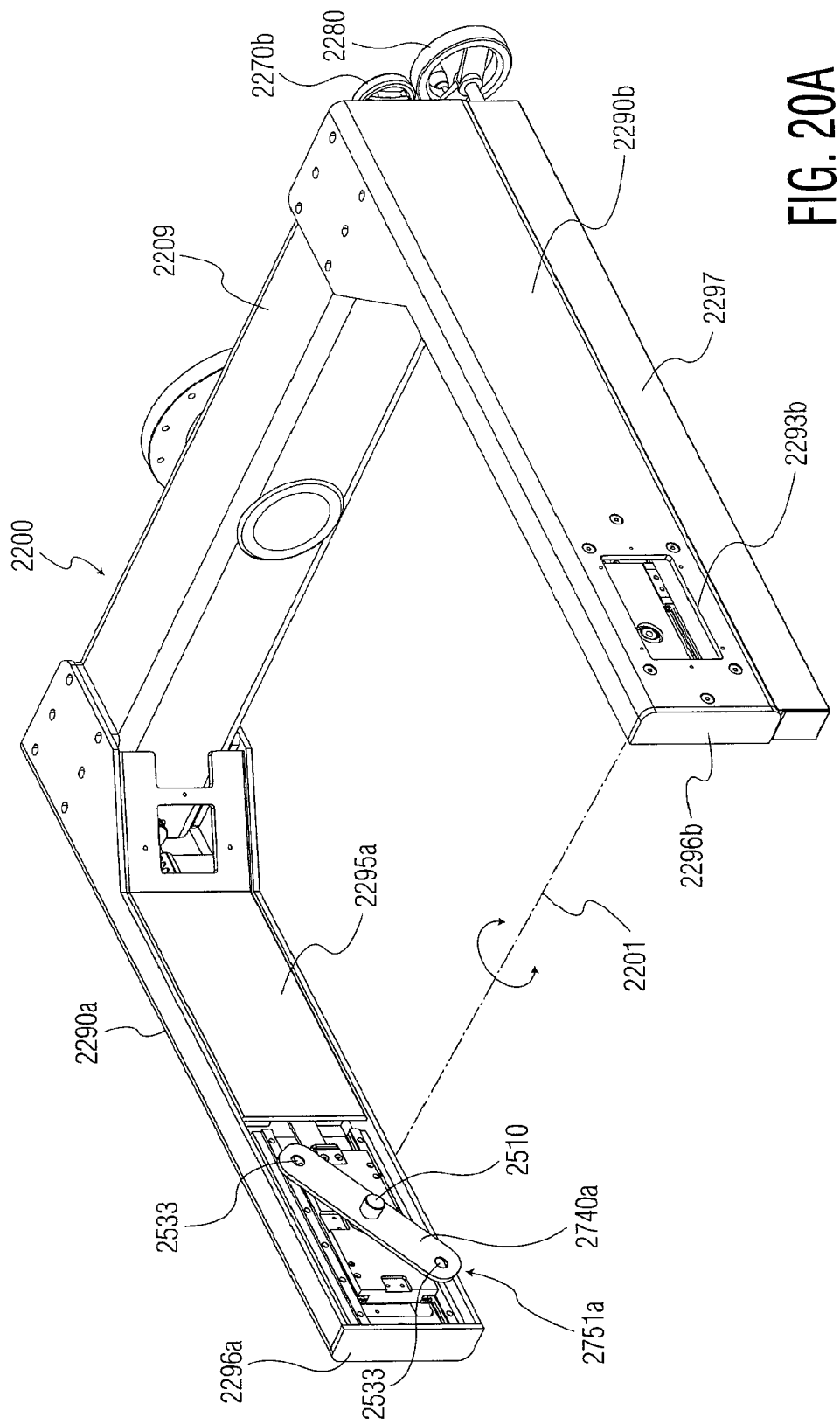
Figure 20B:
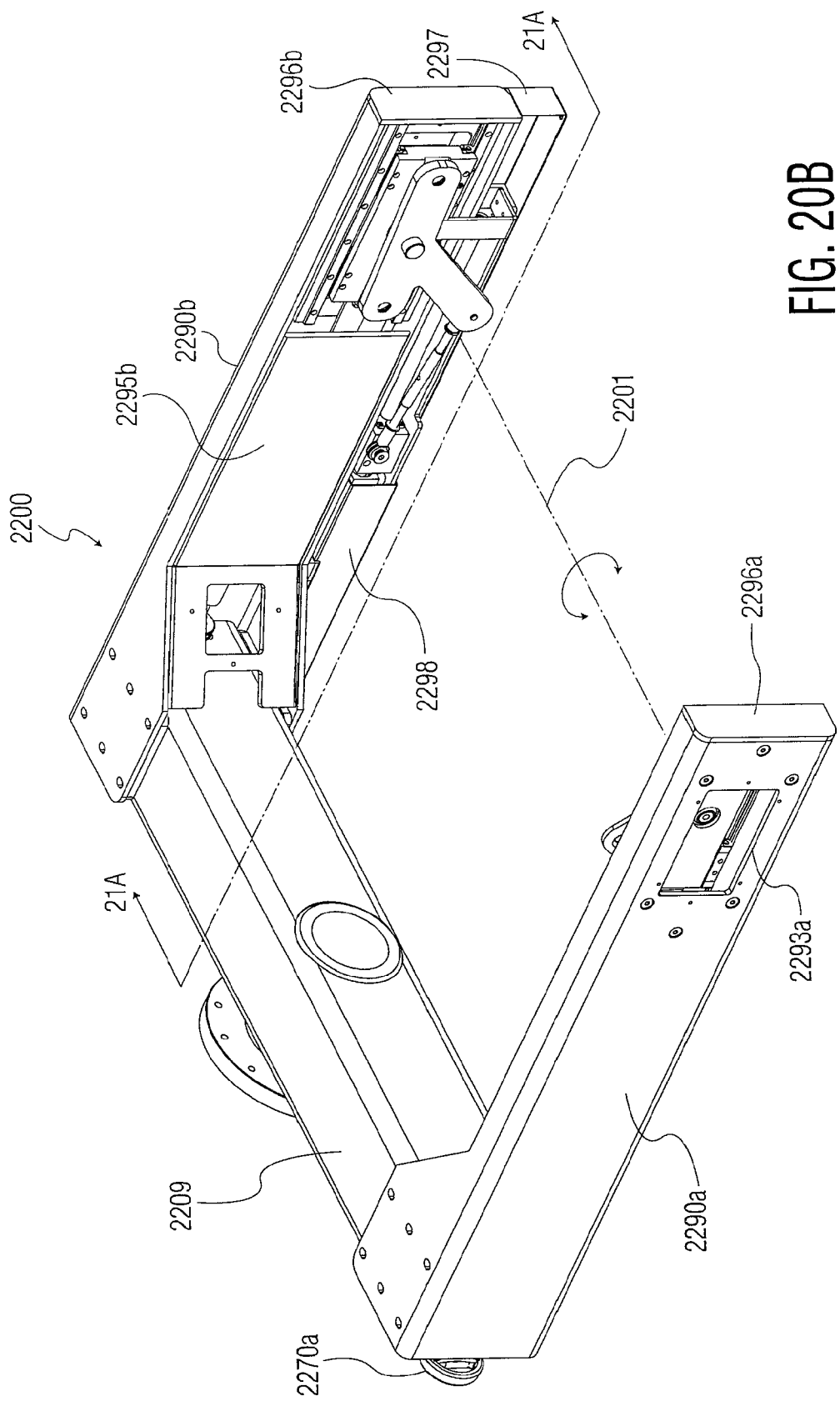

FIGS. 20A and 20B are three-dimensional views of a test head cradle that incorporates an alternative exemplary embodiment of the invention.

Figure 20C:
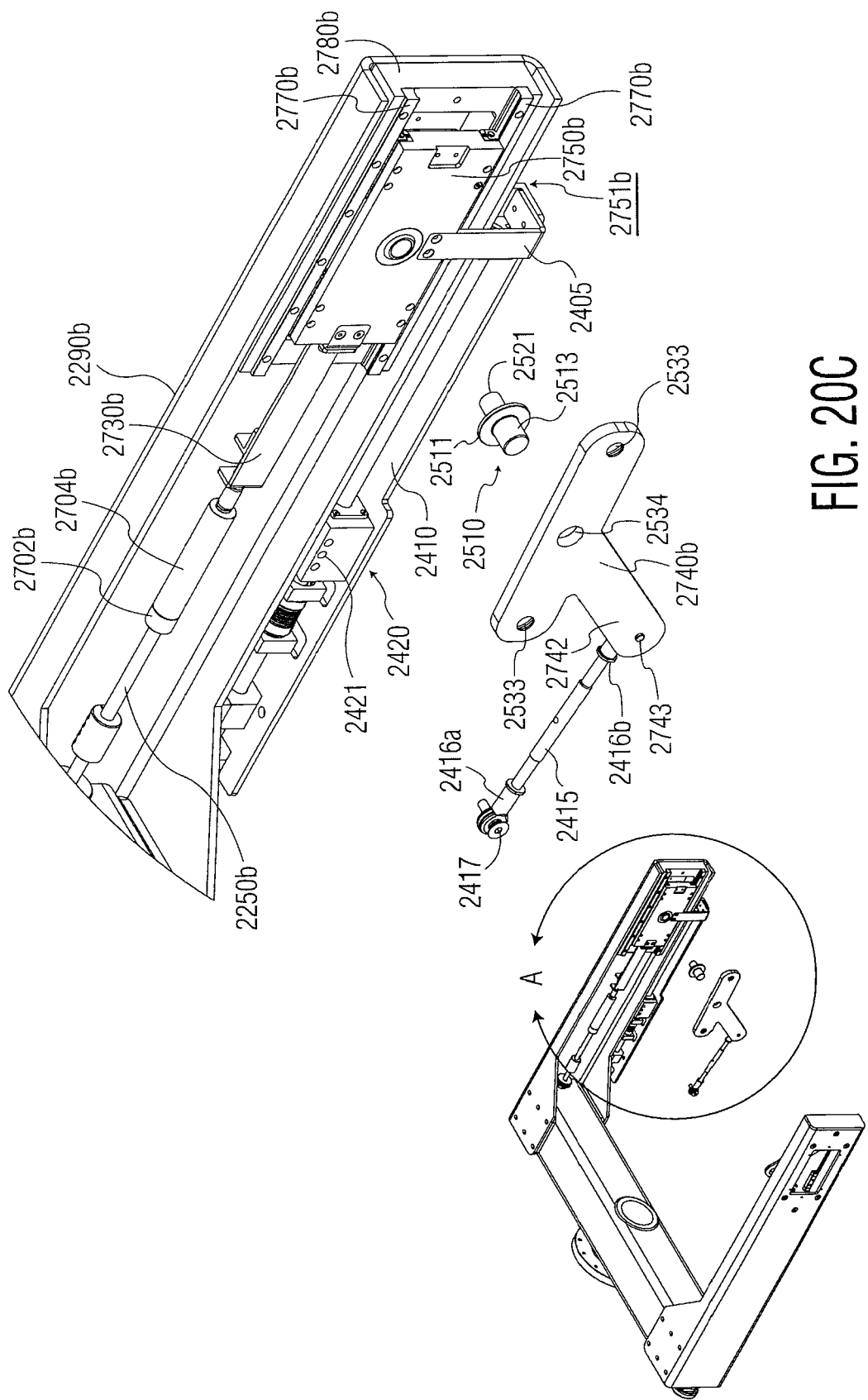

FIG. 20C is a more detailed view of a portion of one of the cradle arms of the test head cradle of FIGS. 20A and 20B.

Figure 21A:
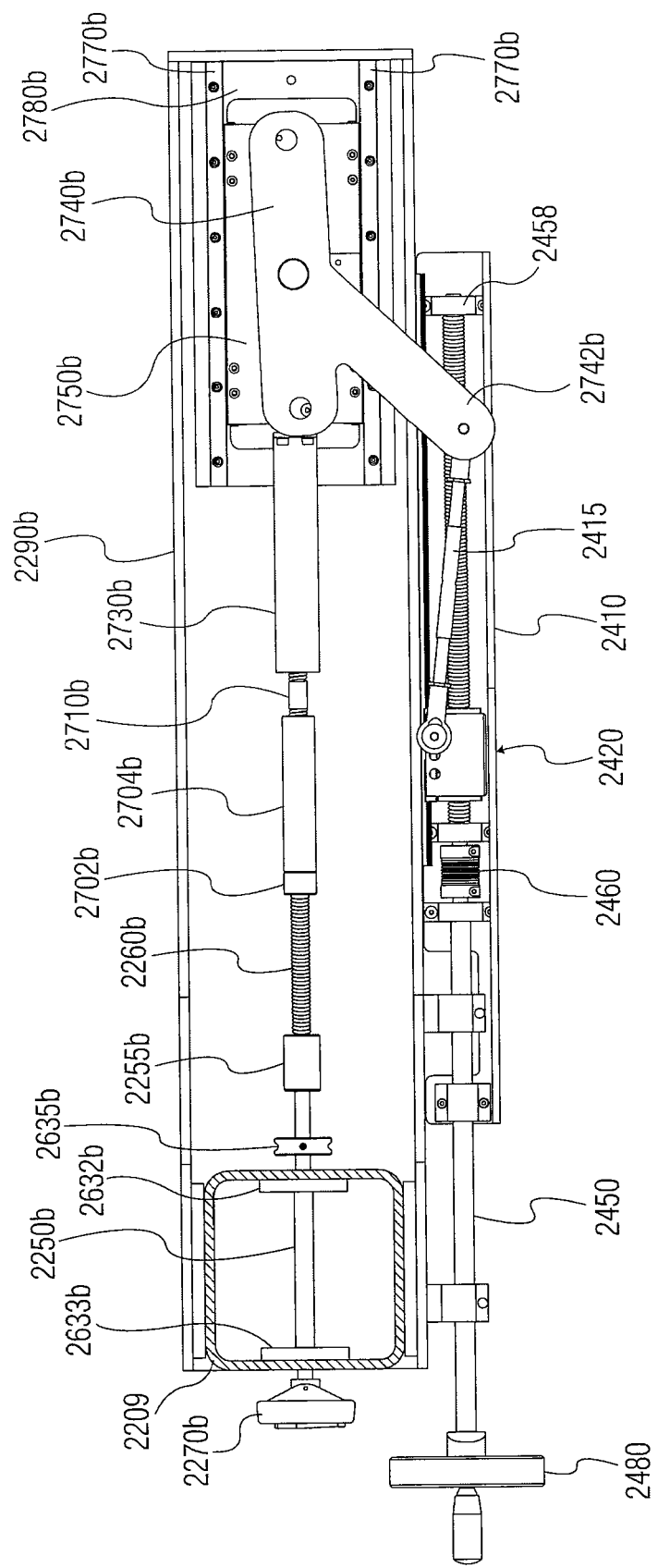

FIG. 21A is a cross sectional view along the line 21A-21A in FIG. 20B.

Figure 21B:
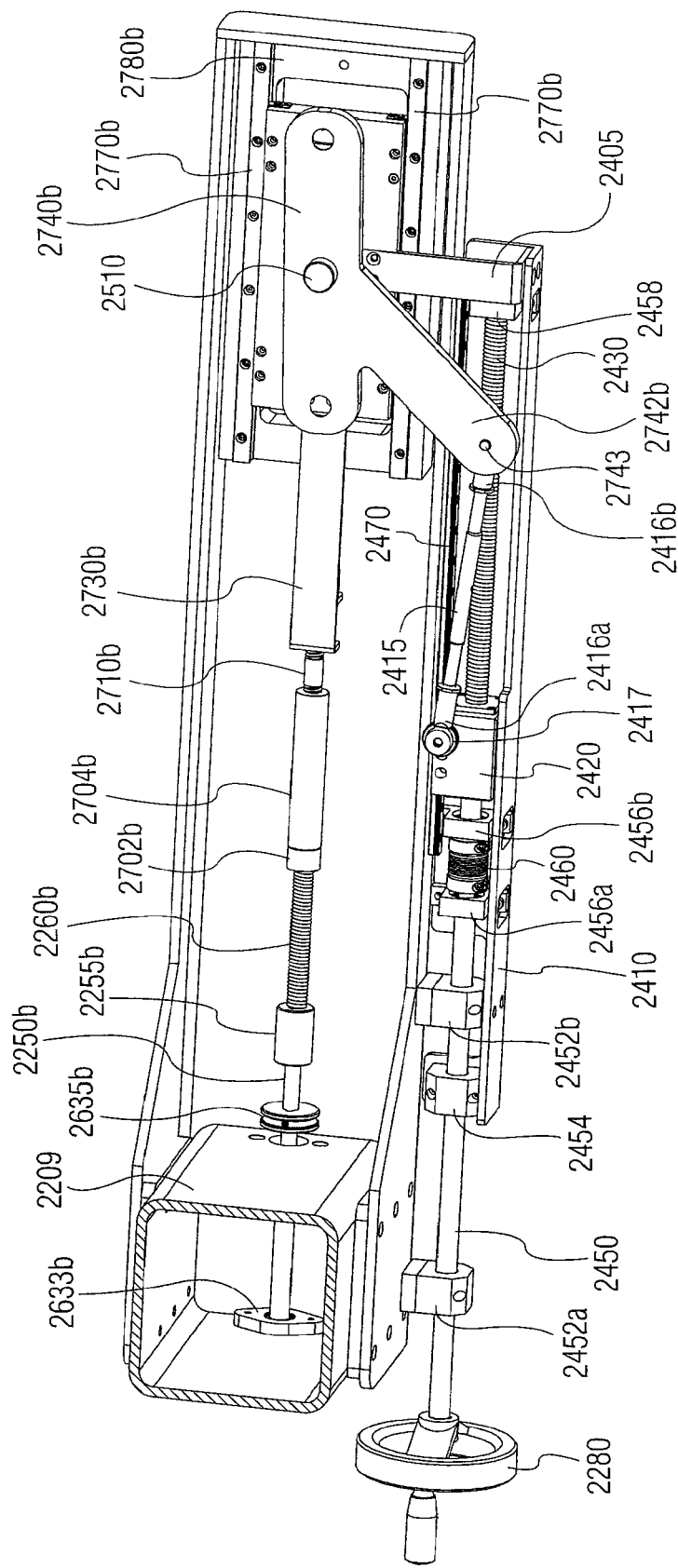

FIG. 21B shows the cross section of FIG. 21A in perspective.

Figure 22:
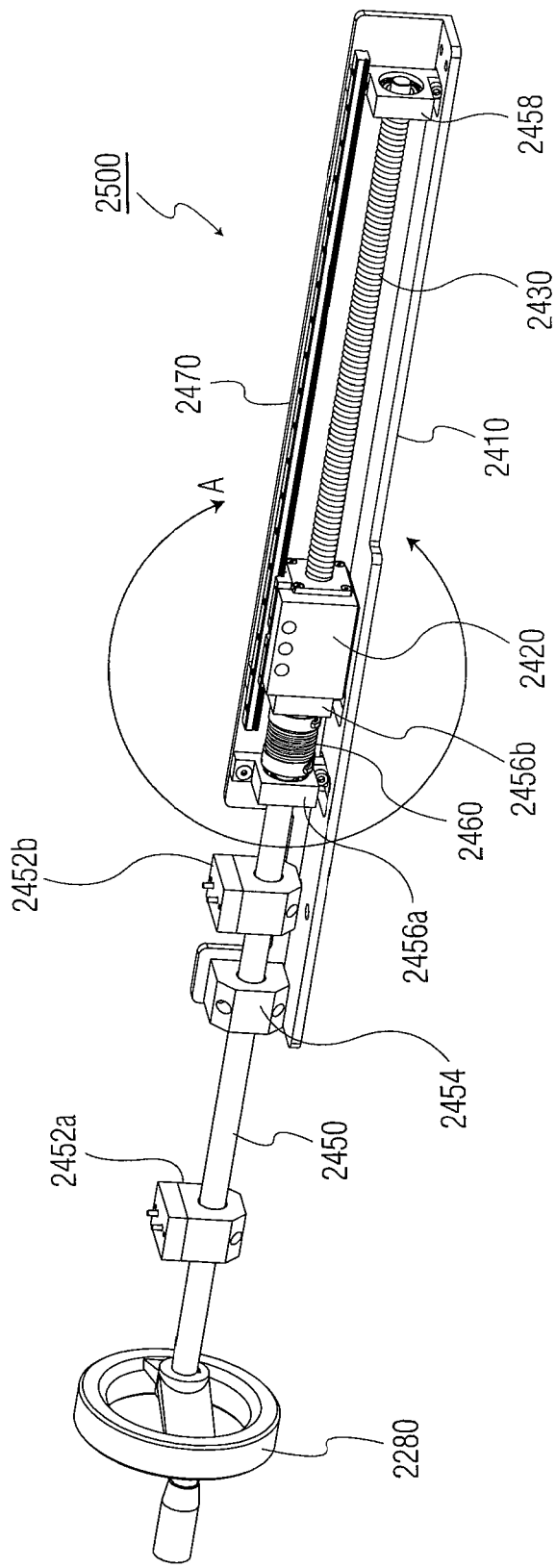

FIG. 22 is a three-dimensional view showing the connection between the theta drive handle and carriage assembly of the embodiment of FIGS. 20A and 20B with the cradle structure removed from view for clarity.

Figure 22A:
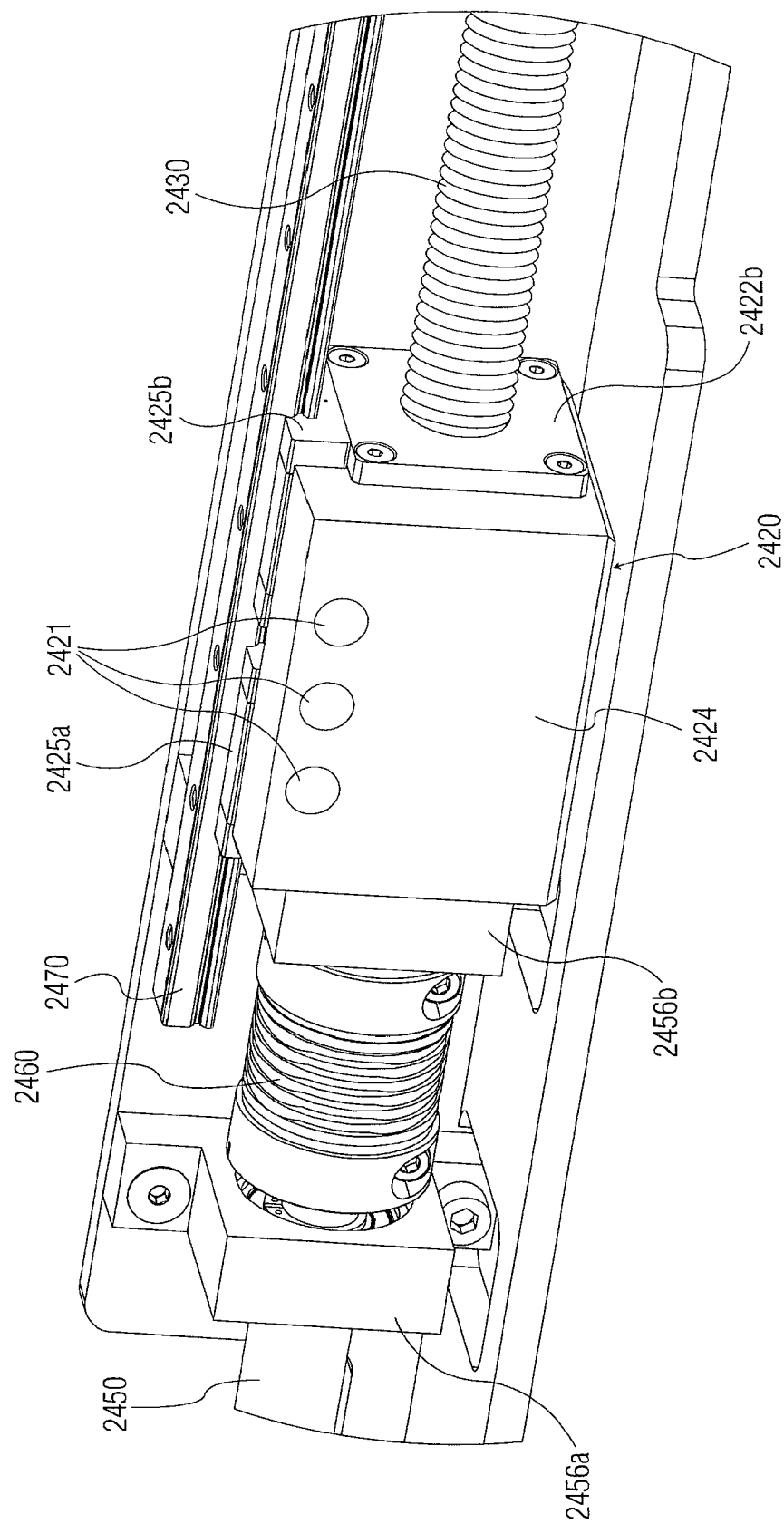

FIG. 22A is a more detailed view of a portion of FIG. 22.

Figure 23:
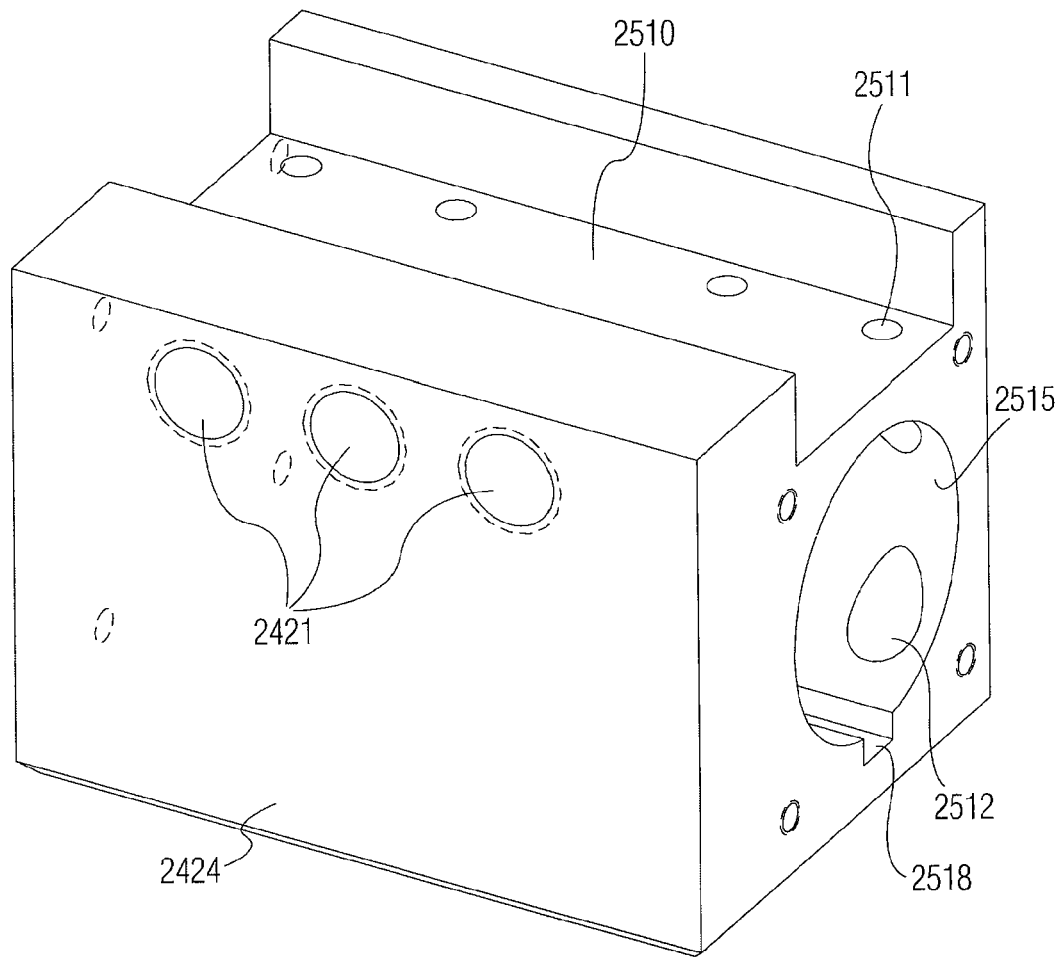

FIG. 23 is a three-dimensional view of a traveler block of the carriage assembly of FIG. 22.

Figure 24:
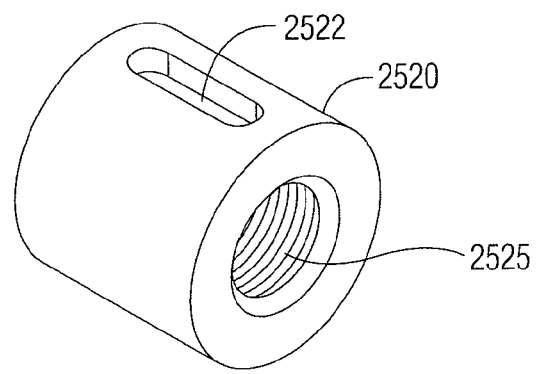

FIG. 24 is a three-dimensional view of a cylindrical nut of the carriage assembly of FIG. 22.

Figure 25:
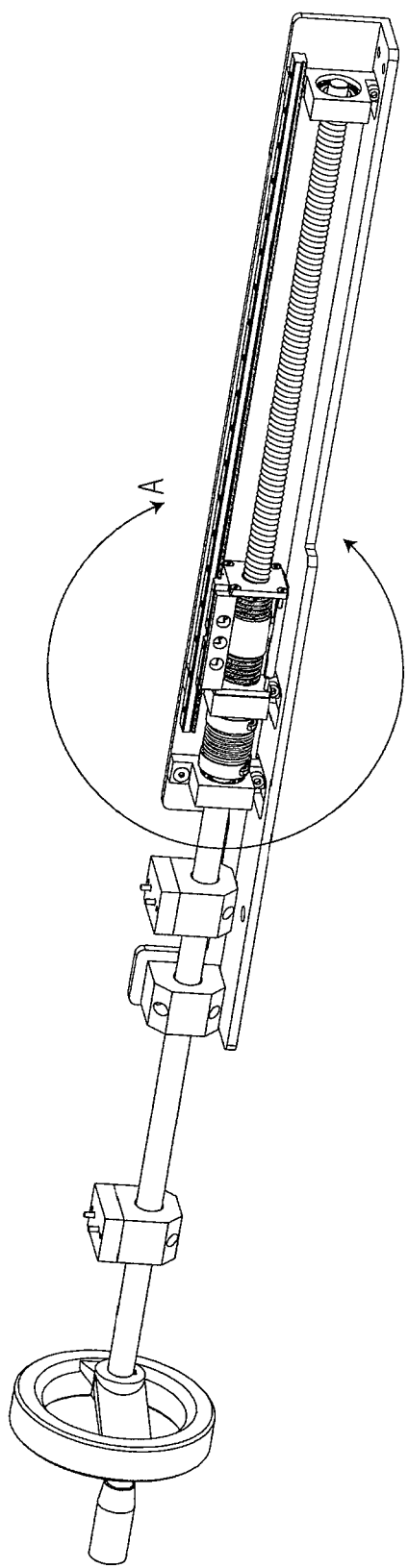
Figure 25A:
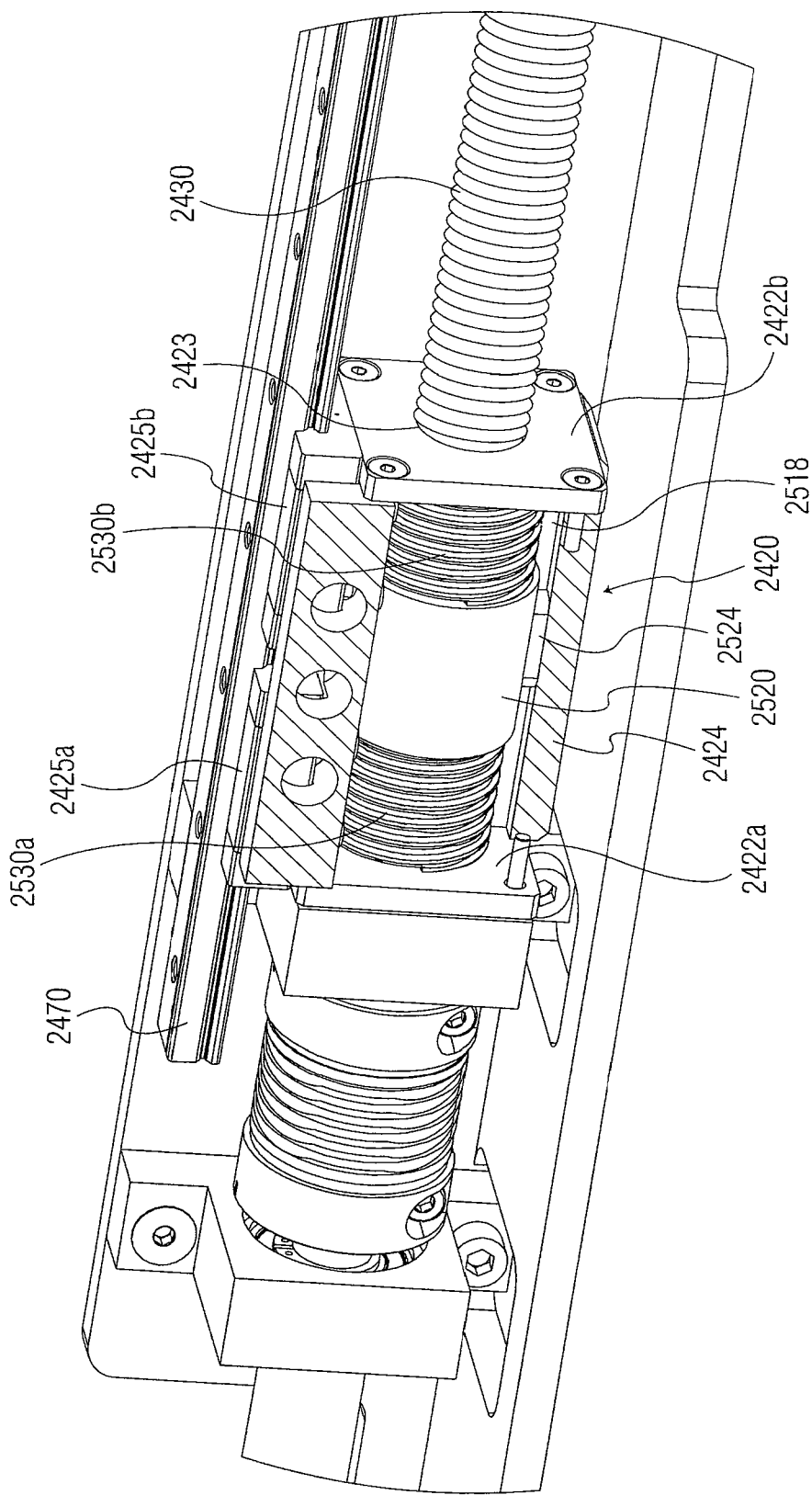

FIGS. 25 and 25A correspond to FIGS. 22 and 22A, respectively, but with portions of the traveler block cut away.

Figure 26:
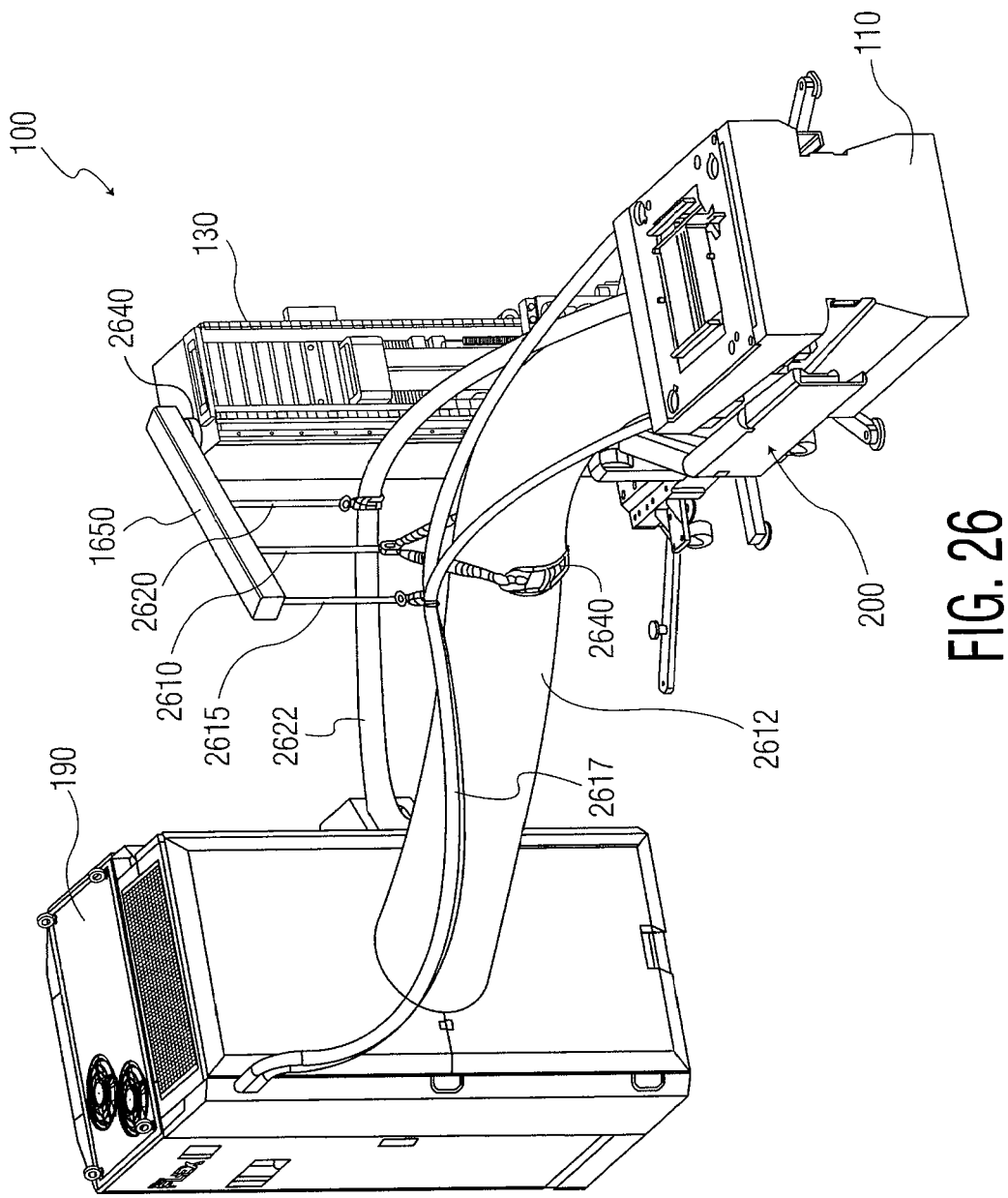

FIG. 26 is a perspective view of a test system that includes cables coupling a test head to a cabinet.

Figure 27:
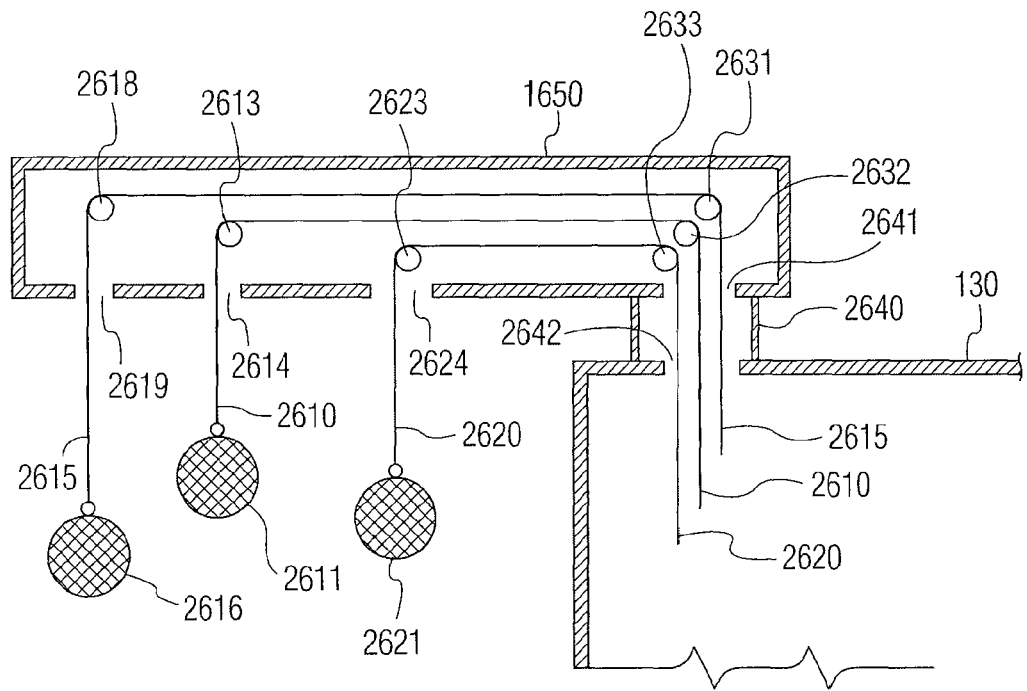

FIG. 27 is a schematic view of an exemplary embodiment of a cable support apparatus for a test system such as the one shown in FIG. 26.

Figure 28:
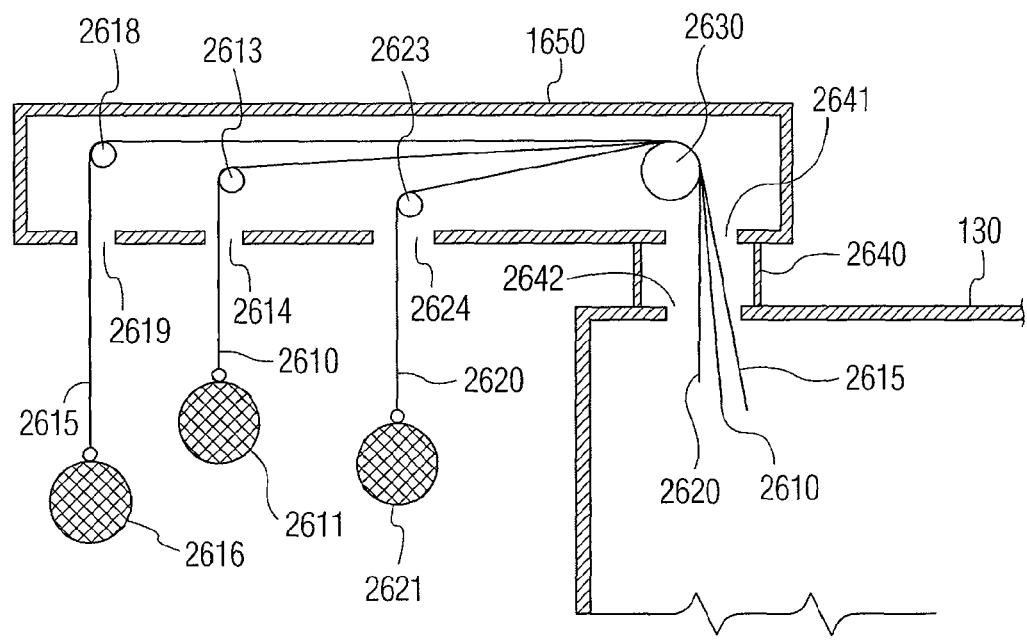

FIG. 28 is a schematic view of an alternative exemplary embodiment of a cable support system.

FIGS. 29A through 29D are four schematic views of alternative cable support mechanisms, each having different support characteristics.

Figure 30:
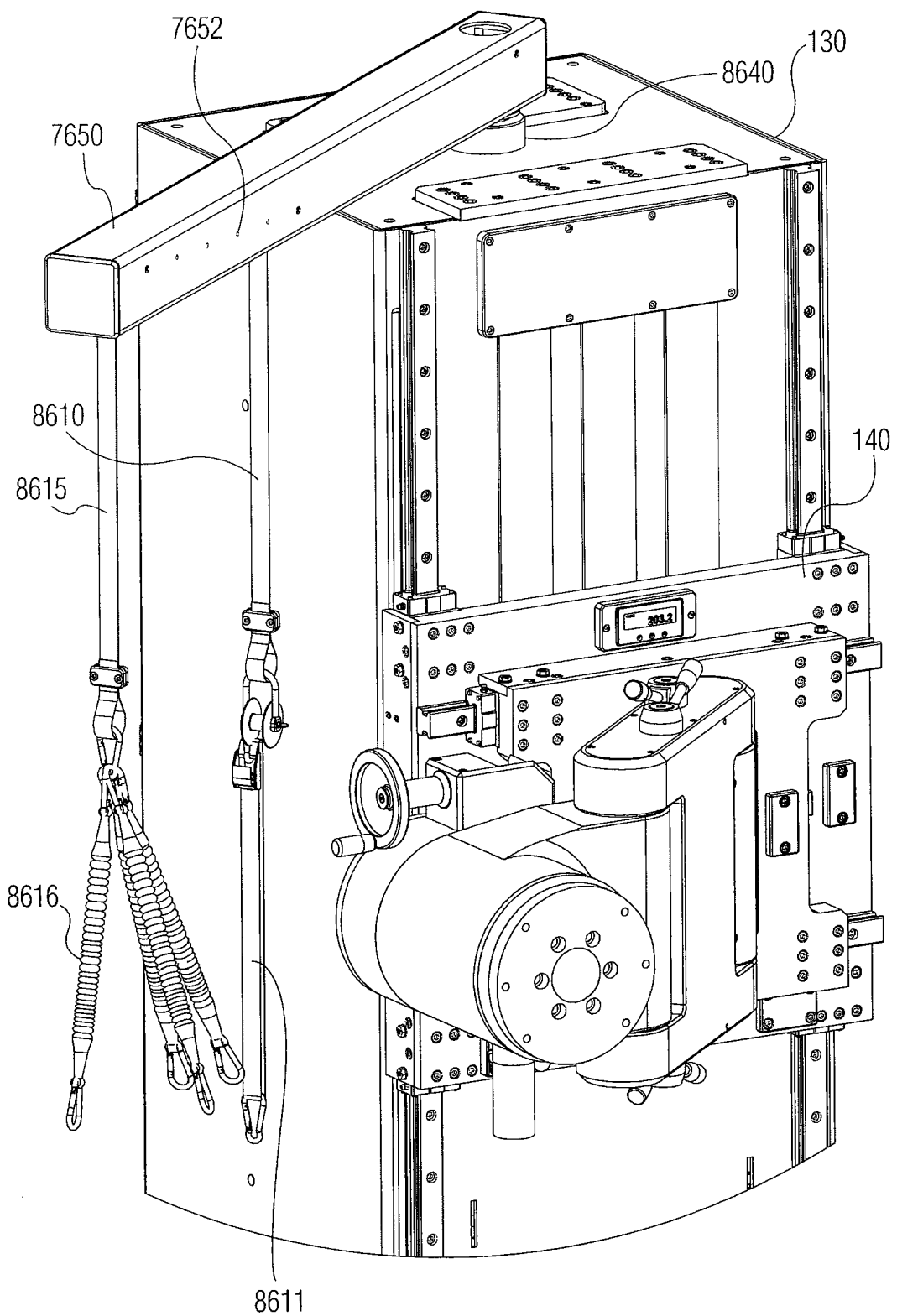

FIG. 30 is a perspective view of an alternative test system that includes cables coupling a test head to a cabinet.

Figure 31:
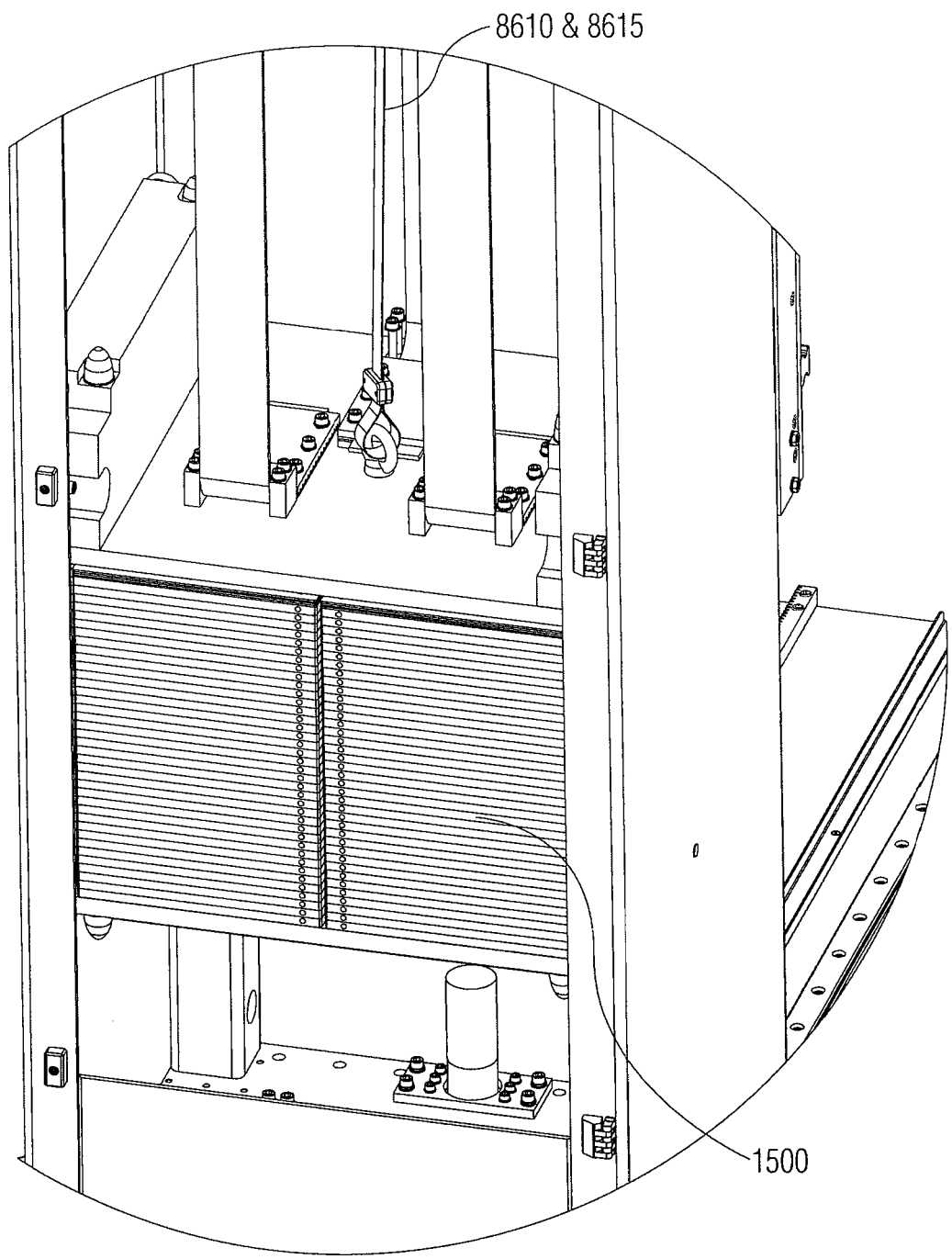

FIG. 31 is a rear perspective view of the test head system of FIG. 30.

Figure 32:
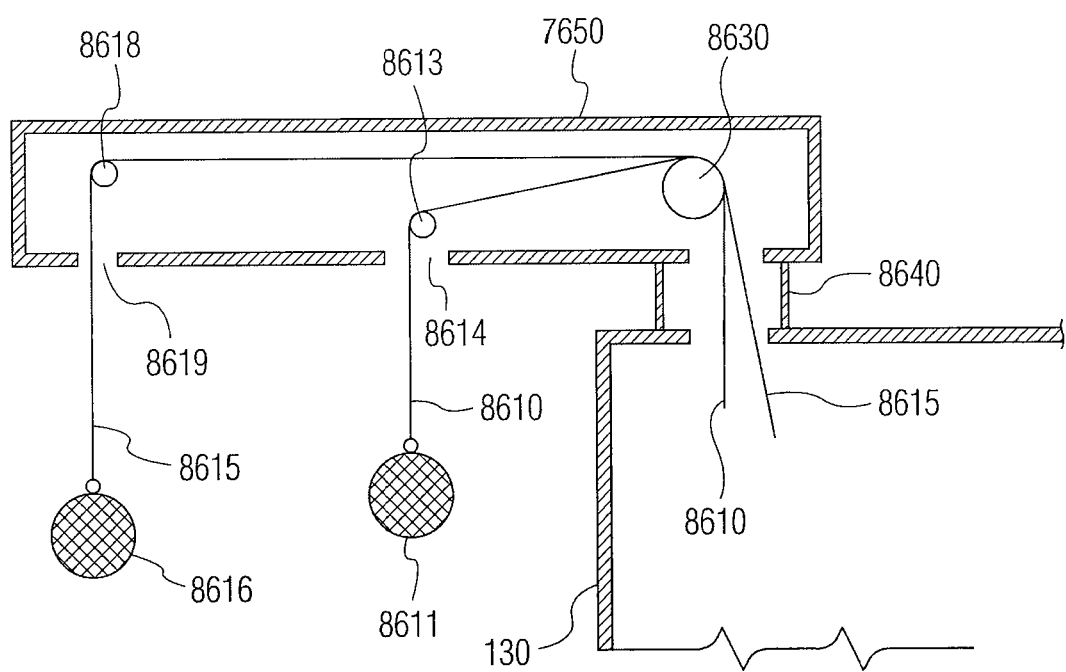

FIG. 32 is a schematic view of an exemplary embodiment of a cable support apparatus for a test system such as the one shown in FIG. 30.

FIGS. 33A through 33E are schematic views of alternative cable support mechanisms, each having different support characteristics.

DETAILED DESCRIPTION OF THE INVENTION

Figure 1A:
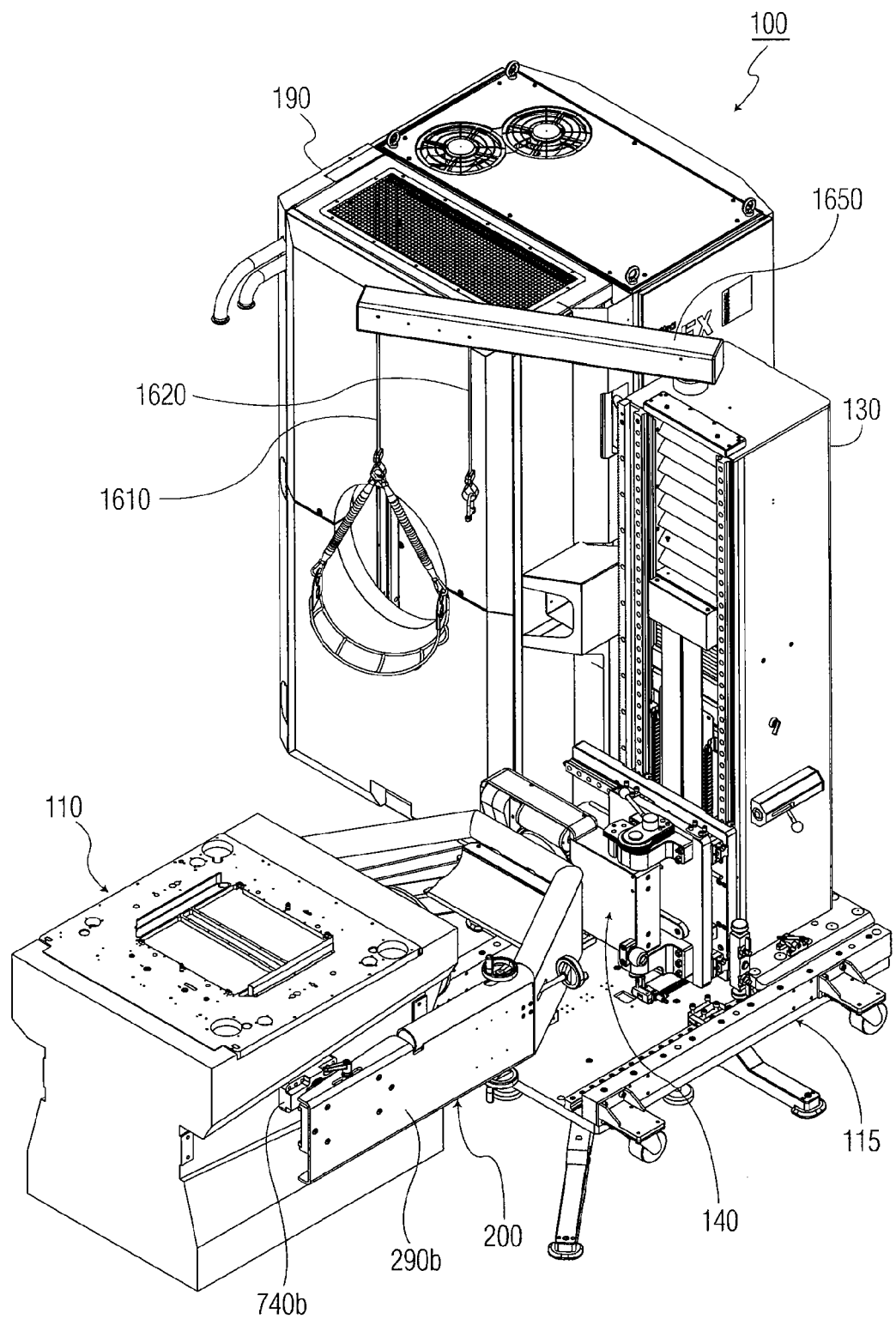

FIGS. 1A and 1B show test head positioner (or manipulator) 100 in accordance with an exemplary embodiment of the present invention. Positioner 100 includes base 115 and column 130. Column 130 allows test head 110 to be moved up and down for a vertical movement. Arm unit 140 moves up and down along column 130 through exemplary mechanisms, which are described below. Arm unit 140 may provide for motion in various degrees of freedom, which is also described below. Coupled to arm unit 140 is cradle 200, having two arms 290a and 290b. Test head 110 is able to be moved with various degrees of freedom within cradle 200. The various degrees of freedom that are permitted within cradle 200 are now described.

Test head manipulator 100 is described in more detail in co-pending PCT International Patent Application No. PCT/US2008/002134 which is incorporated herein by reference.

Figure 2A:
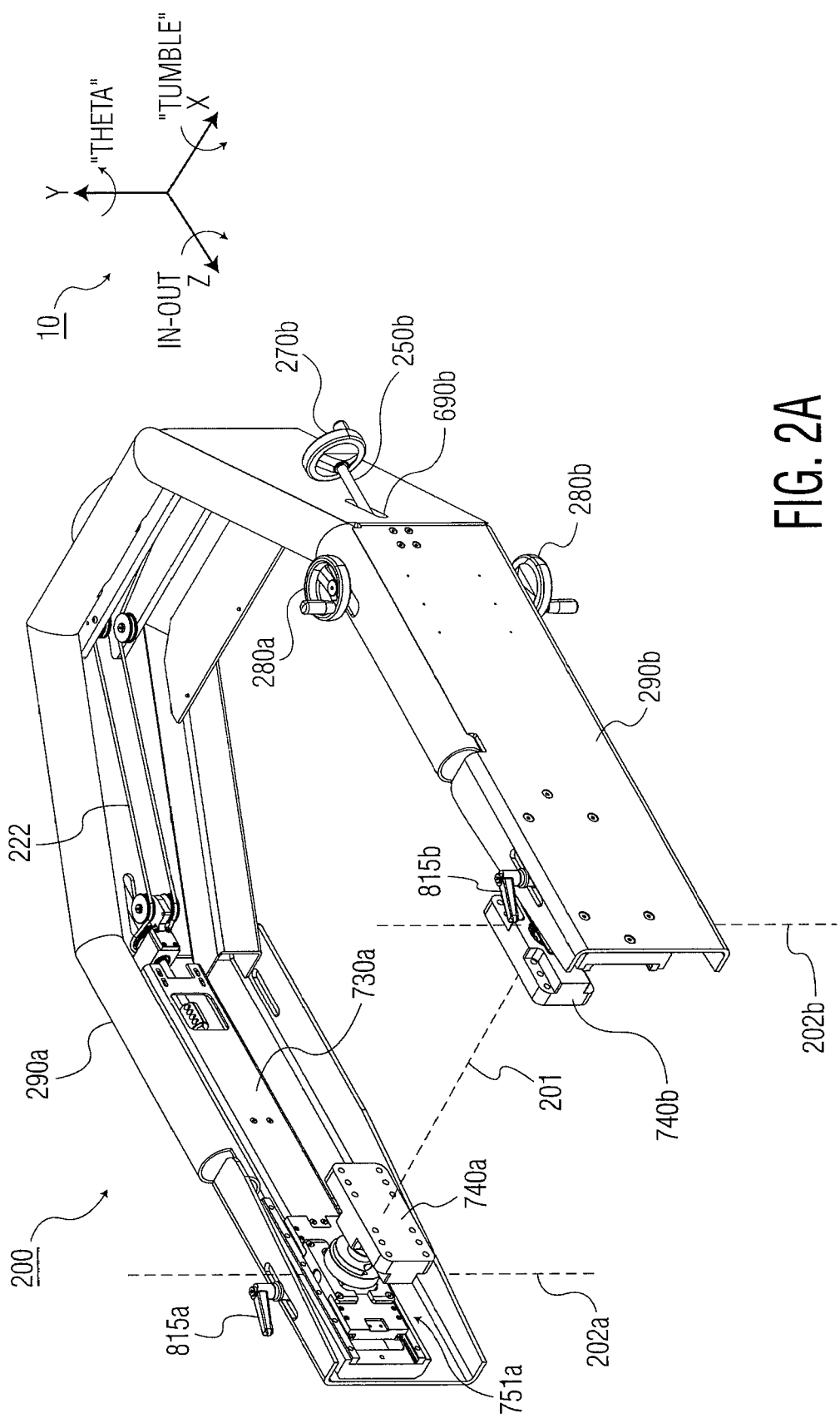
FIGS. 2A and 2B are three-dimensional views of a test head cradle that incorporates an exemplary embodiment of the invention, including a coordinate system that is attached to the cradle.
Figure 2B:
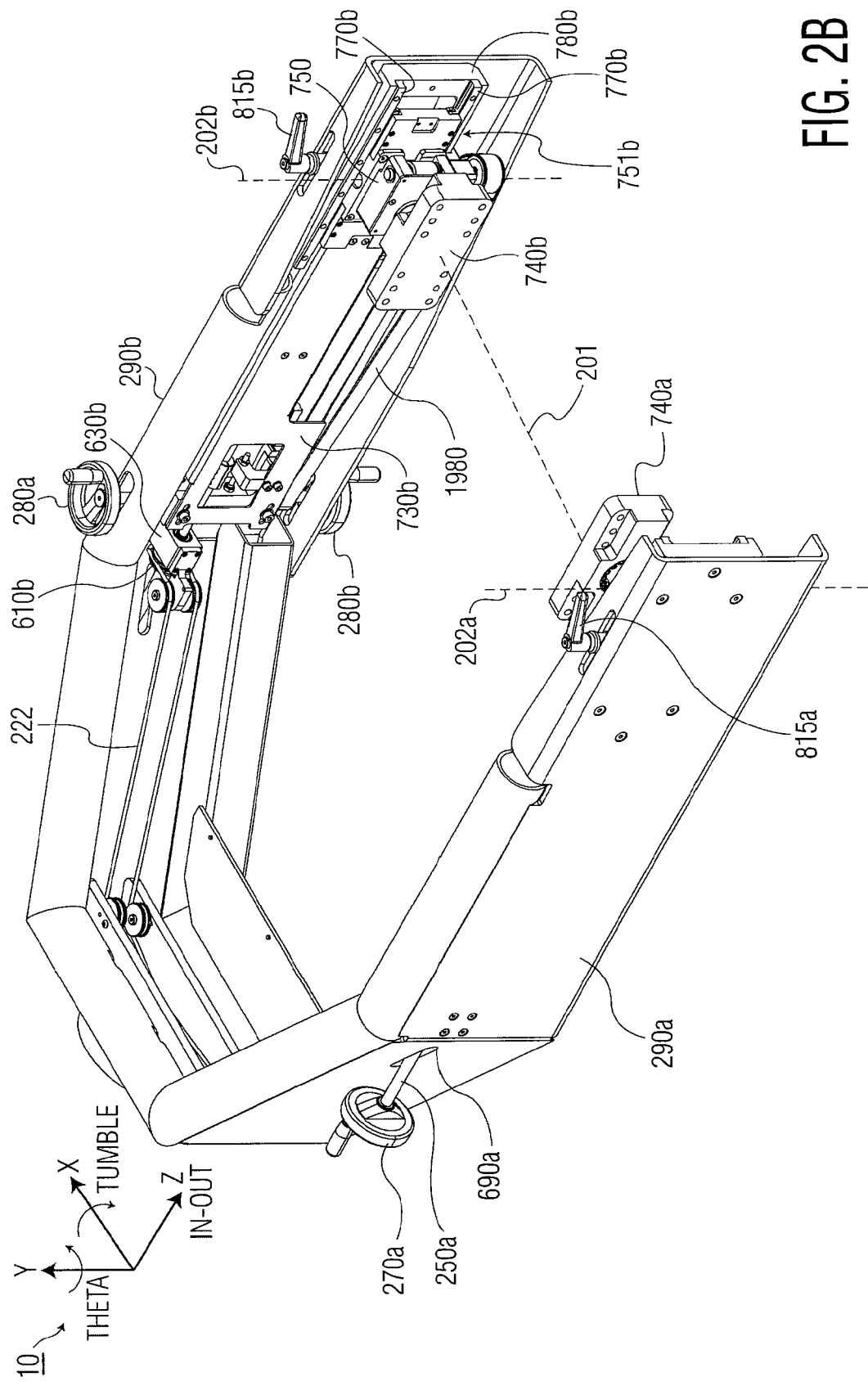

FIGS. 2A and 2B provide two perspective views of cradle 200. Cradle arms 290a and 290b include mechanisms that enable an operator to rotate handles 270a,b and 280a,b to cause a test head to move relative to the cradle in two degrees of freedom, which will be referred to as "operator-controlled" or "operator-driven" motions. The mechanisms also allow compliant motion (or compliance) of the test head relative to the cradle in three degrees of freedom. Compliance may be defined as placing an object in a condition (sometimes referred to as "substantially weightless") where it may be moved with a relatively small external force. FIGS. 2A and 2B include coordinate system 10, which may be considered to be attached to cradle 200 such that the XZ plane is parallel to a plane defined by cradle arms 290a and 290b. Rotation about the X axis may be referred to as tumble motion (theta X) and is equivalent to the Nod motion in the '048 patent. Also rotation about the Y axis may be referred to as yaw or "theta" motion (thetaY) and is equivalent to the Theta motion defined in the '048 patent. Finally, the Z-axis of coordinate system 10 is parallel to cradle arms 290A and 290B and corresponds to the In-Out axis of '048.

Exemplary operator-driven motions which may be provided to test head 110 within cradle 200 may include tumble motion (theta x), and yaw or "theta" motion (theta y). Compliant motion or compliance is provided within the cradle and includes Tumble (theta X), yaw (theta Y), and In-Out (linear Z).

We now provide an overview of the major components included in cradle 200 and their interactions. Although operator-driven motions are described as being accomplished by means of an operator rotating a handle, it will be apparent to those of ordinary skill that electromechanical, pneumatic or other types of actuators could be substituted along with appropriate controllers.

Referring to FIGS. 2A and 2B, side supports 740a and 740b are provided and coupled by carriage assemblies 751a and 751b to cradle arms 290a and 290b respectively. As seen in FIGS. 1A and 1B, test head 110 may be attached to side supports 740a and 740b using appropriate fasteners such as screws. Side supports 740a and 740b are mounted to carriage assemblies 751a and 751b so that each can pivot approximately plus or minus five degrees (or less) about respective axes 202a and 202b that are parallel to cradle 200's Y axis and that pass approximately through its respective cradle arm 290a or 290b. Also side supports 740a and 740b are designed so that they rotate at least approximately 90 degrees about a common tumble axis 201 in a plane parallel to the XZ plane and which is within plus or minus five degrees (or less) of being parallel to the X axis. Preferably, test head 100 is attached so that a line extending along the common rotation axis (axis 201) of side supports 740a and 740b passes approximately through its center of gravity.

Carriage assembly 751b includes gear box 750, which is coupled to tumble drive handles 280a and 280b by means of timing belt 1980 and other apparatus to be described later. Drive handles 280a and 280b are directly coupled to one another by means of a common shaft. Rotation of either handle 280a or 280b causes rotation of the shaft and the other handle. Rotation of either handle 280a or 280b is transmitted to gear box 750, causing side support 740b to rotate about the previously described tumble axis 201. As side support 740b is fixed to test head 110, test head 110 correspondingly rotates about tumble axis 201. Carriage assembly 751a does not include a gear unit. Rather, side support 740a is coupled with bearings to carriage assembly 751a in a manner that allows it to freely rotate about axis 201. Thus, as test head 110 rotates about axis 201, side support 740a freely rotates with it. Gear box 750 includes means to be described later that allows test head 110 to be rotated slightly about axis 201 in response to a relatively small external force, thus providing compliance in tumble rotation. Carriage assembly 751a includes stops to limit tumble motion to a predefined range such as approximately 90 degrees.

Carriage assemblies 751a and 751b are rigidly coupled to carriage extensions 730a and 730b respectively. Carriage assemblies 751a and 751b are slidingly mounted on the insides of cradle arms 290a and 290b respectively, such that carriage assemblies 751a and 751b may be moved linearly, back-and-forth, in the "In-Out" or Z-axis direction. It is to be understood that carriage extensions 730a and 730b move with their respective carriage assemblies 751a and 751b. Shafts 250a and 250b are coupled to theta driving handles 270a and 270b respectively to allow an operator to move carriage assemblies 751a and 751b back and forth. Clockwise rotation (viewed from handle 270a) of shaft 250a causes carriage assembly 751a to slide in the "Out" direction, and counterclockwise rotation of shaft 250a causes carriage assembly 751a to move in the "In" direction. Similarly, clockwise rotation (viewed from handle 270b) of shaft 250b causes carriage assembly 751b to slide in the "Out" direction, and counterclockwise rotation of shaft 250b causes carriage assembly 751b to move in the "In" direction. Shafts 250a and 250b are coupled to one another by means of belt 222 so that rotation of one of shafts 250a and 250b causes rotation of the other of shafts 250a and 250b. Because belt 222 forms a figure eight, shafts 250a and 250b rotate in opposite directions. Thus, rotation of either handle 270a or 270b will cause one of carriage assemblies 751a and 751b to move "In" while the other moves "Out." Thus, axis 201 may be rotated in a plane parallel to the XZ plane imparting Theta or yaw motion to test head 110. Because side supports 740a and 740b are allowed to pivot about axes 202a and 202b respectively, this motion is not inhibited. The connection between shafts 250a and 250b and their respective carriage assemblies 751a and 751b incorporates mechanisms (to be described later) that allow carriage assemblies 751a and 751b to move compliantly with respect to shafts 250a and 250b respectively. This enables test head 110 to be moved compliantly in both the "Theta" (yaw) and "In-Out" degrees of freedom.

Now, having provided a brief overview, we turn to a more detailed description of an exemplary embodiment.

Figure 3A:
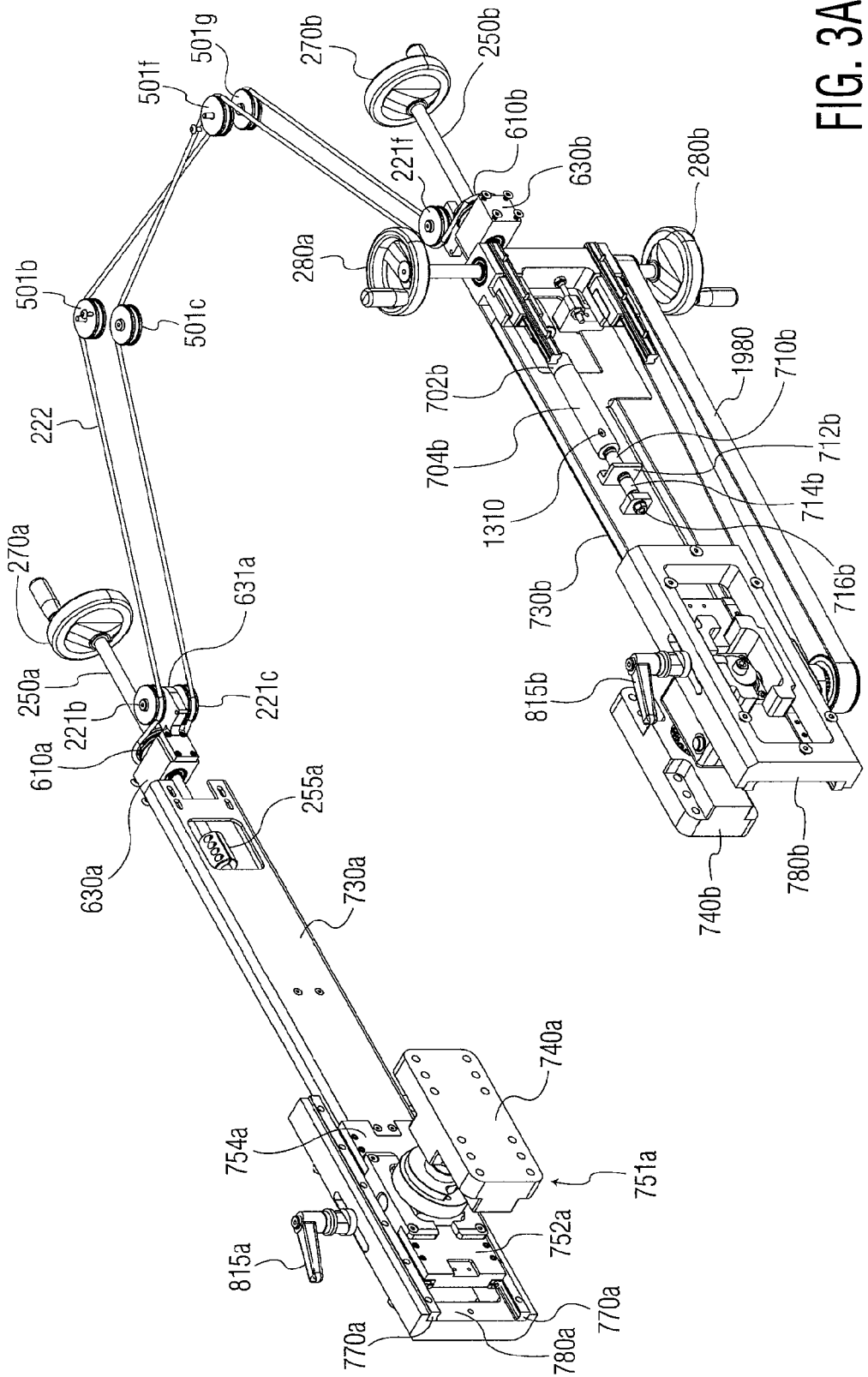
FIGS. 3A and 3B are three-dimensional views of mechanisms contained within the cradle with the cradle sides and other cradle structures hidden.
Figure 3B:
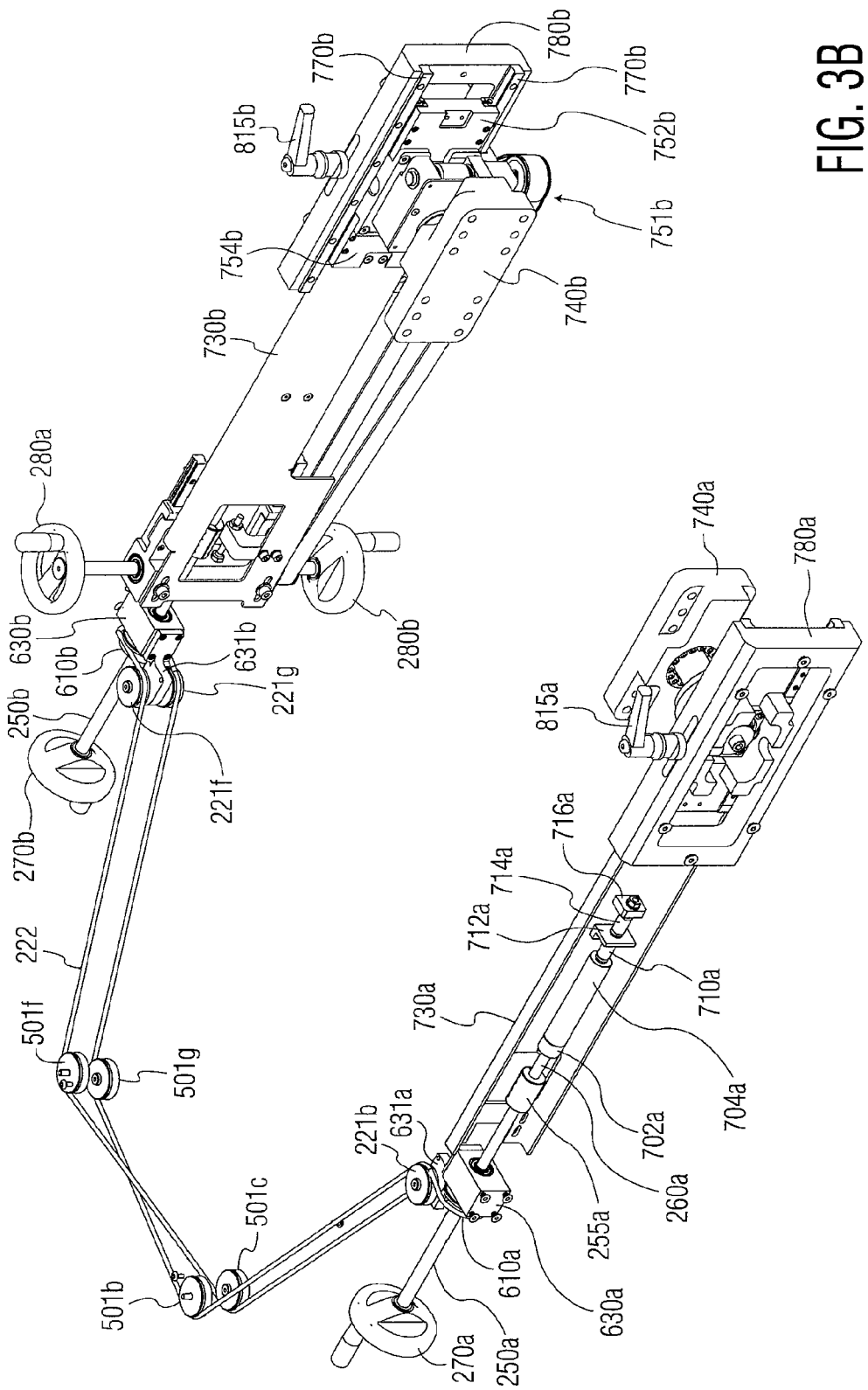
Figure 4A:
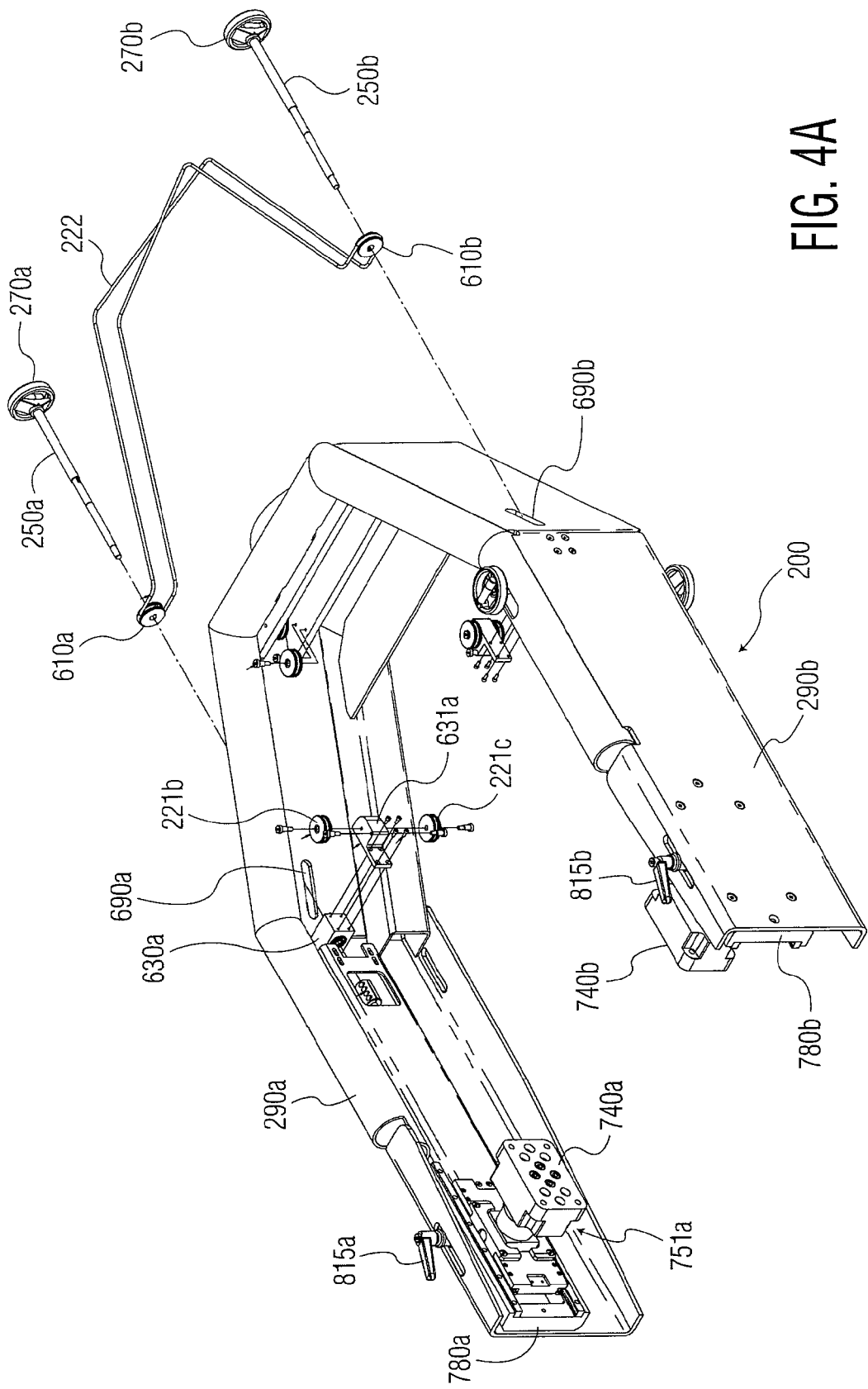
FIG. 4A is a partially exploded isometric view of the cradle.
Figure 4B:
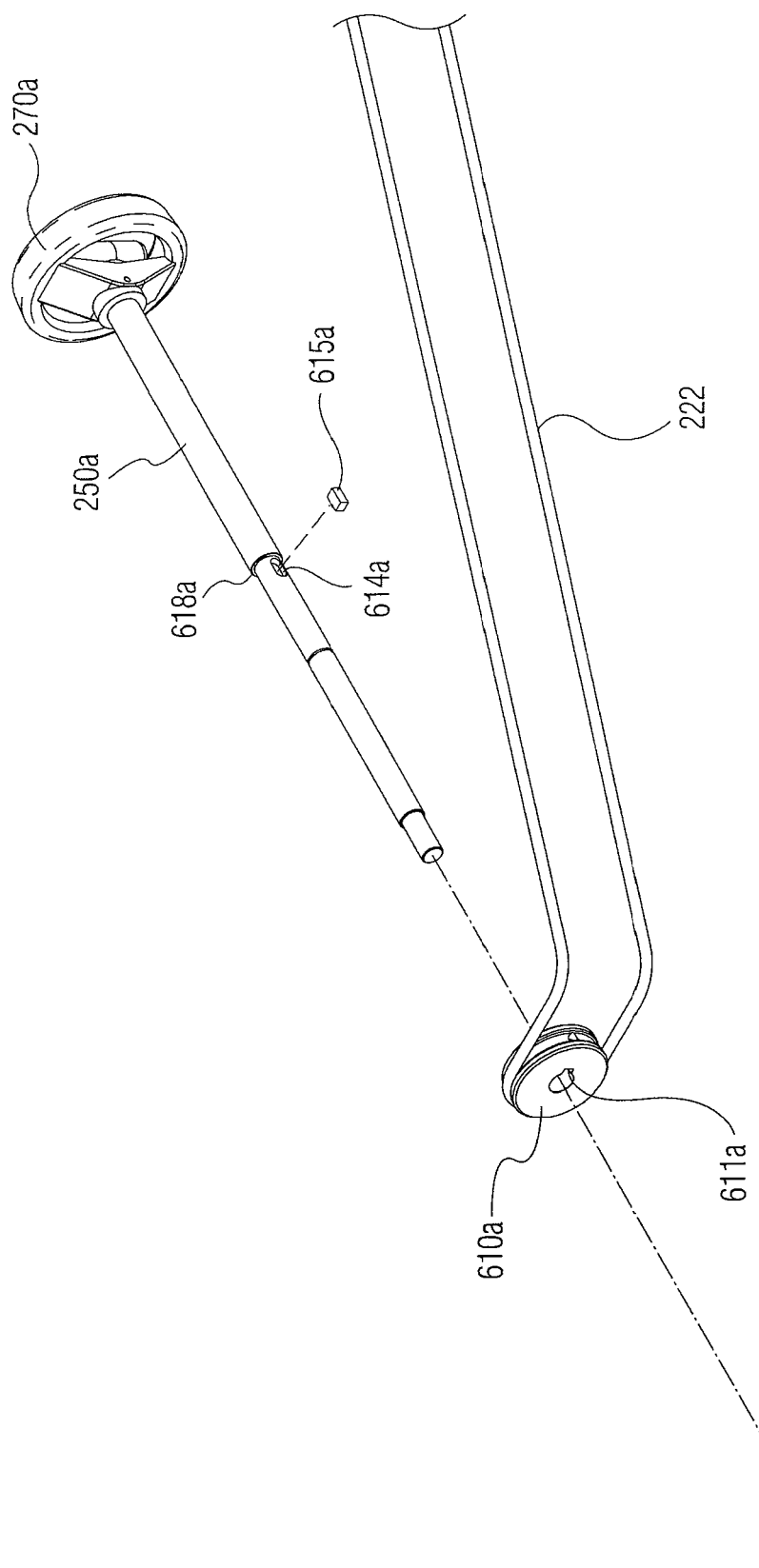
FIG. 4B is a more detailed view of certain components in FIG. 4A.

Referring to FIGS. 3A and 3B and FIGS. 4A and 4B, yaw is permitted through various components which are coupled, for example, to cradle 200. In FIG. 4A, cradle 200 is shown. In FIGS. 3A and 3B, the exterior structure of cradle 200 has been hidden. Yaw motion is accomplished through the rotation of shaft 250a and/or shaft 250b. As shown in FIGS. 3A and 3B, shafts 250a and 250b are coupled together so that rotation of one causes rotation of the other, and vice-versa. Furthermore, in order to cause yaw motion of test head 110, it is desirable for the rotation of one of shafts 250a, 250b in one direction to result in the rotation of the other of shafts 250a, 250b in an opposite direction. Put another way, if shaft 250a is rotated in a first direction, then it is desirable for the rotation of shaft 250a to result in the rotation of shaft 250b in a second direction opposite to the first direction. Similarly, if shaft 250b is rotated in a first direction, it is desirable for the rotation of shaft 250b to result in the rotation of shaft 250a in a direction opposite to the first direction.

This ability for the rotation of one of the shafts to result in rotation of the other of the shafts in an opposite direction is accomplished using a coupling assembly, for example, belt 222. As shown in FIG. 4A, belt 222 loops around pulley 610a and pulley 610b. Also, as shown, belt 222 "crisscrosses" itself as it travels between pulley 610a and pulley 610b, forming a FIG. 8. As further shown in FIGS. 3A and 3B, cable 222 is maintained in a path along the interior of cradle 200 through the use of pulleys 221b, 221c, 501b, 501c, 501f, 501g, 221f, and 221g. Belt 222 is made of a rubberized material and is round in cross section. Thus, there is ample friction to enable one shaft to readily drive the other shaft. Further, the belt is purchased as a standard length item, and it may be slightly stretched when it is installed. Its path within cradle 200 is designed so that it may be slipped or "snapped" into place without any tensioning adjustments necessary.

Pulleys 221b, 221c, 501b, 501c, 501f, 501g, 221f, and 221g are idler pulleys that freely rotate as the belt moves along its path. Pulleys 501b, 501c, 501f, and 501g simply rotate on shafts that are attached to internal surfaces of cradle 200 through structures, which would be understood to one of ordinary skill in the art. Pulleys 221b, 221c, 221f, and 221g are held in position above and below respective pulley mounts, also understandable to one of ordinary skill in the art.

Theta driving handles 270a and 270b may be coupled to shafts 250a, 250b respectively with appropriate means, such as keys, in order to facilitate rotation of shafts 250a and 250b. As shown, for example, in FIGS. 4B and 4C, shaft 250a extends through an opening in pulley 610a which includes key slot 611a. Key 615a is inserted in opening 614a in shaft 250a. Key 615a engages the key slot 611a of pulley 610a. Shaft 250a includes shoulder 618a against which pulley 610a is placed. Thus, as pulley 610a is installed onto shaft 250a, pulley 610a will not move past shoulder 618a. Furthermore, because key 615a is included, rotation of shaft 250a causes rotation of pulley 610a. Furthermore, pulley 610b includes a key slot arrangement similar to that of pulley 610a, and shaft 250b includes a shoulder and a key similar to shoulder 618a and key 615a included in shaft 250a. Thus, rotation of shaft 250b results in rotation of pulley 610b. Furthermore, as explained above, by virtue of belt 222, rotation of pulley 610a causes rotation of pulley 610b. Similarly, rotation of pulley 610b causes rotation of pulley 610a.

Because belt 222 crisscrosses itself as shown, as pulley 610a rotates in one direction, pulley 610b rotates in a direction opposite to that of pulley 610a and vice-versa.

As seen in FIG. 4A, shaft 250a extends through opening 690a in cradle 200. Similarly, shaft 250b extends through opening 690b in cradle 200.

Referring also to FIG. 3B, shaft 250a extends through an opening in pillow block 630a. Pillow block 630a is attached to an inner wall of side 290a of (not shown in FIG. 3A) cradle 200. Idler pulleys 221b and 221c are mounted to pulley mount 631a, which is in turn attached to pillow block 630a. Appropriate bearings may be situated between pulley 610a and pillow block 630a. Shaft 250a thus extends through pillow block 630a until it reaches shaft coupling 255a. Shaft 250a is thus inserted into one end of shaft coupling 255a. Threaded member 260a is inserted into the other end of shaft coupling 255a. Shaft coupling 255a clamps down on the respective ends of threaded member 260a and shaft 250a inserted therein so that threaded member 260a rotates as shaft 250a is rotated. Threaded member 260a is threaded into cylindrically-shaped nut 702A that is rigidly attached to cylindrically-shaped nut extension 704a.

Figure 4C:
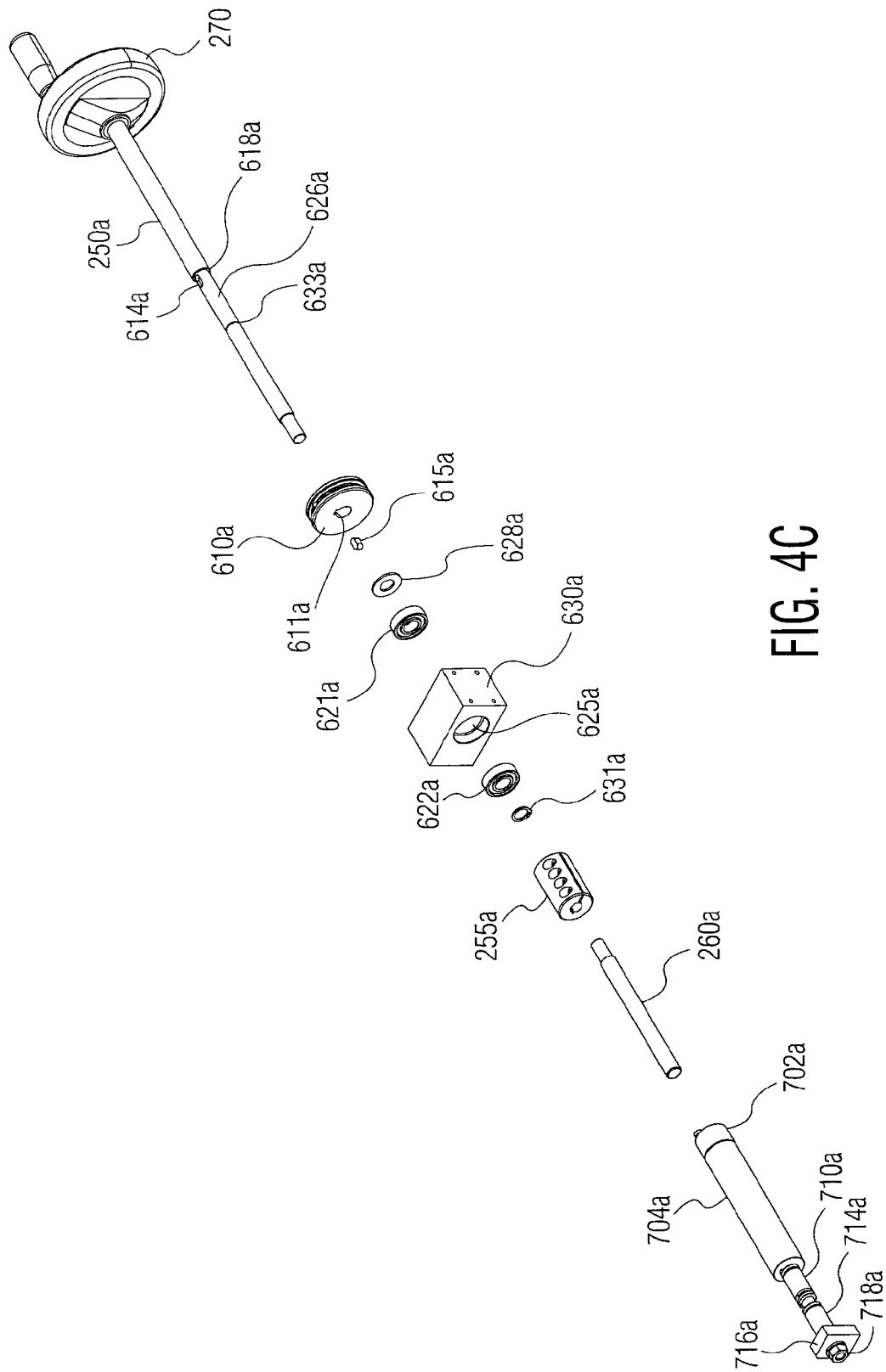
FIG. 4C is an exploded three-dimensional view of certain components which are hidden in FIG. 4A.

We next refer to FIG. 4C to describe the relationship between shaft 250a and pillow block 630a. The situation is the same for shaft 250b and its pillow block 630b; thus, the information need not be repeated. As previously described, pulley 610a is keyed to shaft 250a and abuts shaft shoulder 618a. Pulley 610a may not be moved beyond shoulder 618a. Ball bearings 621a and 622a are fitted into circular opening 625a in pillow block 630a. Shaft 250a may be received by ball bearings 621a and 622a so that, when assembled, shaft portion 626a is located and may freely rotate within pillow block 630a. Thrust bearings 628a may be fitted on shaft 250a and located between pillow block 630a and pulley 610a. Retaining ring 631a is fitted into circumferential slot 633a in shaft 250a. Pulley 610a and thrust bearings 628a prevent shaft 250a from moving in the "Out" direction; retaining clip 631a prevents motion of shaft 250b in the "In" direction. Thus, when assembled, shaft 250a may freely rotate within pillow block 630a but is constrained so that it cannot move in the "In-Out" direction, which is parallel to the Z axis.

Figure 5:
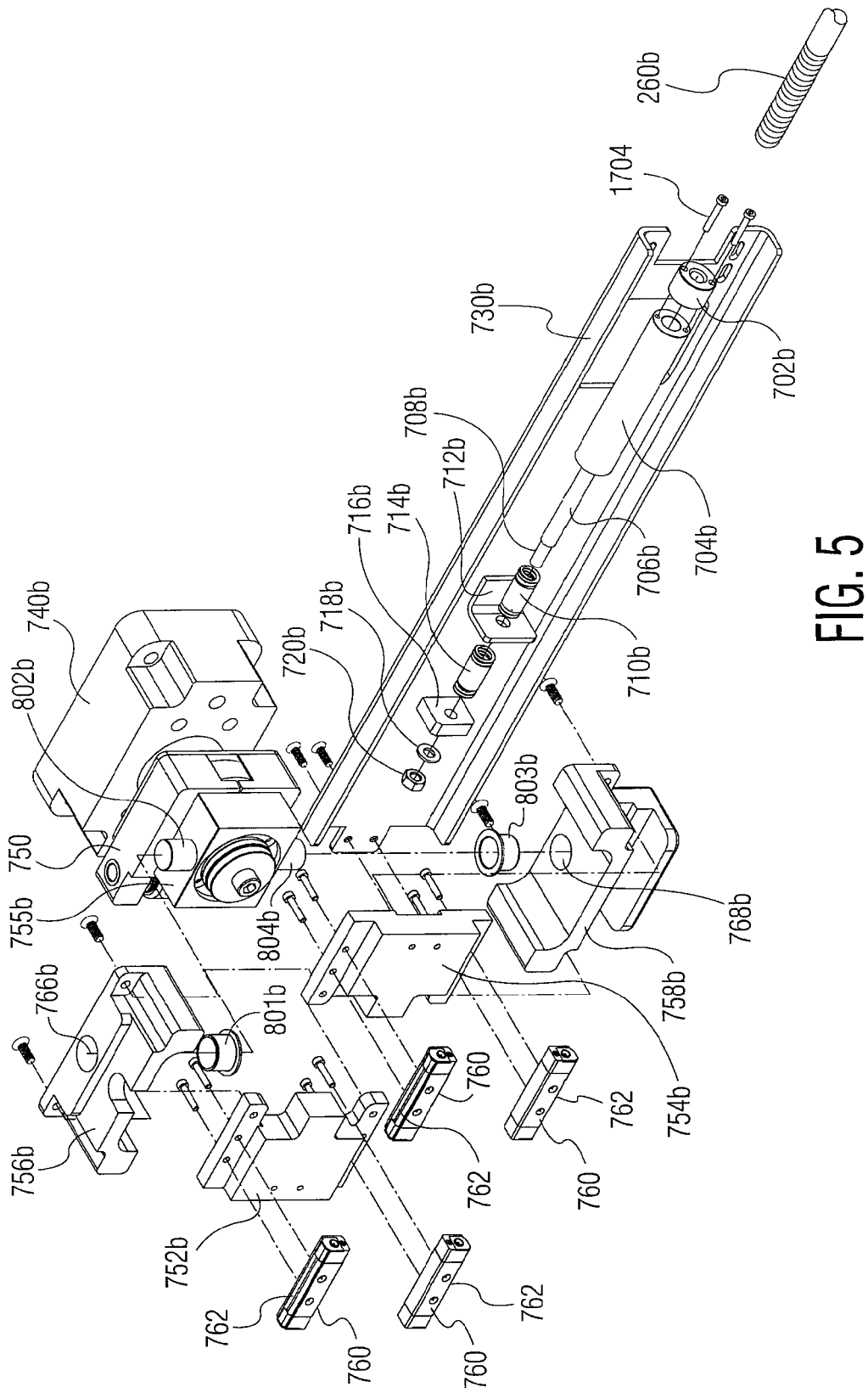
FIG. 5 is a exploded three-dimensional view of a theta drive unit and associated apparatus that includes a tumble gearbox.
Figure 6:
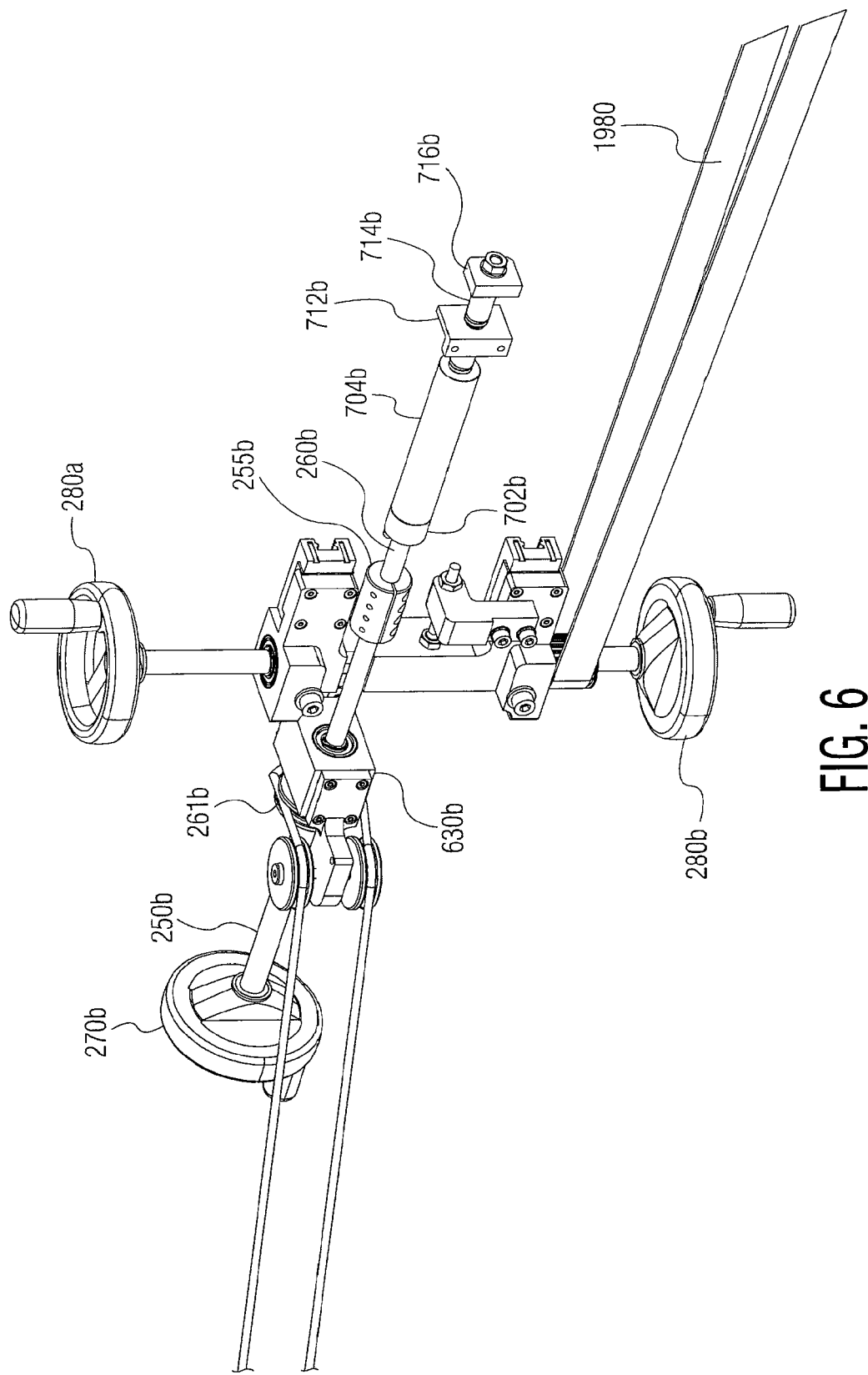
FIG. 6 is a three-dimensional view of the theta drive actuator combined with the tumble drive actuator.
Figure 7:
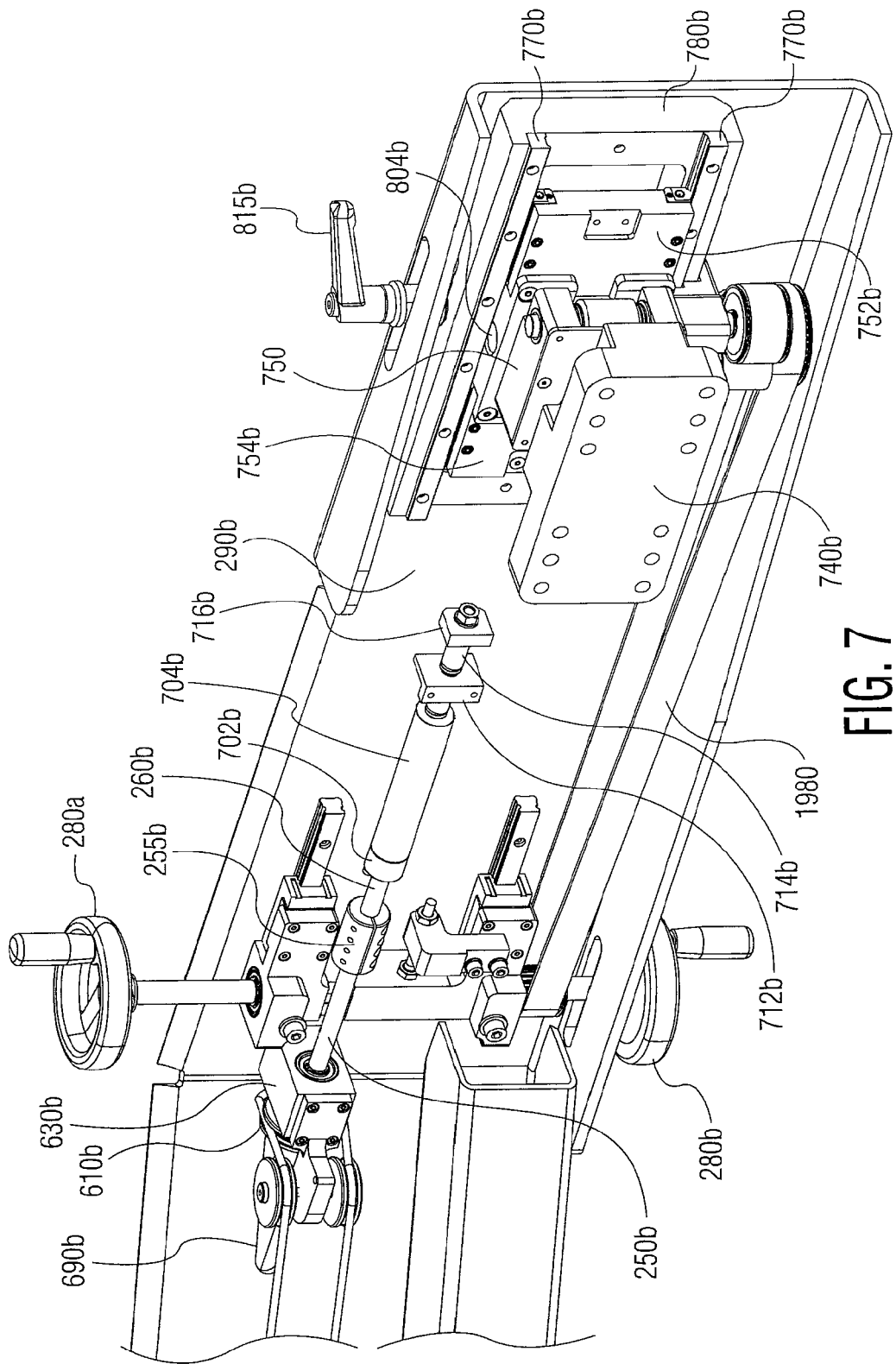
FIG. 7 is a three-dimensional view of the mechanisms shown in FIG. 6 mounted in one arm of the cradle.

We next refer to FIGS. 5, 6, and 7 which show in more detail the structure within arm 290b of cradle 200. Carriage extension 730b is removed from FIG. 2B to create FIG. 7. Arm structure 290b and various other apparatus have been removed from FIG. 7 to create FIG. 6. FIG. 5 is an exploded view of a subassembly comprising theta carriage extension 730b, theta carriage assembly 751b, and their coupling to threaded member 260b. The view in FIG. 5 is from inside cradle side 290b looking towards the inside of carriage extension 730b.

Referring to FIGS. 5, 6 and 7 and recalling FIGS. 2A and 3A, shaft 250b extends through opening 690 in arm 290B of cradle 200. Shaft 250b then extends through an opening in pillow block 630b (which is also fixed to the inner wall of arm 290b of cradle 200). The assembly including shaft 250b, pillow block 630b, and pulley 610b is the same as previously described with respect to shaft 250a. Thrust bearings, ball bearings and a retaining clip are all used as previously described. Shaft 250b is inserted into an end of a shaft coupling 255b. Threaded member 260b extends from the opposite end of shaft coupling 255b.

Threaded member 260b extends into the threaded opening of cylindrical nut 702b. Threaded member 260b is shown to the right of nut 702b in FIG. 5. Nut 702b may move linearly along threaded member 260b as threaded member 260b is rotated with respect to nut 702b. Nut 702b is rigidly coupled to shaft 704b by means of screws 1704. In this manner, as nut 702b moves linearly, shaft 704b moves with nut 702b. The nut 702b and shaft 704b define a portion of the conversion assembly that converts the rotative motion into axial, linear motion. This specific conversion assembly is described here, while similar conversion assemblies are described with respect to the other embodiments.

Threaded member 260b extends within shaft 704b. Thus, threaded member 260b moves in and out within shaft 704b. In effect, the combination of nut 702b and shaft 704b comprises an extended nut. Shaft 704b includes extension member 706b rigidly mounted thereto. In an exemplary embodiment, extension member 706b and shaft 704b may be machined from a single piece of metal. The terminal end of extension member 706b may include threaded end portion 708b. Extension member 706b and threaded extension end 708b extends through spring 710b, an opening in L-bracket 712b, and spring 714b. Threaded extension 708b is then threaded through anti-rotation block 716b such that a portion extends beyond anti-rotation block 716b. Flat washer 718b is passed over the end of threaded extension 708b. Hex nut 720b is then threaded onto threaded extension 708b and tightened against flat washer 718b and anti-rotation block 716b. Anti-rotation block 716b is not attached to carriage extension 730b. Rather, it is sized and shaped such that it may readily slide along the inside of carriage extension 730b without rotating. Thus, carriage extension 730b may move linearly with respect to shaft 704b and extension member 706b while shaft 704b and extension member 706b are prevented from rotating as shaft 250b is rotated.

L-bracket 712b is rigidly mounted to carriage extension 730b. Thus, as shaft 704b moves, carriage extension 730b moves with it. Furthermore, the springs 710b and 714b define a biasing assembly that functions to provide compliance to carriage extension 730b. Compliance may be defined as placing an object in a condition where it may be moved with a relatively small external force. In this particular situation, the compliance afforded by springs 710b, 714b allows carriage extension 730b to have a small amount of "wiggle" room. Thus, carriage extension 730b (and anything coupled to carriage extension 730b) can easily be moved small distances without rotating shafts 250a, 250b. As will be explained later, test head 110 is coupled to and moves with carriage extension 730b. Thus, because of the compliance afforded by springs 710b, 714b, it is possible to move test head 110 small distances by simply pushing or pulling on test head 110. This feature is particularly desirable when docking a test head with a test peripheral such as a prober or package handler. Sometimes, after rotating shaft 250b, test head 110 maybe slightly misaligned with a test peripheral to which it is to be desirably docked. The compliance feature afforded by springs 710b, 714b allows the docking mechanism or the operator to move test head 110 to address slight misalignment between test head 110 and the test peripheral.

To briefly summarize, rotation of theta drive handle 270b causes rotation of shaft 250b and threaded member 260b. Shaft 250b is mounted in pillow block 630b so that it can freely rotate, but not move linearly. Nut 702b is coupled through shaft 704b to anti-rotation block 716b and thus prevented from rotating. Threaded member 260b is threaded into nut 702b and extends into an opening in shaft 704b. Thus, as handle 270b is rotated, nut 702b moves linearly along threaded member 260b. Angle bracket 712b is rigidly attached to carriage extension 730b. Shaft extension 706b couples shaft 704b to angle bracket 712b by means of springs 710b and 714b. Thus, as nut 702b and shaft 704b move linearly, carriage extension 730b is urged to move linearly with them. However, when nut 702b is maintained in a fixed position, an external force, sufficient to overcome the forces of springs 710b and 714b, may also move extension carriage 730b linearly, providing compliance.

Referring again to FIG. 3B, it is seen that theta drive handle 270a is coupled to carriage extension 730a in an identical manner as just detailed for the coupling of theta drive handle 270b to carriage extension 730b. Thus rotation of handle 270a causes linear motion of carriage extension 730a. Further, as shaft 704a and shaft extension 706a are coupled to carriage extension 730a by way of springs 710a and 714a, linear compliance is also provided for carriage extension 730a.

In an exemplary embodiment, both threaded members 260a and 260b have right hand threads. Recall that belt 222 is arranged so that rotating one of threaded members 260a and 260b in a first direction causes the other to rotate in the opposite direction. Thus, rotating either theta drive handle 270a or 270b will cause carriage extensions 730a and 730b to move linearly in opposite directions. In particular, if we take the "Out" direction to be towards the closed end of cradle 200 and the "In" direction to be towards the open end, then rotation of theta drive handle 270b in a clockwise direction (when viewed from the open end of cradle 200) causes carriage extension 730b to move in the "In" direction and carriage extension 730a to move in the "Out" direction. In practice, only one of the two theta drive handles 270a and 270b is required. One or the other or both may be installed as best suits the particular application. (Note, however, that if one of threaded members 260a and 260b is right hand threaded and the other of threaded members 260a and 260b is left hand threaded, then the same effect will be achieved when belt 222 does not form a figure eight and both shafts rotate in the same direction.)

Thus, as described above, carriage extensions 730a and 730b are capable of "In-Out" sliding motion. Carriage extensions 730a and 730b are coupled to theta carriage assemblies 751a and 751b respectively. Theta carriage assembly 751b is combined with components associated with the tumble drive whereas carriage assembly 751a is simpler. Referring to FIG. 5, theta carriage assembly 751b, which includes first theta carriage 752b, second theta carriage 754b, first mid plate 756b and second mid plate 758b, is described. More specifically, as shown in FIG. 5, the upper right corner of first theta carriage 752b is coupled to the upper left corner of first mid plate 756b. The upper left corner of second theta carriage 754b is coupled to the upper right corner of first mid plate 756b. The lower right hand corner of first theta carriage 752b is coupled to the lower left corner of second mid plate 758b. The lower left corner of second theta carriage 754b is coupled to the lower right corner of second mid plate 758b.

Theta carriage 754b is attached to theta carriage extension 730b, thus attaching theta carriage assembly 751b to carriage extension 730b. Thus, theta carriage assembly 751b moves with carriage extension 730b.

As further shown in FIG. 5, linear bearing assemblies 760 are also included. Linear bearing assemblies 760 are attached to respective top and bottom locations of theta carriages 752 and 754. As shown in FIG. 5, the two upper bearing assemblies 760 include bearings 762 facing upwards. Furthermore, the two lower bearing assemblies 760 include bearings 762 facing downwards.

Bearings 762 engage linear rails 770b, which are attached to base plate 780b (FIGS. 7, 2B and 3B for example), which is in turn attached to the inner wall of arm 290b of cradle 200. Further details regarding the interface between bearings 762 and those rails are described below.

Also shown in FIG. 5 is gear box 750 attached to tumble/ theta block 755b. Tumble/theta block 755 includes pivot journals 802b, 804b. Pivot journals 802b, 804b are inserted into opening 766b of first mid plate 756b and opening 768b of second mid plate 758b, respectively. Pivot journals 802b, 804b are inserted into openings 766b and 768b respectively before theta carriages 752b and 754b are attached to mid plates 756b and 758b. Openings 766b and 768b are equipped with flange bearings 801b and 803b respectively, so that tumble/theta block 755b may freely pivot within theta carriage 751b.

We now turn to more detailed, individual descriptions of theta carriages 751a and 751b because, although similar, each has unique characteristics. We begin with theta carriage 751a, which is the simpler of the two.

Figure 8A:
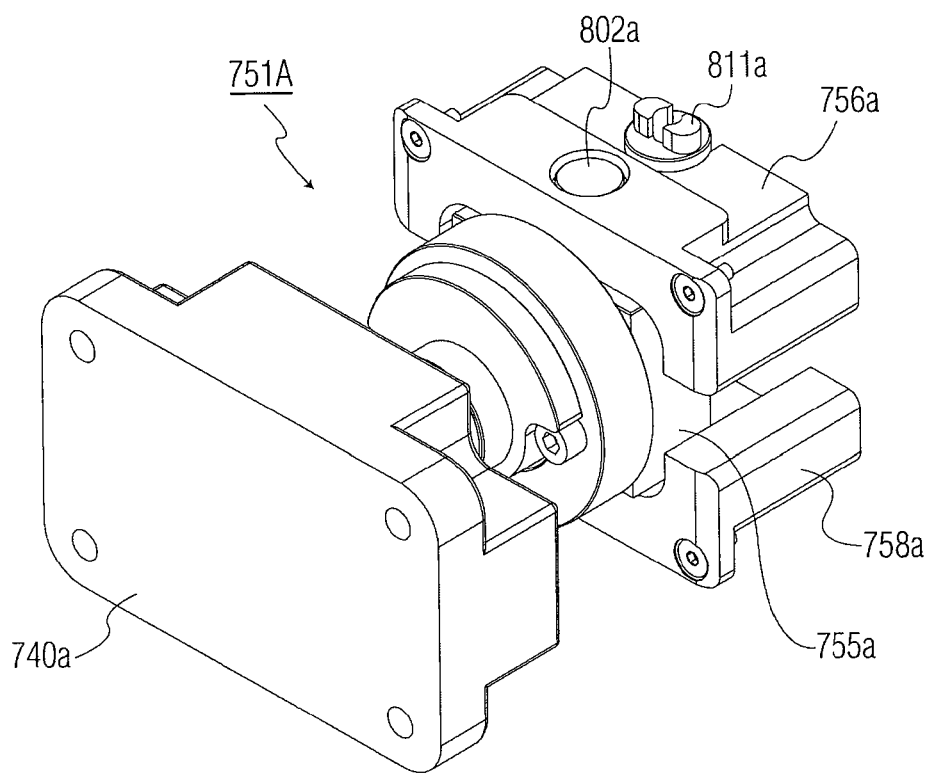
FIGS. 8A and 8B are two three-dimensional views of a theta/tumble mounting assembly including tumble motion stops.
Figure 8B:
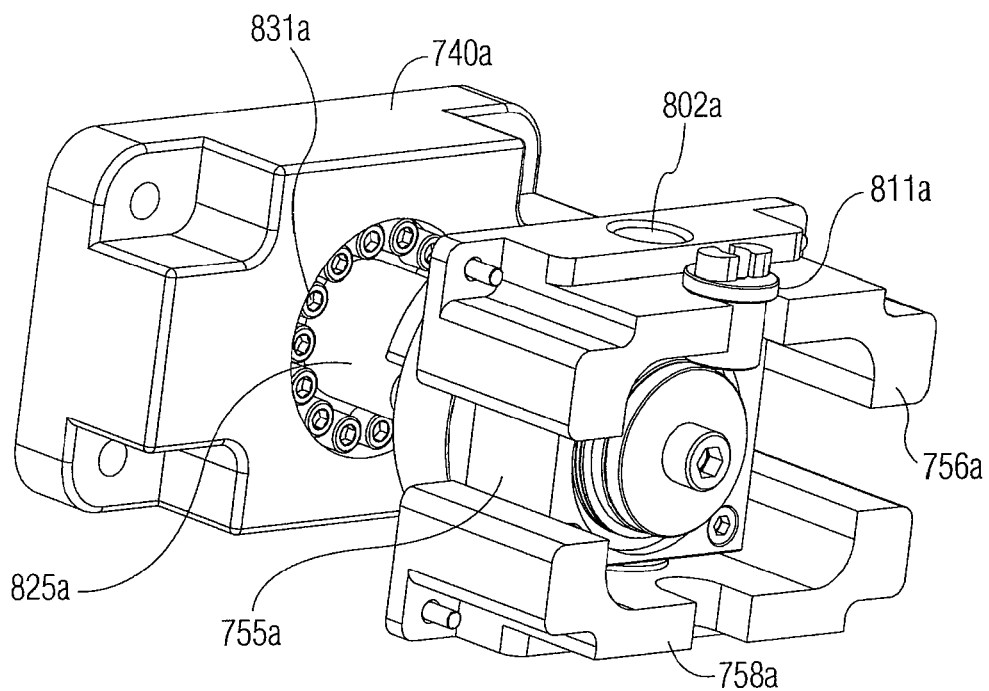

FIGS. 8A through 8E are provided to describe theta carriage 751a. FIGS. 8A and 8B provide two perspective views of theta carriage 751a assembled to first and second mid plates 756a and 758a. Also included is side support 740a, which is coupled to test head 110 (not shown). In a similar manner as discussed above, first and second mid plates 756a and 758a may be attached to theta carriages 752a and 754a (not shown in this series of Figures).

Figure 8C:
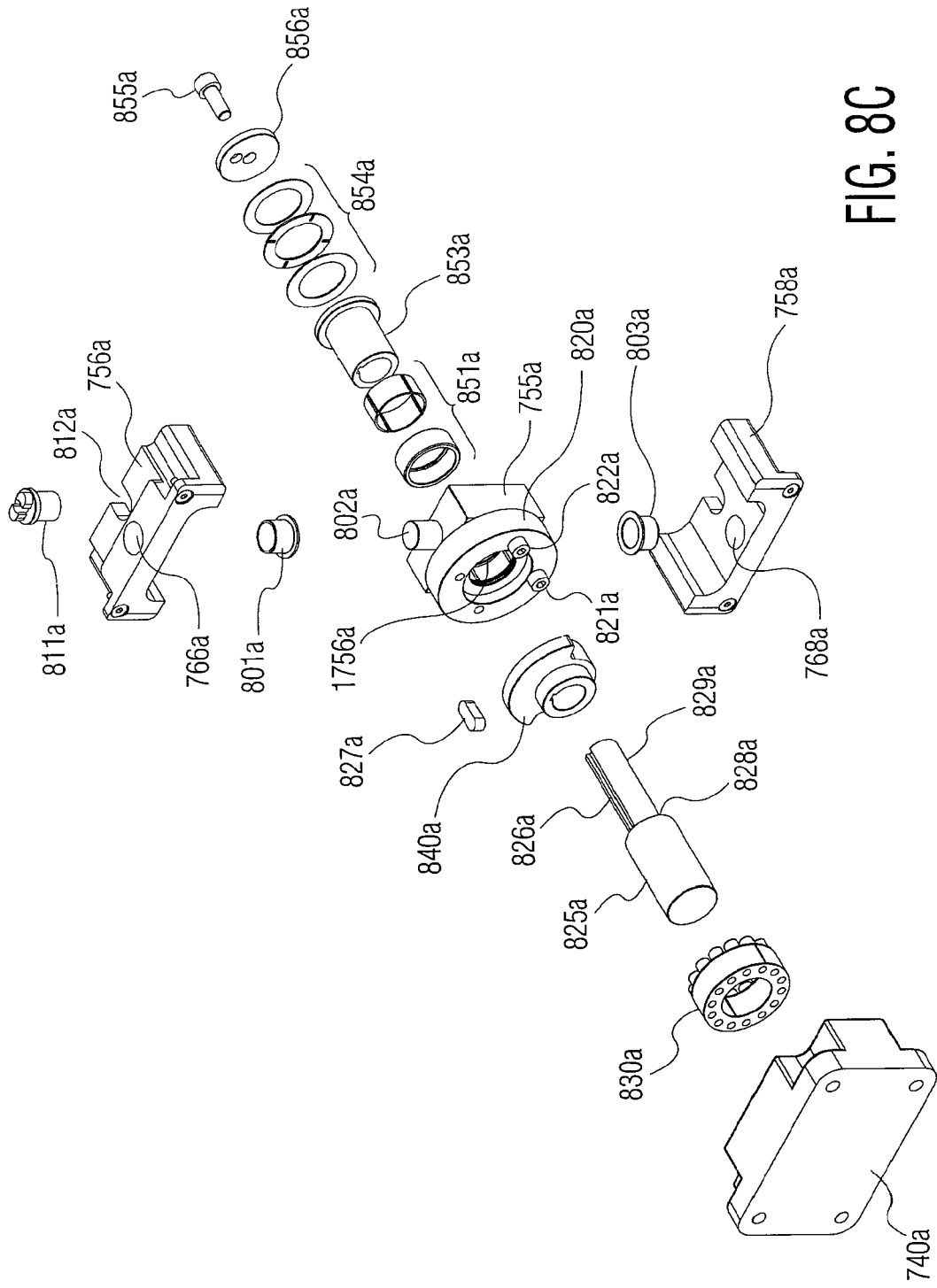
FIGS. 8C and 8D are two exploded views of the assembly shown in FIGS. 8A and 8B.
Figure 8D:
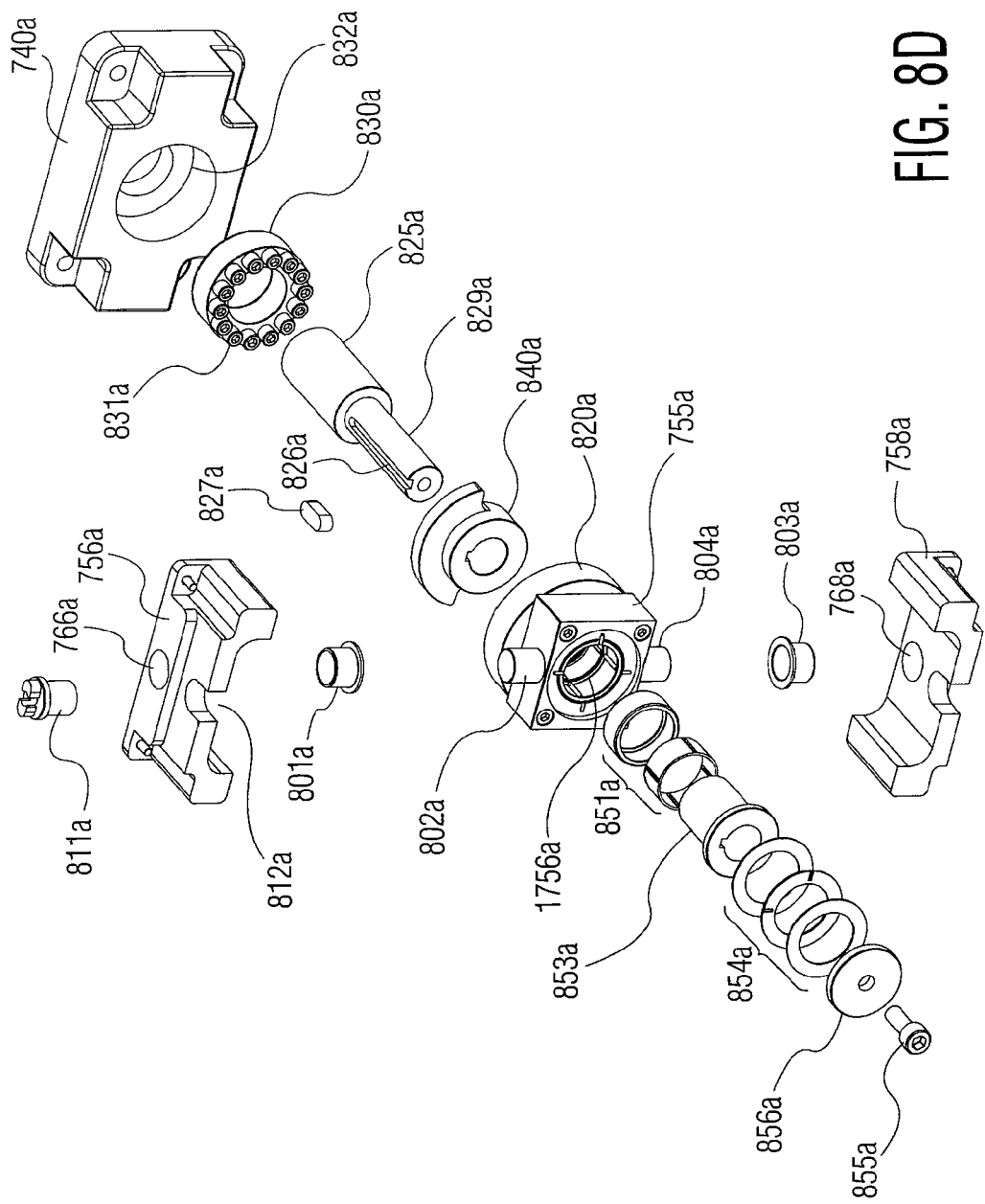

FIGS. 8C and 8D provide two exploded views of the apparatus shown in FIGS. 8A and 8B. Tumble/theta block 755a is attached to spacer 820a with appropriate fasteners. Two socket head cap screws 821a and 822a protrude from spacer 820a to act as stops as is subsequently explained. Opening 1756a extends centrally through tumble/theta block 755a and spacer 820a.

Tumble/theta block 755a includes coaxial pivot journals 802a and 804a. Mid plates 756a and 758a include openings 766a and 768a respectively. Flange bearings 801a and 803a are fitted into openings 766a and 768a respectively. Pivot journals 802a and 804a may then be fitted into flange bearings 801a and 803a respectively to enable tumble/theta block 755a to smoothly pivot about an axis defined by coaxial pivot journals 802a and 804a.

Stepped shaft 825a, which includes key way 826a is fitted to opening 1756a in the following manner. Bearings 851a (as well as other appropriate bearings which are not visible) are first fitted into opening 1756a. Stop unit 840a is keyed with key 827a, for example, to shaft 825a and is butted against shoulder 828a. The small diameter section 829a of shaft 825a may then be inserted into opening 1756a and advanced until rear section 841a of stop unit 840a rides against bearing inside opening 1756a. In its proper position, rear section 841a is close to, but does not contact, the surface of spacer 820a. Shaft sleeve 853a may be inserted into opening 1756a from the opposite side. Sleeve 853a is also keyed to shaft 825a and is located between the surface of shaft 825a and bearings 851a (and others not visible). Shims and washers 854a, retainer 856a, and screw 855a then complete the assembly in a manner that one of ordinary skill in the art will understand. Thus, shaft 825a may freely rotate about its axis, which is perpendicular to the axis defined by pivot journals 802a and 804a. The rotational axis of shaft 825a defines one end of tumble axis 201, and the axis defined by pivot journals 802a and 804a will define axis 202a. (FIGS. 2A and 2B).

Side support 740a is rigidly attached to shaft 825a in a manner that allows the position of side support 740a to be adjusted within plus or minus a few millimeters along the axis of shaft 825a. Expandable clamp ring 830a (for example a "Sannsaetze" available from Maedler GmbH, Germany) is placed over shaft 825a and simultaneously inserted into circular opening 832a in side support 740a. Tightening the cap screws 831a located about the periphery of clamp ring 830a causes clamp ring 830a to simultaneously expand inwards against shaft 825a and outwards against the wall of opening 832a, thus firmly and rigidly clamping side support 740a to shaft 825a. Loosening screws 831a causes clamp ring 830a to contract, allowing side support 740a to be moved relative to shaft 825a. Thus, the position of side support 740a may be adjusted both rotationally and linearly with respect to shaft 825a.

Figure 8E:
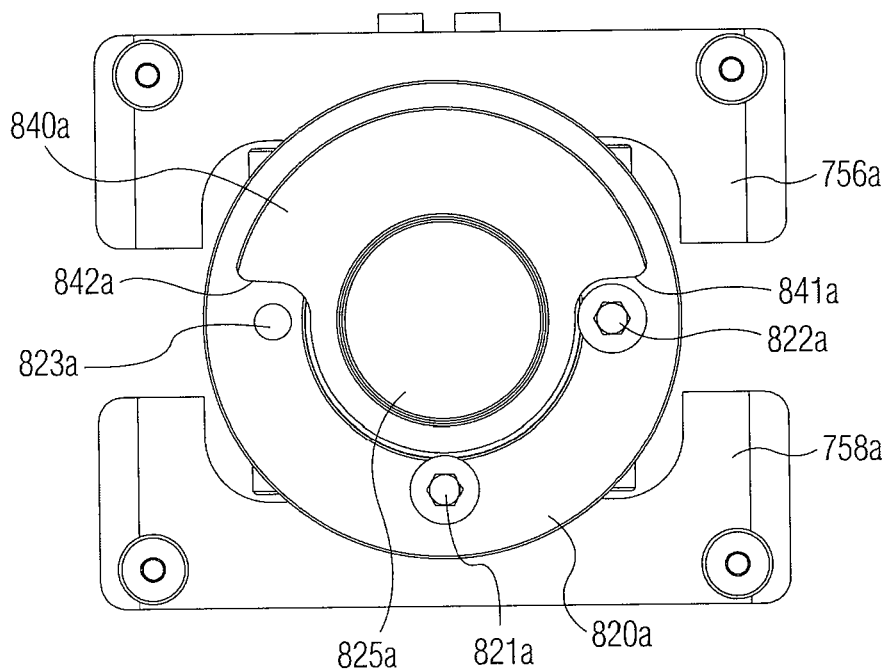
FIG. 8E is a front view of a portion of the assembly shown in FIGS. 8A and 8B.

FIG. 8E provides a front elevation of the assembly shown in FIG. 8A with side support 740a and clamp ring 830a removed. As previously described, stop unit 840a is keyed to and rotates with shaft 825a. Stop unit 840a is in front of and rotates relative to spacer 820a, which is fixed relative to tumble/theta block 755a. Screws 821a and 822a are threaded into spacer 840a, and their heads protrude in front of spacer 820a. Stop unit 840a includes a partial-circular cut away region demarcated by radial transition portions 841a and 842a. Stop unit 840a may rotate clockwise to the position illustrated where transition portion 841a contacts the head of screw 822a. Stop unit 840a may similarly rotate counter-clockwise until transition portion 842a contacts the head of screw 821a. As illustrated, transition regions 841a and 842a are approximately 180 degrees apart while screws 821a and 822a are located approximately 90 degrees apart. This results in approximately 90 degrees of rotation between the two stopped positions. The arrangement may be designed to provide other limits of rotation. The limits of rotation define the amount of tumble rotation that is provided to test head 110 when it is attached to side support 740a. As illustrated, approximately 94 degrees of rotation are provided, allowing the test head to be manipulated from a vertical plus/minus two degrees position to a horizontal plus/minus two degrees position. Other ranges of motion may be desirable and can be readily designed in. For example, if screw 821a is moved to the hole position 823a, the test head would be limited to just a few degrees of tumble motion, similar to the situation discussed in the '048 patent previously referenced.

Figure 9A:
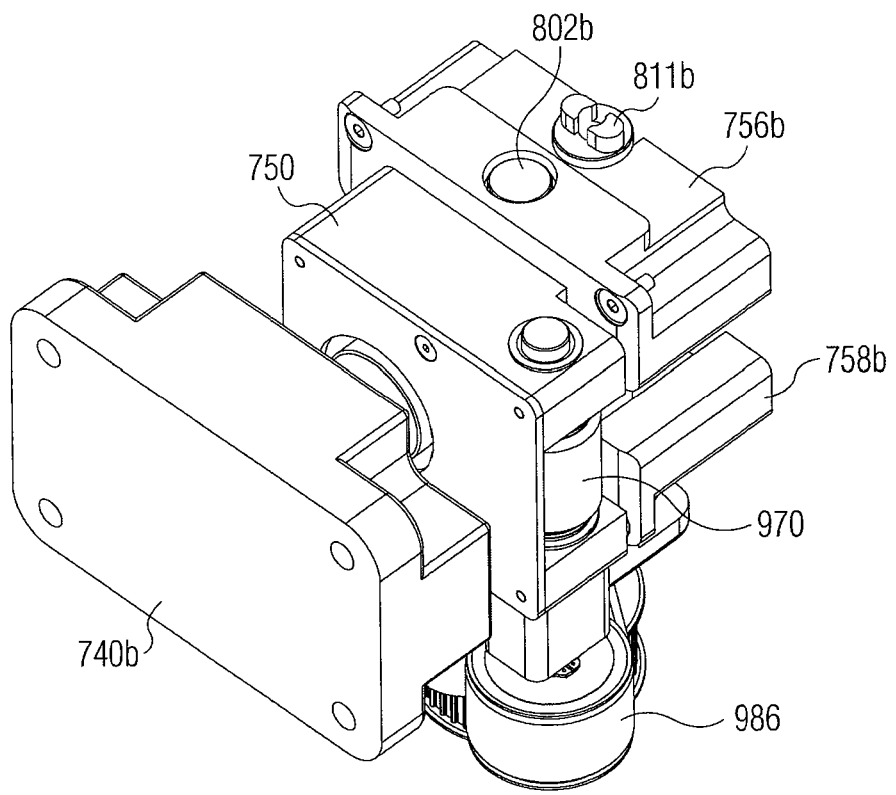
FIGS. 9A and 9B are two three-dimensional views of a theta/tumble mounting assembly including a tumble drive gear box.
Figure 9B:
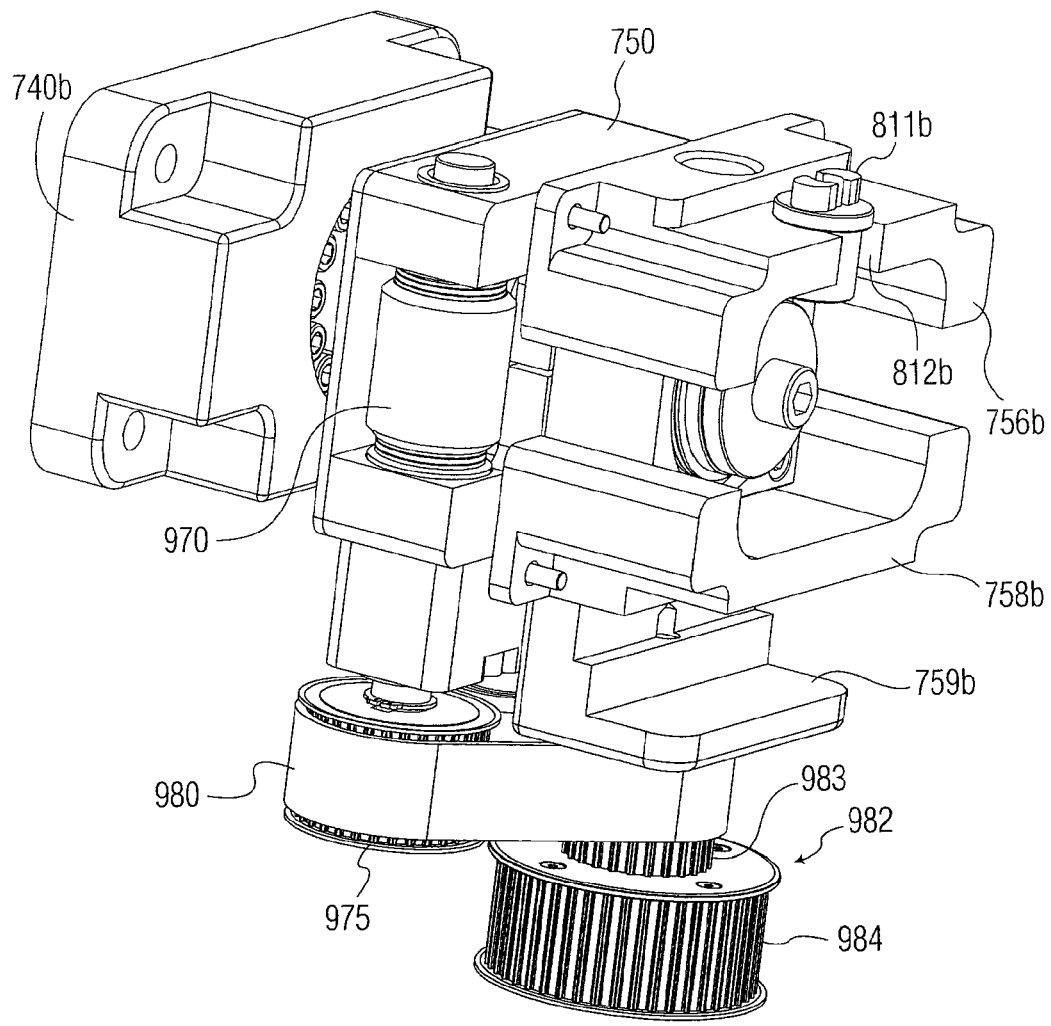
Figure 9C:
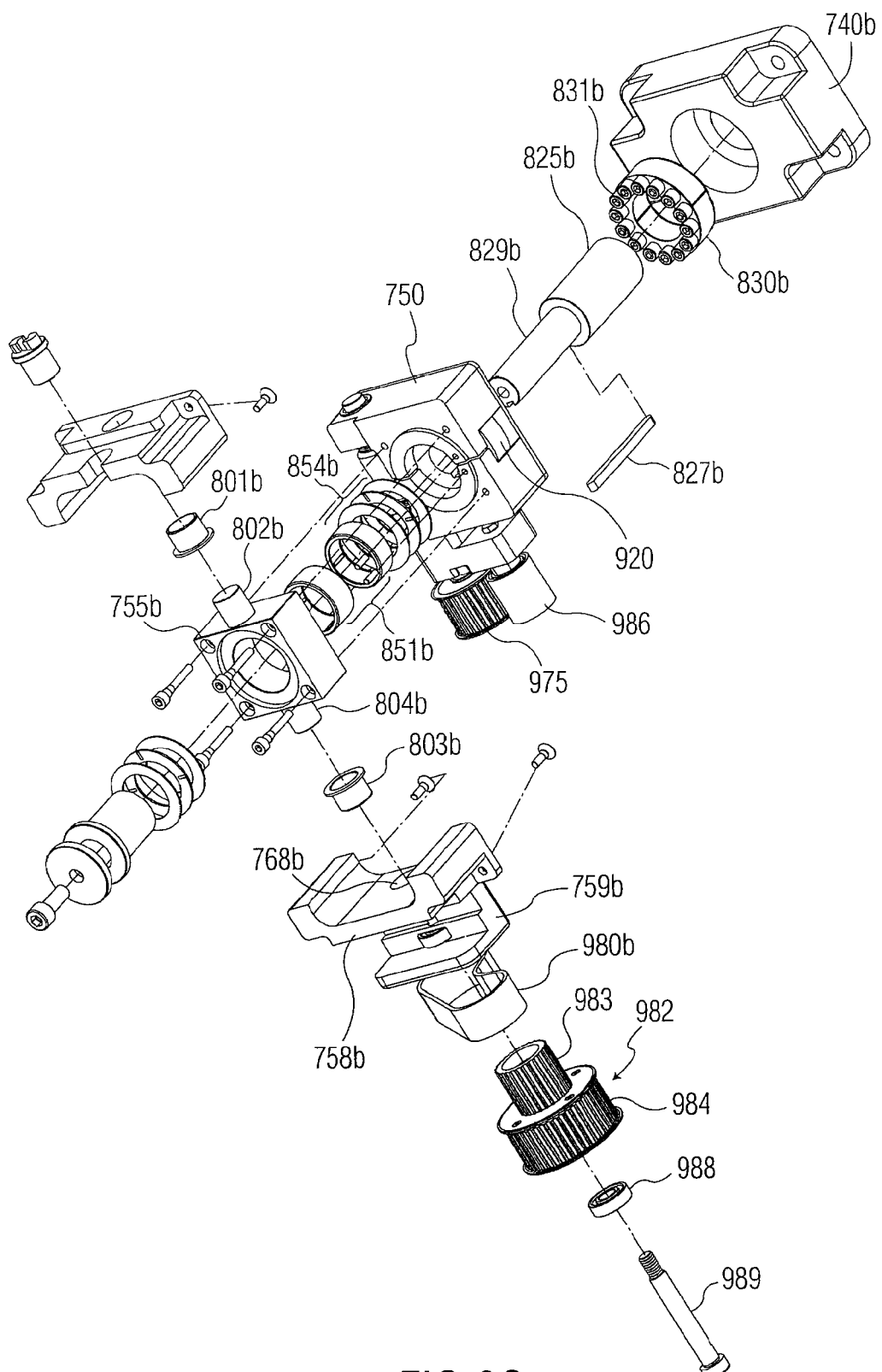
FIGS. 9C and 9D are two exploded views of the assembly shown in FIGS. 9A and 9B.
Figure 9D:
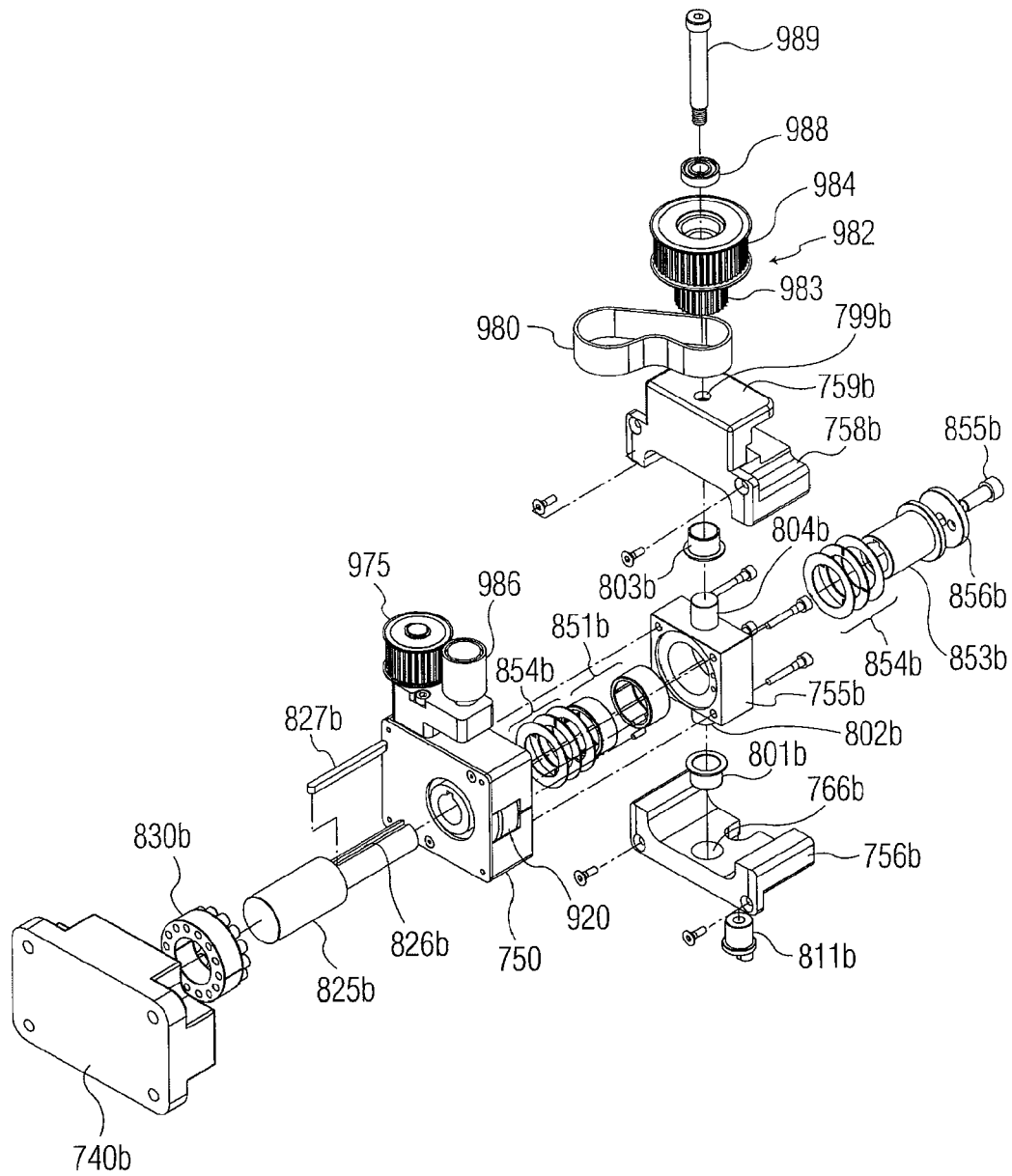

We now turn to FIGS. 9A, 9B, 9C, and 9D to describe theta carriage assembly 751b and apparatus associated with it. FIGS. 9A and 9B provide perspective views from two different angles, and FIGS. 9C and 9D provide exploded views. Many of the details are the same as previously described with respect to the other theta carriage assembly 751a and FIGS. 8A through 8D. Thus, it is only necessary to describe and discuss the significant differences between the two.

The first significant difference is that mid plate 758b used with carriage assembly 751b is more complex than mid plate 758a used with carriage assembly 751a. In particular, mid plate 758b includes extension region 759b, which includes threaded hole 799b. Stepped timing belt pulley 982 is mounted to extension region 759b by means of shoulder screw 989 which is passed through bearing 988 and received by threaded hole 799b. It is significant to note that threaded hole 799b is located so that it is coaxial with mid plate openings 766b and 768b, flange bearings 801b and 803b, and pivot journals 802b and 804b. Thus, tumble/theta block 755b and stepped timing belt pulley 982 rotate about the same axis, which is axis 202b in FIGS. 2A and 2B.

The second significant difference is that spacer 820a and stop unit 840a associated with carriage assembly 751a are not included with carriage assembly 751b. Instead of these components, gear box assembly 750 is utilized with carriage unit 751b. (Note, no gear box assembly is incorporated with carriage unit 751a). Gear box assembly 750 is attached to theta/tumble block 755b with appropriate screws. As will be explained in more detail later, gear box 750 contains worm gear 920, which is driven by worm 970. Worm 970 is coupled to timing belt pulley 975 so that rotation of pulley 975 causes rotation of worm 970, which in turn causes rotation of worm gear 920. Shaft 825b extends through worm gear 920 and is keyed to it with key 827b. Side support 740b is attached to shaft 825b using expandable clamp ring 830b in the same manner as side support 740a is attached to shaft 825a, previously described. Timing belt 980 couples inner step 983 of stepped pulley 982 to pulley 975. Idler pulley 986 engages timing belt 980 and may be adjusted to properly tension timing belt 980. Thus, rotation of pulley 982 causes rotation of pulley 975, worm gear 920, shaft 825b, and ultimately side support 740b. Side support 740b may be rigidly attached to test head 110.

Side supports 740a and 740b are attached to test head 110 such that shafts 825a and 825b are coaxial, thereby defining tumble axis 201 previously discussed. It is therefore seen that rotation of pulley 982 will cause test head 110 to be rotated about axis 201.

FIGS. 10A, 10b, and 10C illustrate the sliding attachment of a theta carriage assembly to a cradle arm. Base plate 780a is attached to the inside of cradle arm 290a with appropriate screws. Grooved linear rails 770a are attached to base plate 780a as shown with the groove of one rail 770a facing up and the groove of the other rail 770a facing down. Theta carriages 752a and 754a are attached to mid plates 756a and 758a as shown and as previously described. Theta carriage extension 730a is attached to theta carriage 754a. As is best shown in the exploded view of FIG. 10C, linear bearing assemblies 762a are attached top and bottom to theta carriages 752a and 754a so that bearings 762a are facing either upwards or downwards so as to engage the respective mating grooves of rails 770a. Thus, theta carriage assembly 751a is slidingly coupled to base plate 780a. In a similar manner, theta carriage assembly 751b is sliding coupled to base plate 780b, which is in turn attached to the inside of opposite cradle arm 290b.

When theta carriage assemblies 751a and 751b are so respectively coupled to cradle arms 290a and 290b, the common axis of pivot journals 802a and 804a defines axis 202a, previously discussed with reference to FIGS. 2A and 2B. Similarly, the common axis of pivot journals 802b and 804b defines axis 202b. As theta carriage assemblies 751a and 751b are linearly moved in opposite directions to provide "theta Y" rotation of test head 110, the distance between axes 202a and 202b changes slightly. This distance change must be accommodated in the mechanical structure. The amount of rotation is small, less than plus/minus 0.04 radians. The nominal distance between axes 202a and 202b is approximately one meter or less. It can be shown that the change in distance between axes 202a and 202b through 0.04 radians of rotation is approximately 1.6 mm. This may be accommodated by deflections of approximately 0.8 mm near the distal ends of each of the cradle arms 290a and 290b, or by allowing a slight linear play in the coupling of shafts 825a and 825b to their respective tumble/theta blocks 755a and 755b, or by a combination of both.

A locking mechanism is provided on each of the two cradle arms to enable an operator to lock test head 110 with respect to "theta Y" rotation with respect to the cradle's coordinate system 10. Lock handles 815a and 815b include threaded members (not visible), which extend through slots 291a and 291b in cradle arms 290a and 290b respectively. The threaded members further extend through slots 782a and 782b in base plates 780a and 780b respectively. Slots 291a and 291b are located generally directly above slots 782a and 782b respectively. The threaded members engage special nuts 811a and 811b, which in turn engage notches 812a and 812b in mid plates 756a and 756b respectively. Thus, by rotating lock handle 815a in a first direction will cause it to contact the upper surface of arm 290a, preventing sliding motion of theta carriage assembly 751a. Rotating lock handle 815a in the opposite direction releases the locking action. In a similar manner, sliding motion of carriage assembly 751b may be locked or unlocked by using lock handle 815b. It should be noted that with theta motion thus locked, tumble motion is not prevented.

The details regarding gear box 750 are more clearly shown in FIGS. 11A, 11B, 12A, and 12B. Refer also to FIGS. 9A, 9B, 9C, and 9D. Again, as shown, worm gear 920 is included. Worm gear 920 may be placed in opening 961 of housing 960 so that it is between cover plate 950 and housing 960. Worm gear 920 is mounted on and keyed to shaft 825b (FIGS. 9A, 9b, 9C, and 9D), which passes through opening 921. Thus, shaft 825b, which is supported by bearings within tumble/theta block 755b, supports worm gear 920. That is, worm gear 920 fits within opening 961, but is not in contact with or supported by housing 960.

Upper housing block 965 is attached to housing 960 with appropriate fasteners. Worm 970 abuts against and meshes with worm gear 920. Worm 970 is keyed to shaft 977 with key 971. Shaft 971 extends through flange bushings 973 inserted into openings in arms 969 of housing 960 and upper housing block 965. An appropriate timing belt pulley 975 may be keyed to shaft 977 with key 976 to facilitate rotation of worm 970. Rotation of worm 970, in turn, causes rotation of worm gear 920. As worm gear 920 rotates, shaft 825b (shown in FIGS. 9C and 9D) rotates. As shaft 825b rotates, side support 740b rotates. In this manner, test head 110 rotates.

Worm 970 is coupled to pulley 975 by means of shaft 977. Rotation of pulley 975 causes rotation of worm 970. Pulley 975 rotates through the movement of timing belt 980. See FIG. 9B. Belt 980 is moved by the rotation of pulley 982. As will be described in more detail subsequently, pulley 982 is rotated by turning tumble drive handle 995 so that shaft 990 rotates.

Idler pulley 986 is mounted to upper housing block 965 by means of bearing block 982 and appropriate bearings (not visible). Bearing block 982 is attached to upper housing block 965 by means of screw 987. The axis 1901 of screw 987 is apart from (that is, not coaxial with) axis 1902 of idler pulley 986. Thus, when screw 987 is loosened, axis 1902 of idler 986 may be rotated about screw axis 1901. In this way, the periphery of idler 986 may be moved closer to or further from the periphery of pulley 975. This feature may be used to adjust the tension in timing belt 980. For example, idler 986 is first moved away from pulley 975. Timing belt 980 is then installed. Idler 986 is then moved closer to pulley 975, pressing against timing belt 980 and tensioning it. When the tension is appropriately adjusted, screw 987 may be securely tightened. It is seen that as tumble theta block 755b pivots about its axis defined by pivot journals 802b and 804b, gear box 750 rotates with it. Because stepped pulley 982 is coaxial with the pivot axis, the distance between gear 982 and pulley 975 remains constant as gear box 750 pivots. Thus, the proper tension in belt 980 will also desirably remain constant as gear box 750 pivots.

FIG. 12A provides a side view of gear box 750, defining the location of vertical section B-B. Sectional view B-B is provided in FIG. 12B. It has already been described how worm 970 is attached to shaft 977 which passes through flange bushings 973 in openings contained in arms 969 of housing 960. Thus, worm 970 is fitted between arms 969 of housing 960. Worm 970 is separated from arms 969 by two stacks of Belleville washers 979 (also known as cupped spring washers; see http://en.wikipedia.org/wiki/Belleville washer for more details) that are inserted onto shaft 977. The stacks of Belleville washers are arranged to form two compression springs between worm 970 and arms 969, allowing worm 970 to be linearly movable toward either of the two arms 969. In forming the springs, the washers 979 are stacked with cups facing in alternating directions. The two stacks contain equal numbers of washers. When gear box 750 is assembled, both stacks are partially compressed. Thus, each stack exerts nominally the same force on worm 970, nominally positioning it centrally between arms 969. With test head 110 driven to a desired tumble angle, an external force applied to test head 110 may cause a moment about tumble axis 201. Test head 110 may rotate about the tumble axis slightly in response to such an external force. In particular the external force causes shafts 825a and 825b to attempt to rotate. Worm gear 920 thus attempts to rotate; in doing so it exerts a force on worm 970 in its axial direction. Because the gear ratio between worm gear 920 and worm 970 is such that back driving is prevented, worm 970 is urged in a linear direction along its axis. This causes one of the two stacks of Belleville washers to contract and the other to expand. Motion may continue until the contracting stack has completely flattened (that is, bottomed out). When the external force is removed, worm 970 is urged back to its nominal central position by the contracted Belleville washer stack which defines a biasing assembly. Thus, compliance about the tumble axis is provided.

With the aid of FIGS. 13A, 13B, 14A and 14B, the coupling of tumble drive handles 280a and 280b to gear box 750 is described. FIG. 13A provides an oblique view of the interior of assembled cradle arm 290b, which includes tumble-drive handles 280a and 280b. FIG. 13B shows tumble-control-side carriage extension assembly 1400 exploded away from the interior of cradle arm 290b. Also, to provide some visibility, upper lip 2901b of arm 290b has also been exploded away. FIGS. 14A and 14B provide more detailed views of carriage extension assembly 1400.

Tumble drive handles 280a and 280b are keyed to shaft 1910 which passes through a hole or channel in structural block 1925. Appropriate bearings, for example bearing 1926, are utilized so that shaft 1910 may rotate freely. Timing belt pulley 1915 is also keyed to shaft 1910. Long timing belt 1980 is shown coupling pulley 1915 to outer step 984 of stepped pulley 982. (The coupling of inner step 983 of stepped pulley 982 to pulley 975 and worm 970 has been previously described.) Thus, rotation of either tumble drive handle 280a or 280b causes rotation of shaft 1910 and pulley 1915 (as well as the other tumble drive handle). This rotation is coupled to stepped pulley 982 by means of long timing belt 1980 and subsequently, by means previously described, to worm 970 and worm gear 920, shaft 825b, side coupling 740b, and, finally, test head 110.

Structural block 1925 is secured to theta carriage extension 730b by means of screws 1945, which pass through slots 1946 in carriage extension 730b. Tensioning block 1940 is also secured to extension carriage 730b with screws 1947. Adjustment bolt 1941 is threaded through a tapped through-hole in tensioning block 1940. The head of adjustment bolt 1941 bears against structural block 1925. Check nut 1942 is provided, and it may be tightened against tensioning block 1940 to maintain adjustment bolt 1941 in a desired position. Thus, the tension in timing belt 1980 may be adjusted by first loosening check nut 1942 and screws 1945. Tensioning bolt 1941 may then be rotated so that its head motion causes shaft 1910 to move inwards or outwards, thus loosening or tightening belt 1980 respectively. When the desired tension is achieved, screws 1945 and check nut 1942 are securely tightened.

It is noted that because structural block 1925 is attached to theta extension carriage 730*b* that the two move as a single unit when the theta Y orientation of test head 110 is adjusted. Consequently, the distance between pulley 1950 and stepped pulley 982 remains constant throughout theta Y motion, maintaining a constant tension in timing belt 1980.

It is noted that the tumble drive mechanism includes four pulley wheels and two drive belts in addition to a worm and worm gear. The ratios of pulley wheel diameters to one another as well as the gear ration between the worm and worm gear are selected so that tumble drive handles are easy for an operator to turn while requiring a reasonably small number of full turns to move test head 110 through its approximate 90 degrees of motion. Of course, the sizes and costs of the various components is also a consideration in their specification and selection.

Extension carriage assembly 1400 also includes linear bearings 1921 and 1922, which are attached to structural block 1925. Linear bearings 1921 and 1922 engage linear rails 1923 and 1924, which may be secured to the inner wall of cradle arm 290*b*. Thus, when carriage assembly 1400 is moved inwards or outwards (for example during a theta Y adjustment of test head 110), linear bearings 1921 and 1922 glide along rails 1923 and 1924. This arrangement may provide structural support for the tumble drive mechanism just described. In particular, carriage extension 730*b* may be constructed of a lightweight material that may be subject to twisting or buckling under the forces imposed by the tension in long timing belt 1980 and/or the rotation of tumble-drive handles 280*a* and 280*b*. Inclusion of linear bearings 1921 and 1922 and rails 1923 and 1924 may mitigate the effects of such forces. In an exemplary embodiment of the invention, such bearings and rails are not incorporated in conjunction with the other carriage extension 730*a*, which does not have an associated tumble drive mechanism.

We now return attention to the theta drive mechanism. The apparatus that enables an operator to rotate test head 110 about a Y axis through the rotation of, for example, theta drive handle 270*b* has been described in detail. The ultimate limit in such theta motion is defined when one of or both tumble/theta blocks 755*a* and 755*b* contacts a theta carriage 752*a*, 754*a*, 752*a*, and/or 754*b* respectively. However, this may not be a desirable situation, because to achieve such a position one of springs 710*a*, 714*a*, 710*b*, and 714*b* must be fully compressed to drive the tumble theta block into such contact. Thus, there would be no "wiggle room" or compliance available for subsequent maneuvers, such as docking. Thus, it may be desirable in certain applications to put limits on how much rotation from the zero position (that is, where axis 201 if parallel to the X axis) can be provided by rotating a theta drive handle 270*a* or 270*b*. This, in turn, is desirably an amount that does not cause any compression of springs 710*a*, 714*a*, 710*b*, and 714*b* and leaves enough rotation space available for compliant motion against the full range of available compression/extension of springs 710*a*, 714*a*, 710*b*, and 714*b*.

FIGS. 15A, 15B, and 15C illustrate a theta-drive stop mechanism that provides such a theta drive limit. This mechanism may be optionally included depending upon circumstances. FIG. 15A shows the interior of cradle arm 290*b* with extension carriage 1400 and upper lip 2901*b* removed. FIG. 15B shows a close up of particular features of interest. FIGS. 15A and 15B have been derived from the exploded view of FIG. 13B. Visible in FIG. 15A are pillow block 630*b*, shaft 250*b*, coupling 255*b*, threaded member 260*b*, nut 702*b*, cylindrical nut extension 704*b*, springs 710*b* and 714*b*, and anti-rotation block 716*b*, all having been described earlier. Also, as described previously, as theta drive handle 270*b* and shaft 250*b* are rotated, cylindrical nut extension 704*b* moves linearly inwards and outwards. In order to limit the amount of theta motion that is available by rotation of a theta drive handle 270*b* (or 270*a*), stop block 1300 and stop screw 1310 are provided. (Stop screw 1310 is also indicated in FIG. 3B.) Stop screw 1310 is a socket head cap screw that is threaded into a tapped hole in the surface of nut extension 704*b*. In FIG. 15B, a portion of the head of screw 1310 is visible. Screw 1310 and the hole that it is threaded into are orientated so that the axis of screw 1310 is perpendicular to the inside wall of cradle arm 290*b*. Stop block 1300 is shown in more detail in FIG. 15C, and it is attached with bolts and nuts to the inner wall of cradle arm 290*b* such that stop slot 1305 may receive the head of screw 1310 and such that slot 1305 is parallel to the axis of travel of nut extension 704*b*. Thus, the linear travel of nut extension 704*b* is limited to the length of slot 1305 minus the diameter of the head of screw 1310. The length of slot 1310 is thusly designed to correspond to the maximum amount of drivable theta motion desired in the system. Stepped slots 1307 are provided in stop block 1300 to facilitate adjustable mounting. Mounting hex nuts are captured in stepped slots 1307 and corresponding bolts extend through holes in the side of cradle arm 290*b*. Thus, stop block 1300 may be adjusted inwards and outwards by loosening the bolts, and fixed in a desirable position by tightening the bolts.

FIGS. 1A through 15C have thus described the components located within cradle 200 corresponding to an exemplary embodiment of the invention. There are three minor variations to this embodiment which thus far may not have been described.

The first variation concerns the theta lock handles. Theta lock handles 815*a* and 815*b* may be round as shown, for example, in FIGS. 10A, 13B, and 15A or "L"-shaped as illustrated, for example, in FIGS. 1A through 2B. Other shapes may also be used as well. The particular shape may be selected in accordance with the preferences of particular users of the equipment.

The second variation concerns the inclusion of auxiliary handle 2910, which is included in FIGS. 13A, 13B, and 15A. Auxiliary handle 2910 is provided for the use of operators in manually positioning test head 110. It is accordingly an option. Its presence and location are determined by particular user requirements.

The third variation concerns the number of theta drive handles. FIGS. 1A through 4A all show cradle 200 having two theta drive handles 270*a* and 270*b*. However, it was shown and discussed that only one theta drive handle is necessary. Thus, FIG. 16 illustrates a cradle 200 having a single theta drive handle 270*b*. Slot 690*a* is devoid of a theta drive handle in comparison to the other embodiments studied. The shaft that would connect to a drive handle has been shortened so that it does not extend through slot 690*a*. Obviously, slot 690*a* could also be eliminated.

As yet another item to be emphasized, compliance in tumble and theta degrees of freedom has been discussed. However, due to springs 710*a*, 710*b*, 714*a*, and 714*b* compliance in the "In-Out" degree of freedom is also provided. Thus, if test head 110 is pushed "Out" towards the closed end of cradle 200, springs 710*a* and 710*b* would compress, providing linear motion compliance. Similarly, if test head 110 is pushed "In" towards the open end of cradle 200, springs 714*a* and 714*b* would compress, again providing linear motion compliance. Thus, the invention provides driven motion in two degrees of freedom and compliance in three degrees of freedom.

Still another point to be made is that although the illustrated embodiment uses handles to allow manual positioning of a test head in theta Y and Tumble degrees of freedom, it is also feasible to substitute motors or other contrivances for the handles. In this way an operator could manipulate the test head in these axes by push button control. Further, with the addition of a controller or a control computer, test head manipulation could thus be automated.

Referring to FIGS. 17A through 19J, a cradle 1200 that is an alternative embodiment of the invention will be described. Cradle 1200 is similar to cradle 200 previously described above. Both cradles 200 and 1200 provide theta (or yaw), tumble (or pitch), and in-out compliance, which allow relatively small external forces to simultaneously adjust (or fine tune) the position of the load in those three degrees of freedom. Cradle 1200 is configured to provide tumble motion over a smaller range compared to the tumble motion range of cradle 200.

As shown in FIG. 17A, cradle 1200 has essentially the same cradle shape and structure as cradle 200, which may be scaled as appropriate to a specific situation. This shape facilitates room for cables and cooling ducts as the test head in maneuvered through its motion envelope. Further, theta drive handles 1270a and 1270b, shafts 1250a and 1250b, belt 1222 and associated hardware are of the same design, function and purpose as theta drive handles 270a and 270b, shafts 250a and 250b, and belt 222 described previously with respect to the first embodiment.

In the present embodiment, cradle arms 1290a and 1290b, see FIGS. 17A and 17B, include square tubing members 1291a and 1291b for reinforcement. Additionally, bearing blocks 1631a and 1631b, which are secured to cradle arms 1290a and 1290b respectively, have been added for providing additional support to shafts 1250a and 1250b, respectively. This additional support is necessitated by other design differences between the two embodiments, which will be described later.

Cradle arms 1290a and 1290b include openings 1293a and 1293b near these distal ends. These may be covered by removable covers 1292a and 1292b respectively. FIG. 17A shows cover 1292b installed to cover opening 1293b, which is thus not visible. FIG. 17B, however, shows cover 1292a separated from arm 1290a, exposing opening 1291b. Opening 1291b and what lies behind it is shown in closer detail in FIG. 17C. The rear of carriage plate 1750a is thus visible. FIG. 17C will be returned to later in conjunction with a discussion about carriage assembly 1751a and carriage assembly 1751b. The details visible through opening 1293b in arm 1290b are essentially the same and will not be described in any amount of detail.

FIG. 17D shows more clearly the details of the connection between theta drive handle 1270a and carriage assembly 1751a (which will be described in more detail later). In forming this figure, the cradle structure has been removed from view for clarity. Thus, as previously described with respect to FIGS. 3A through 5, theta drive handle 1270a is attached to shaft 1250a, which is coupled via flexible coupling 1255a to threaded shaft 1260a. Threaded shaft 1260a is threaded into cylindrical nut 1702a, which is rigidly attached to hollowed cylindrical nut extension 1704a. Cylindrical nut extension 1704a is of the same type as the previously described nut extensions 704a and 704b. In particular, it includes extension member 1706b having a threaded portion 1708a at its distal end. These are not shown in FIG. 17D, but are the same as items 706b and 708b in FIG. 5.

Also, similar to the previously described embodiment, shaft 1250a is coupled to crisscrossed belt 1222, which is in turn similarly coupled to shaft 1250b, associated with cradle arm 1290b. Thus, as previously described with respect to the first embodiment, rotation of shaft 1250a in a first direction causes rotation of shaft 1250b in the opposite direction and vice versa.

Shaft 1250a is supported by pillow block 1630a, which is configured to prevent linear motion of shaft 1250a along its axis of rotation; however, in contrast to the first embodiment, additional bearing block 1631a has been added to provide additional support. In relation to the first embodiment, large carriage extension 730a has been removed and functionally replaced by carriage connector 1730a. Whereas carriage extension 730a of the first embodiment provides structural support for shaft 1250a and it associated apparatus, connector 1730a provides less support. Thus, bearing block 1631a is included to provide the needed support.

The connection between nut extension 1704a and carriage assembly 1751a is now described. First, referring to FIGS. 18A and 18B, carriage assembly 1751a includes base plate 1780a, which may be attached to the inside of cradle arm 1290a by suitable screws 1294a (FIG. 17B). When base plate 1780a is so installed, its included opening 1781a aligns with arm opening 1293a. Carriage plate 1750a is slidingly coupled to base plate 1780a by means of linear bearing assemblies 1760a.

Referring to FIG. 17D, right angle member 1722a is connected to machined recess 1537a in carriage plate 1750a with suitable screws or the like. Carriage connector 1730a is formed from a suitable material such as steel and has opposing right angle sections 1723a and 1724a at each end formed by bending or other suitable means. Right angle section 1723a is attached to right angle member 1722a by suitable means such as screws. Right angle section 1724a includes a hole somewhat larger in diameter than extension member 1706a, which extends from nut extension 1704a. Right angle member 1716a includes a hole tapped to receive threaded end 1708a of extension member 1706a. Right angle section 1724a is compliantly assembled to extension member 1706a as follows. First, compression spring 1710a is fitted over extension member 1706a followed by right angle section 1724a, which is in turn followed by second compression spring 1714a, thereby providing a biasing assembly. Right angle member 1716a is next held adjacent to the inside of carriage connector 1730a, and threaded end 1708a of extension member 1706a is screwed into its tapped hole, desirably causing springs 1710a and 1714a to compress. Lock nut 1720, in combination with a suitable washer, is then tightened onto the end of threaded end 1708a, preventing rotation of nut 1702a and nut extension 1704a from rotating. Right angle member 1716a is not fixed to carriage connector 1730a and may move relative to it. Accordingly, with nut 1702a in a fixed position, carriage plate 1750a may be moved linearly a small amount by an external force acting against springs 1710a and 1714a, providing compliance. The amount of compliance in terms of force and distance being determined by the characteristics selected for springs 1710a and 1714a for the particular application. Additionally, and in a similar fashion to the first embodiment, rotation of shaft 1250a causes nut 1702a to move linearly along threaded shaft 1260a, which in turn causes carriage plate 1750a to move linearly along the path defined by rails 1770a. While not shown, the present embodiment may include a theta-drive stop mechanism as previously described with respect to the first embodiment (FIGS. 15A through 15C). Such a stop mechanism may, of course, be optionally included, depending upon circumstances.

A similar mechanism to that just described is provided on cradle arm 1290b for providing driven and compliant linear motion of carriage plate 1750b associated with carriage assembly 1751b. Further description, therefore, is not necessary.

Just as in the first embodiment, a test head may be held within cradle 1200 by securing its sides to side supports 1740a and 1740b, which are included in carriage assemblies 1751a and 1751b, respectively. Rotation of either of theta drive handles 1270a and 1270b causes carriage plates 1750a and 1750b to move linearly in opposite directions along paths determined by linear rails 1770a and 1770b, which are also included in carriage assemblies 1751a and 1751b, thus providing theta motion in positioning the supported load. Also as in the first embodiment, due to the compliant nature of the coupling between nut extensions 1704a and 1704b and respective carriage plates 1750a and 1750b, compliance in the theta and in-out degrees of freedom is provided.

Also, as will be described below, carriage assemblies 1751a and 1751b include spherical bearings to provide rotational degrees of freedom to side supports 1740a and 1740b to allow tumble and theta motion of the supported load.

Referring to FIGS. 18A through 18C as well as FIG. 17C, carriage assembly 1751a, which includes carriage plate 1750a, is further described. As stated above, carriage assembly 1751a includes base plate 1780a, which may be attached to the inside of cradle arm 1290a by suitable screws 1294a (FIG. 17B). In the figures, carriage plate 1750a is shown at approximately the center of its range of linear travel. Previously described right angle member 1722a may be connected to machined recess 1537a in carriage plate 1750a with suitable screws. Carriage plate 1750a also includes machined recesses 1535a and 1536a, but these are not used in carriage assembly 1751a. This is because carriage plate 1750a has been designed for multiple applications, some of which may require these additional recesses.

Referring again to FIGS. 18B and 18C, stepped tumble shaft 1510a (shown in detail in FIG. 19J) is fitted into counterbored opening 1535 in side support 1740a such that shaft head 1514a is nominally slightly below surface 1536. This is a slip fit allowing shaft 1510a to move slightly with respect to side support 1740a, thus providing adjustment for sight variations in the widths of supported loads. Large diameter portion 1513a of stepped tumble shaft 1510a is longer than side support 1740a is thick, so that step 1512a will be a distance away from the rear of side support 1740a. Spherical bearing unit 1520a is press fitted into opening 1522a of base plate 1750a. Spherical bearing unit 1520a includes opening 1521a, which receives small diameter end 1511a of stepped tumble shaft 1510a. Thus, stepped tumble shaft 1510a may be inserted into bearing unit 1520a to the depth determined by the location of step 1512a. When fully inserted, the end 1516a of stepped tumble shaft 1510a does not extend outside of spherical bearing unit 1520a. Stepped shaft 1510a may then be secured in place with washer 1518a and socket-head cap screw 1517a, accessible through openings 1293a in arm 1290a and 1781a in base plate 1780a. This arrangement serves to secure side support 1740a securely to carriage plate 1750a in a manner that allows side support 1740a to rotate in three degrees of freedom relative to carriage plate 1750a. Notice that once the load is secured to both side supports 1740a and 1740b, one of these degrees of freedom will become constrained.

Load attachment screws may be passed through two circular through-holes 1534a and two slotted through-holes 1533a in side support 1740a in order to fasten the load to side support 1740a. Slotted through-holes 1533a are included to simplify the task of manually aligning the cradle 1200 to a heavy and awkward load. Side support 1740a may be positioned so that the four through-holes 1533a and 1533b are aligned with four relatively large through holes 1538a in carriage plate 1740a, thus enabling access through openings 1293a in arm 1290a and 1781a in base plate 1780a.

As shown, side support 1740a includes step 1741a having step surface 1532a. Step surface 1532a is located at approximately the center of stepped tumble shaft 1510a. Lock block 1575a includes constant-radius cutout 1574a, which desirably may be slightly less than, but no more than a semicircle and having a radius substantially the same as the radius of the large diameter portion 1513a of tumble shaft 1510a. Lock block 1575a is installed so that the surface of cutout 1574a is in contact with the exposed area of large diameter portion 1513a of stepped tumble shaft 1510a and fastened in place to step surface 1532a with screws 1571a. Desirably the dimensions are arranged so that nominally there is a small gap between step surface 1532a and lock block 1575a that is narrowed as screws 1571a draw the two together. In this manner side support 1740a and its attached load become locked to stepped tumble shaft 1510a, preventing rotational movement of one relative to the other and also preventing linear motion of side support 1740a along the length of stepped tumble shaft 1510a.

Referring to FIGS. 19A through 19J, a description of carriage assembly 1751b, which includes a mechanism for adjusting a position of rotation about a tumble axis and allowing compliance, will be described. Approximately +/−2.8 degrees of manually (or mechanized) adjustment is provided. Also, approximately +/−1.5 degrees of compliant tumble motion (driven by an external force) is also provided.

FIG. 19B shows carriage assembly 1751b partially exploded into three major subassemblies: basic carriage 1592, side support unit 1594, and tumble adjuster 1596.

Basic carriage 1592 includes base plate 1770b, carriage plate 1750b, linear rails 1770b and linear bearing assemblies 1760b, which are the same as and have the same functions as their counterparts 1770a, 1759a, 1770a, and 1760a that are included in the previously described carriage assembly 1751a.

Side support unit 1594 includes side support 1740b, which is similar to side support 1740a. In particular, it includes through-holes 1534b and slotted through-holes 1533b, arranged in a similar pattern as their counterparts 1534a and 1533a respectively are arranged on side support 1740a. Appropriate screws passed through these holes attach one side of the load to side support 1740b as previously described with respect to side support 1740a. However, whereas, side support 1740a of carriage assembly 1751a includes a step located at approximately the center of hole 1535a, side support 1740b includes a narrow flange 1742b at its lower edge. Also included in unit 1594 is stepped shaft 1510b, which is shown in detail in FIG. 19J. Stepped shaft 1510b includes two features not included in stepped shaft 1510a. These are precisely machined press fit region 1508b and retaining ring grove 1509b. Stepped shaft 1510b is press fitted into hole 1535b of side support 1740b (FIGS. 19C and 19D) by means of region 1508b.

Tumble mechanism 1596 includes knob 1550 that an operator may turn to make small adjustments to the rotation of the load about the tumble axis in order to nominally planarize the load with respect to another apparatus. It also provides compliance so that a force acting directly on the load may rotate it about the same tumble axis.

Tumble mechanism 1596 includes compliance block 1570, which includes opening 1572. IGUS flange bearing 1579 is press fit into opening 1572. Step shaft 1510b may be inserted into bearing 1579 so that the portion of large diameter section 1513b that extends out of side support 1740b is fitted into bearing 1579. Compliance block 1579 and side support 1740b may thus be rotatably coupled in close proximity to one another. A retaining lock ring (not shown for clarity) may be inserted into groove 1509b in large diameter portion 1513b that extends beyond compliance block 1572 to hold the two units together.

The foregoing assembly comprising tumble mechanism 1596 coupled to side support unit 1594 may be rotatably coupled to basic carriage 1592. To do so, small diameter portion 1511b of stepped shaft 1510b is inserted into opening 1521b of spherical bearing 1520b, which is fitted into carriage plate 1780b.

Thus, stepped tumble shaft 1510b may be inserted into bearing unit 1520b to the depth determined by the location of step 1512b. When fully inserted, the end 1516b of stepped tumble shaft 1510b does not extend outside of spherical bearing unit 1520b. Stepped shaft 1510b may then be secured in place with washer 1518b and socket-head cap screw 1517b, accessible through openings 1293b in arm 1290b and 1781b in base plate 1780b. This arrangement serves to secure side support 1740b securely to carriage plate 1750b in a manner, which allows side support 1740b to rotate in three degrees of freedom relative to carriage plate 1750b. Notice that once the load is secured to both side supports 1740a and 1740b, one of these degrees of freedom will become constrained.

Two pins 1573 are fitted to receiving holes in compliance block 1570. These pins 1573 engage slots 1782b in carriage plate 1780b. Slots 1782b are parallel to rails 1770b. The width of slots 1782b is merely a few thousandths of an inch greater than the diameter of pins 1573. Thus, compliance block 1570 is prevented from rotating about axis 1201 but is free to rotate about axis 1202b (see FIGS. 17A and 17B).

Socket-head setscrew 1571 may be threaded into through hole 15711 in compliance block 1570 such that the socket head faces carriage plate 1780b. Setscrew 1571 may be tightened against side support 1740a, thus serving to lock side support 1740a from rotating relative to compliance block 1570 and carriage plate 1750a. Through hole 15711 is aligned with slot 1781, which passes through carriage plate 1750b. Thus, a user can access setscrew 1571 with an appropriate Allen wrench through the access provided by arm opening 1293b and the corresponding opening in base plate 1780b. It is contemplated that an extended length screw would pass through carriage plate 1750a, base plate 1780a and a suitable opening in arm 1290b. Such an extended length screw could have a handle or other actuator attached to it to operate the screw as a locking device.

When a load is coupled between side plates 1740a and 1740b such that side plates 1740a and 1740b are parallel with one another, the axes of stepped shafts 1510a and 1510b will preferably be aligned, defining axis 1201 (FIG. 17A). Compliance block 1570, which is not allowed to rotate about axis 1201 due to the interaction of pins 1573 with carriage plate 1750b, limits the amount that side plate 1740b (and hence the attached load) may rotate due to its interaction with flange 1742b. This interaction is constrained by the control and compliance apparatus, which will be discussed in the following paragraphs and with the aid of exploded views in FIGS. 19B through 19D and the cross section view in FIG. 19I.

Two holes 1599a and 1599b are formed in compliance block 1570. Each has an upper portion 1571, which is threaded. Each also has a lower portion 1572, which is not threaded and having larger diameter. Threaded end 1551 of adjustment shaft 1555 is threaded into first threaded hole 1599a. Drive gear 1562a is attached to adjustment shaft 1555 with a setscrew that engages flat 1552. Knob 1550 (or other suitable handle or actuator) is attached to the distal end of shaft 1555 to allow an operator to screw shaft 1555 inwards or outwards with respect to compliance block 1570. Similarly, driven follower shaft 1558 has threaded end 1559 threaded into threaded upper portion 1571 of hole 1599b. Also gear 1562d is secured to shaft 1558 with a suitable setscrew at flat 1557. Intermediate idler gears 1562b and 1562c are mounted to compliance block with shoulder screws 1561 as shown. Idler gears 1562b and 1562c may freely rotate about their respective shoulder screws 1561. The four gears 1562a through 1562d are arranged so that rotation of adjustment shaft 1555 in a first direction causes rotation of driven follower shaft 1558 in the opposite direction. Thus, as adjustment screw 1555 is screwed inwards into compliance block 1570, driven follower screw 1558 is screwed outwards, and vice versa. Of course, as the screws move linearly, drive gear 1562a and driven gear 1562b also move linearly with them. However, the amount of linear motion required is relatively small, and both will stay in mesh with their respective idler gears 1562b and 1562c.

Flanged, threaded compression inserts 1574 are inserted into the lower, unthreaded portion 1572 of holes 1599a and 1599b. Inserts 1574 are sized so that they may move relatively freely within holes 1599a and 1599b. The details of inserts 1574 are shown in FIG. 19H. Each may be formed from a solid piece of material, preferably metal, by turning a cylindrical body 15742 of a diameter compatible with a sliding fit within hole portion 1572, and a flange portion 1575 of a diameter larger than hole portion 1572. As will be described below, flange portion 1575 will interact with Bellville washers 1576 and preferably should be approximately the same diameter. Threaded hole 15744 is drilled and tapped from the flange end to a depth that leaves a solid, flat end 15741. The length of inserts 1574 is such that when adjustment screw 1555 and driven follower screw 1558 are both inserted equal amounts into compliance block 1570, flat ends 15744 will be in contact with their respective screws 1555, 1558 and their flanges will be at a distance from the lower surface of compliance block 1570.

Two counter-bored, slotted holes 1744b are included in flange 1742b of side support 1740. Slotted holes 1744b are aligned with compliance-block holes 1599a and 1599b. Slotted holes 1744b are oriented so that their slots are perpendicular to the axis of stepped screw 1510; that is, the slots are perpendicular to tumble axis or rotation 1202. A spherical swivel washer 1578 set is placed at each counter-bored hole with the spherical surface facing the flat counter bore. A stack of Bellville spring washers 1576, arranged to form a compression spring is placed between each swivel washer 1578 and the flange of its respective compression insert 1574, thereby providing a biasing assembly. Shoulder screws 1580 are inserted through slotted holes 1744b, pass through the stack of swivel washers 1578 and Bellville washers 1576, and threaded into their respective threaded holes 15744 of inserts 1574 so that their shoulders are tight against their respective flanges 1575.

When properly assembled, Bellville washer stacks 1576 are in equal compression between their respective spherical swivel washers 1578 and respective insert 1574 flanges 1575 with screws 1555 and 1558 inserted to equal depths. In this nominal position flange 1742b of side support 1740b should nominally be parallel to arm 1290b and rails 1770b. A force applied to a load coupled to side support 1740b in a direction to cause a moment about axis 1202 will cause the load to rotate about axis 1202. As it does so, one Bellville washer set will compress while the other set expands. When the force is removed, the imbalance between the two washer sets (which act as compression springs) will urge the system back towards its nominal position. Thus, the system posses a compliant characteristic in that it allows an external force to move the load as well as a resilient characteristic in that the load tends to return to a nominal position when the force is removed. In practice, when a load is installed between the two side supports 1740a and 1740b, its center of gravity will be displaced somewhat from axis 1202, causing a moment about axis 1202 rotating the load away from a desired orientation. By rotating knob 1550 an operator can adjust the forces on the Bellville washer stacks, moving the load back to a desired position. In other cases, the load's center of gravity may be reasonably coincident with axis 1202; here an operator may again adjust the position of the load by rotating know 1755.

Referring to FIGS. 20A through 25A, cradle 2200 that is a third embodiment of the invention will be described. As in the previous embodiments, cradle 2200 includes opposed arms 2290a and 2290b joined by a rear portion 2209. Cradle 220 provides driven tumble motion of approximately plus/minus 90 degrees combined with tumble compliance of plus/minus approximately two or three degrees. This is combined with a driven theta adjustment and theta compliance of plus/minus approximately three degrees and in-out compliance of plus/minus approximately five mm. Thus, at the rear of the cradle are theta drive handles 2270a and 2270b. Also at the rear of the cradle is tumble drive handle 2280.

Arms 2290a and 2290b include interior plates 2295a and 2295b, which provide extra strength and rigidity as well as a protective covering of portions of the theta drive apparatus. Access to the rears of carriage assemblies 2751a and 2751b is provided by arm openings 2293a and 2293b respectively. Suitable cover plates (not shown in the Figures) may be provided to cover openings 2293a and 2293b. Arms 2290a and 2290b also include end covers 2296a and 2296b respectively. Arm 2290b includes a tumble apparatus to be described below. This apparatus is partially hidden by covers 2297 and 2298. In various figures, interior plates 2295a and 2295b, end covers 2296a and 2296b and tumble covers 2297 and 2298 are removed for clarity.

The theta driving mechanism is essentially the same as described with respect to the first two embodiments, particularly the second embodiment. Thus, only the differences will be mentioned. FIG. 20C is a partially exploded view of arm 2290b with the aforementioned plates and covers removed. Carriage assembly 2751b is thus revealed. It is essentially the same as carriage assembly 1751b of the second embodiment. As in the second embodiment, spherical bearing 2721b is fitted into an opening in carriage plate 2750b. However, no additional through holes, openings or slots are required in carriage plate 2750a as they are in carriage plates 1751a and 1751b. However, the three machined recesses shown on the periphery of carriage plates 1751a and 1751b are shown to be also present on carriage plates 2751a and 2751b. Connected to an end machined opening is carriage connector 2730B; it and the apparatus connected to it are the same as in the second embodiment except for the bearings, which mount shaft 2250b to the cradle.

Side support 2740b is coupled to spherical bearing 2721b by means of stepped shaft 2510. Stepped connecting shaft 2510 has a first end 2521 turned to a diameter to couple with spherical bearing 2721b and a second end 2513 turned to a diameter suitable for insertion in hole 2534 in side support 2740b. Between the two ends is large diameter region 2511, which serves to limit the insertion distance of end 2521 in spherical bearing 2721b, and to provide a surface against which side support 2740b may bear and freely rotate. Side support 2740b includes two holes 2533 that may be used to attach the load with suitable screws. Side support 2740b also includes tumble drive arm 2742. As will be described in more detail below, drive arm 2742 is connected with turn buckle 2415 to tumble traveler 2420, which moves linearly along lead screw 2430, thus causing side support 2740b to rotate.

The interior of the square tube forming the rear 2209 of the cradle is shown in FIG. 21A, which is a sectional view taken at 21A-21A of FIG. 20B. FIG. 21B is the same but viewed from a small angle from the front and below to provide a useful perspective. FIG. 21A illustrates theta drive handle 2270b coupled to shaft 2250b, which in turn is coupled to threaded shaft 2260b by means of coupler 2255b. Threaded shaft 2260b drives nut 2702b and nut extension 2704b, which are compliantly coupled, by means including spring 2710b, to carriage coupler 2730b and hence carriage plate 2250b. This is, thus, the same structure as was described in the second embodiment. The difference is that in the present embodiment, shaft 2250b is supported by bearings 2632b and 2633b, attached to interior faces of rear tube 2209, rather than by pillow blocks or bearings attached to the cradle's sidewall. Pulley 2635b is attached to shaft 2250b and is used to couple shaft 2250b with a similar shaft within arm 2290a by means of a suitable belt (not shown).

Carriage assembly 2751a in arm 2290a is the same as the foregoing; with the exception that side support 2740a does not include a tumble drive arm (such as tumble drive arm 2742 included in side support 2240b). Thus, a load may be attached between side supports 2740a and 2740b in a manner similar to the previous two embodiments. The two shafts 2250a (not shown) and 2250b are coupled with a belt (not shown) arranged as a figure eight so that rotation of either shaft 2250a or 2250b by means of theta drive handle 2270a or 2270b respectively causes the other shaft to rotate in the opposite direction, thereby causing carriage plates 2780a and 2780b to move linearly in opposite directions. Because cradle rear 2209 is straight and at right angles to sides 2290a and 2290b, the path between the two pulleys is straight and parallel to cradle rear 2209. Thus additional idler pulleys to guide the belt are neither needed nor included as in the previous two embodiments.

We now turn to describing the compliant tumble drive mechanism. First, with reference to FIG. 21B in particular, linear rail 2470 is attached to the bottom of cradle arm 2470. Angle bar 2410 is coupled to carriage plate 2450b by corner brace 2405, which is screwed to the machined recess located on the lower edge of carriage plate 2750. Thus, angle bar 2750 moves linearly as carriage plate 2750b moves linearly. Tumble drive handle 2280 is attached to shaft 2450, which is coupled by bearings and bearing blocks 2452a and 2452b to the bottom of cradle arm 2290b. Shaft 2450 is also coupled to angle bar 2410 by means of bearings and bearing blocks 2454 and 2456a. Shaft 2450 may rotate freely and move linearly along its axis with respect to bearing 2452a and 2452b. However, shaft 2450 is constrained to only rotate with respect to bearings 2454 and 2456a by means of appropriate retraining clips, etc., which may be located at bearing 2456a (for example, by the same techniques previously described with respect to the first embodiment for constraining shaft 250b). Thus, shaft 2450 may not move linearly along its axis with respect to angle bar 2410.

Shaft 2450 is coupled to threaded lead screw 2430 by means of flexible coupler 2460. Both the aforementioned bearing 2456a and bearing 2462b, which also supports the proximal end of lead screw 2430, support coupler 2460. Bearing 2458 supports the distal end of lead screw 2430. Threaded lead screw 2430 is oriented so that it is effectively parallel with linear rail 2470. Lead screw 2430 also engages traveler 2480, which is described in more detail below, so that as lead screw 2430 is rotated, traveler 2420 moves along rail 2470. Turnbuckle 2415 couples traveler 2420 to tumble drive arm 2742 so that as traveler 2420 moves, side support 2740b is rotated about the axis 2201 defined by stepped shafts 2510b and 2510a, causing an attached load to rotate about the tumble axis 2201, as described in the previous two embodiments. Turnbuckle 2415 includes ends 2416a and 2416b, which are threaded on to a central shaft. Thus by rotating the central shaft with the ends held fixed, one can adjust the length of turnbuckle 2415 as may be required for a specific situation. Additionally, traveler 2420 includes a number of alternative connection points 2421 where turnbuckle end 2416a may be connected to provide relatively gross adjustments. Turnbuckle ends preferable include spherical bearings through which attachment screws 2417 and 2743 pass for fastening to traveler 2420 and tumble drive arm 2742 respectively; these provide necessary motion freedom in the angle of turnbuckle 2415 relative to arm 2290 as the load is rotated about the theta axis.

Referring to FIGS. 22 through 25A, the structure and function of traveler 2420 and its relationship to linear rail 2470 is now discussed in more detail. FIG. 22 is a perspective view of tumble assembly 2500, comprising the previously described handle 2280, shaft 2450, flexible coupler 2460, traveler 2420, linear rail 2470, lead screw 2430, bearings 2452a, 2454, 2452b, 2456a, 2456b, and 2458, and angle bar 2410.

Referring to FIG. 22A, which provides a magnification of the region included in circle A of FIG. 22, traveler 2420 includes traveler block 2424, end plates 2422a and 2422b (only end plate 2422b is visible in the figure), threaded turnbuckle attachment holes 2421, and linear bearings 2425a and 2425b. Linear bearings 2425a and 2425b engage linear rail 2470, which is attached to cradle side 2290b. Lead screw 2430 passes through traveler 2420. Traveler 2420 is held so that it does not contact angle bar 2410.

FIG. 23 provides a perspective view of traveler block 2424. It includes groove 2510 for receiving linear bearings 2425a and 2425b and screw clearance holes 2511. Cylindrical hole 2515 extends the full length of block 2424 and is open at both ends. At the bottom of hole 2512 is key groove 2518, which also extends the full length of block 2424. For each screw clearance hole 2511 there is a corresponding, coaxial, larger-diameter tooling hole 2512. Tooling holes allow screw clearance holes 2511 to be counter-bored within cylindrical opening 2515 and also allow linear-bearing securing screws to be inserted and with their screw heads nestled in the counter-bores.

FIG. 24 provides a perspective view of cylindrical nut 2520, which includes threaded through hole 2525 and key slot 2522. Cylindrical hole 2515 in block 2424 is sized to receive nut 2520 and to allow nut 2520 to slide with relatively low friction therein. Threaded through hole 2525 is threaded to receive lead screw 2430.

FIG. 25 is the same perspective view of tumble assembly 2500 as is provided in FIG. 22, except that traveler block 2424 is shown with portions cut away. The detailed view of FIG. 25A provides a magnified view inside traveler 2420. Referring to FIGS. 23-25A, key 2524 is inserted into slot 2522 of cylindrical nut 2520, and the combination is inserted into cylindrical hole 2515 of tumble block 2424, with key 2524 fitting into groove 2518. Thus, nut 2520 is prevented from rotating within block 2524, but it is free to slide linearly.

Compression spring 2530a is fitted between endplate 2422a and nut 2520. Similarly, compression spring 2530b is fitted between endplate 2422b and nut 2520. With endplates 2422a and 2422b installed and secured with screws to block 2424, both springs 2530a and 2530b are compressed and provide a biasing assembly. Both end plates 2422a and 2422b include a hole 2423a and 2423b, respectively, located and sized to allow free passage of lead screw 2430. Thus, lead screw 2430 passes through endplate 2422a and compression spring 2530a, is threaded through nut 2520, and then passes through compression spring 2530b and finally through endplate 2422b.

Accordingly, rotation of tumble drive handle 2480 causes corresponding rotation of shaft 2450 and lead screw 2430. Nut 2520 is prevented from rotating in block 2424, and block 2424 is prevented from rotating due to its coupling to linear rail 2740 by means of linear bearings 2425a and 2425b. Thus, nut 2520 moves linearly along lead screw 2430. As nut 2520 is urged to move linearly, force is transferred to and exerted on traveler block 2424 via either of springs 2530a and 2530b and respective endplates 2422a and 2422b. Thus, rotation of drive handle 2480 causes traveler 2420 to travel linearly along lead screw 2430 with liner rail 2470 providing support, auxiliary guidance, and prevention of rotation. (Of course drive handle 2480 could readily be replaced by another type of actuator to provide automation and/or remote control.) As stated previously, the linear motion of traveler 2420 is coupled to side support 2740b by means of turnbuckle 2417 and tumble drive arm 2742, thus causing the supported load to be rotated about the tumble axis 2201.

Compression springs 2530a and 2530b provide resilient compliance for tumble motion of the load. In particular, the threads incorporated in lead screw 2430 and nut 2520 are such that the mechanism is not back drivable. Thus, a force acting on the load in a manner to cause it to rotate about the tumble axis will cause it to rotate to an extent allowed by the further compression of one of springs 2530a and 2530b and the lengthening of the other. This is facilitated by the fact that nut 2520 and key 2524 may be easily moved linearly within block 2424. Thus, the load may be tumbled by an external force, which is compliance. Further, when the force is removed, springs 2530a and 2530b will exert forces that attempt to move the load back to its original position, which is resilience.

It is seen that if a theta adjustment is made in the present embodiment, either by means of rotating a theta drive handle 2270a or 2270b or by means of applying an external force, carriage plate 2750b will move linearly. Because carriage plate 2750b is attached to tumble mechanism 2500 by means of angle brace 2405 and is slidingly attached to cradle arm 2290b by bearings 2452a and 2452b and linear bearings 2530a and 2530b, tumble mechanism 2500 will move linearly with carriage plate 2750b, maintaining the relationship between traveler 2420 and tumble drive arm 2742. Thus, theta motion will not change or effect the orientation of the load with respect to the tumble axis 2201. As with the first two embodiments, tumble motion and theta motion are independent, compliant, resilient, and each is controllable by a single actuator.

In considering the foregoing alternative embodiments 200, 1200 and 2200, it is apparent that combinations of selected features or aspects taken from two or all three of the embodiments could be combined to form further embodiments of the invention. Similarly, various features may be utilized independent of one another or in conjunction with other manipulator systems. For example, the theta motion and compliance assemblies may be used independent of the tumble motion and compliance assemblies and vice versa.

Referring to FIGS. 26 through 29D, an alternative embodiment of the present invention will be described. In this embodiment of the invention, the system 100 is shown with tethers that are used to support "cables" or "cable assemblies" which are coupled to test head 110. As shown in FIG. 26, cables 2612, 2617, 2622 may extend from test cabinet 190 to test head 110. (Note, for simplicity reasons, cables were not included in the system drawings of FIGS. 1A and 1B, which were provided in regards to other aspects of the present invention.) When referring to "cables" or "cable assemblies," this refers to any type of elongated member that is coupled to test head 110. This may include, for example, electrical cables, air conduits, water conduits, etc. For example, the "cables" in FIG. 26 include flexible air duct 2612, liquid coolant tubing 2612, and electrical wiring 2622. It is desirable that those cables be supported in some manner. It is also desirable that as test head 110 is moved through its motion envelope (as described herein and in the previously mentioned co-pending PCT patent application), the cable supports also move in a manner so as to maintain the cable in an orientation that minimizes its effect on the ability of the test head to be moved compliantly by external forces, for example while docking.

In FIG. 26, liquid coolant tubes 2617 are supported by tether 2615, air duct 2612 is supported by tether 2610, and electrical wiring cable 2622 is supported by tether 2620. Sling 2640 is provided to couple air duct 2612 to tether 2610. Tethers 2610, 2615, and 2620 extend from boom 1650, which is rotatably coupled to the top of column 130 by means of swivel coupling 2640. Thus, boom 1650 may pivot about a vertical axis extending through column 130. Accordingly, as test head 110 is moved through its motion envelope (see previously mentioned co-pending PCT patent application for a description of these motions), boom 1650 may rotate with it in order to maintain a near constant distance between the points of support for the cables and the test head.

However, rotation of boom 1650 is not sufficient for effective cable control. It is also desirable to provide vertical motion to the points of cable support. It has been found that the amount and direction of vertical cable support motion that is desirable is dependent upon many factors including the size and resiliency of the cable itself, the motions required in day-to-day operation, the positions of the peripherals to be docked to, and other site specific factors. In some instances it may be desirable for the cable support points to move in the same direction as the test head. In other instances it has been found that moving the cable support in the opposite direction as the test head is beneficial, as this tends to keep the cable straight. In either case there may be circumstances where it is desirable that the cable support points move the same distance as the test head. In other circumstances it may be desirable that the cable support points move a fraction of the distance that the test head moves. Although system 100 in FIG. 26 shows three cables and three supports, it may be desirable to bundle two or more cable entities into a single cable entity. For example, coolant tubes 2617 and air duct 2612 might be bundled together into a single entity. For a given class of test system, such bundling could be different from one user site to the next. Thus, a system, which provides the flexibility of having a variable number of supports is desirable. As will be described the present invention enables a manipulator system 100 to be adapted to such differing situational requirements.

In an exemplary embodiment of the present invention as illustrated in FIG. 26, tethers 2615, 2610, and 2620 are routed, through appropriate openings, up into boom 1650 where they encounter pulleys which direct them along boom 1650 towards swivel coupling 2640. They are then directed downwards into column 130 where they may be further routed terminated in various ways to produce different effects.

FIG. 27 provides a schematic illustration of a first exemplary embodiment. Three cables (not necessarily the same as those in FIG. 26) 2616, 2611, and 2621 are supported by tethers 2615, 2610, and 2620 respectively. Tethers 2615, 2610, and 2620 pass thorough respective openings 2619, 2614, and 2624 in the bottom of boom 1650 and then engage respective pulleys 2618, 2613, and 2623. Thus, tethers 2615, 2610, and 2620 are directed generally horizontally along boom 1650 towards column 130. Tethers 2615, 2610, and 2620 next engage pulleys 2631, 2632, and 2633 respectively, which direct tethers 2615, 2610, and 2620 downwards through opening 2641 in the bottom of boom 1650, through swivel coupling 2640, and then through opening 2642 in the top of column 130. Because, pulleys 2631, 2632, and 2633 are located approximately directly above swivel coupling 2640, boom 1650 may pivot approximately 90 degrees or more about swivel coupling 2640 without undue resistance from tethers 2615, 2610, and 2620 and without adversely effecting tethers 2615, 2610, and 2620.

The arrangement just described and depicted in FIG. 27 allows each of the tethers to be treated individually. Each tether may implement a different motion strategy. For example tether 2615 could move cable 2616 up while tether 2610 moves cable 2611 down. As another example, two tethers may be configured to move in the same direction but at different speeds. Also there are numerous materials that tethers may be made of including fibrous ropes, wire cables, flat-woven straps, etc. Each type of cable generally requires a particular style of pulley for best operation. Thus, if an application requires two tethers to be of different materials, it can be accommodated because each tether is assigned its own unique set of pulleys.

However, there may be situations where requirements can be satisfied by having all tethers behave in the same fashion. In such cases the boom apparatus may be simplified. FIG. 28 is provided to schematically illustrate another exemplary embodiment in which all tethers operate in the same fashion. FIG. 28 has one significant difference in comparison to FIG. 27. Because all three tethers 2615, 2610, and 2620 move in unison, they are all able to share common pulley 2630 to effect their turning from boom 1650 into column 130. Thus, the three pulleys 2631, 2632, and 2633 of FIG. 28 are replaced by a single pulley 2630. If tethers 2615, 2610, and 2620 are made of a material that is round in cross section, such as rope, pulley 2630 may be one of a style that allows tethers 2615, 2610, and 2620 to ride it side-by-side (perhaps each having its own groove to prevent harmful over rides). However, in a preferred version of this exemplary embodiment, tethers 2615, 2610, and 2620 are made a flat, woven strapping. In this case pulley 2630 may have a flat surface and tethers 2615, 2610, and 2620 may round pulley 2630 stacked one on top of another. If the diameter of pulley 2630 is relatively large in comparison to the thickness of the strapping, any slippage between adjacent straps will be minimal.

Although we have so far considered exemplary systems that include three tethers, it is clear any practical number of tethers may be accommodated, for example from just one to as many as four or five. Thus, a system may be designed and manufactured so that it can be adapted to handle any reasonable number of tethers according to application and situational needs that are not known a priori.

Referring to FIGS. 29A, 29B, 29C, and 29D, options in routing and terminating a tether within column 130 will be described. FIGS. 29A, 29B, 29C, and 29D provide schematic illustrations based on a manipulator described in the co-pending PCT patent application noted previously, however, the invention is not limited to such and the cable handling systems described herein may be used with various types of manipulators, including the pneumatic system described below or in counterbalanced systems, for example, as described in U.S. Pat. Nos. 4,527,942 and 6,396,257 and co-pending provisional patent application No. 61/037,065, which are incorporated herein by reference.

Thus, in FIGS. 29A, 29B, 29C, and 29D, test head 110 is coupled to arm unit 140, which may move vertically along the exterior of column 130. Pneumatic cylinder 4010 includes piston 4012, which is connected to piston rod 4014. Lift carriage 4020 includes pulleys 4025 and is supported by piston rod 4014. Supporting cable or strap 4030 is secured to a stationary point relative to column 130, led over pulleys 4025 and downwards to support arm unit 140 and test head 110. thus, vertical motion of piston 4012, effected by adding or releasing air from cylinder 4010 causes vertical motion of test head 110. Also, by maintaining a suitable air pressure within cylinder 4010, test head 110 may be kept in a substantially weightless or compliant condition with respect to vertical motion. Those familiar with the art will recognize that test head 110 will move at twice the speed of lift carriage 4020. In other words motion of test head 110 through a certain distance corresponds to motion of lift carriage 4020 through half that distance.

Figure 29A:
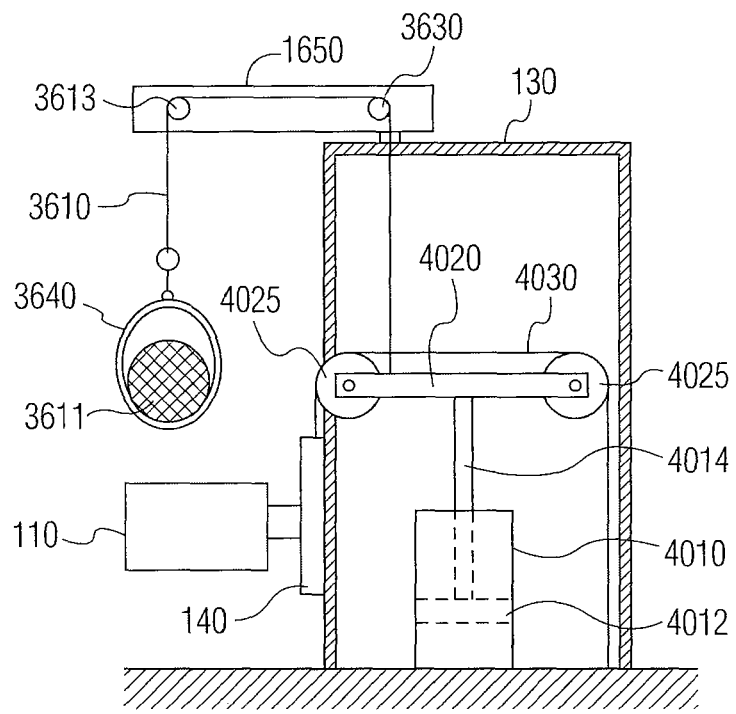

Also in all FIGS. 29A, 29B, 29C, and 29D, exemplary cable 3611 is supported by exemplary sling 3640, which is in turn supported by exemplary tether 3610. Exemplary tether 3610 extends upwards from sling 3640 into boom 1650; it then rounds pulleys 3613 and 3630 and descends into column 130. In FIG. 29A, tether 3610 terminates directly onto lift carriage 4020. Thus as lift carriage 4020 moves up, sling 3640 and cable 3611 move down and vice versa. Also, sling 3620 and cable 3611 move the same distance that lift carriage 4020 moves. Because lift carriage 4020 moves half the distance that test head 110 move, cable 3611 also moves half the distance that test head 110 moves. Thus, the configuration illustrated by FIG. 29A provides a tether that moves a cable half the distance that the test head moves but in the opposite direction.

Figure 29B:
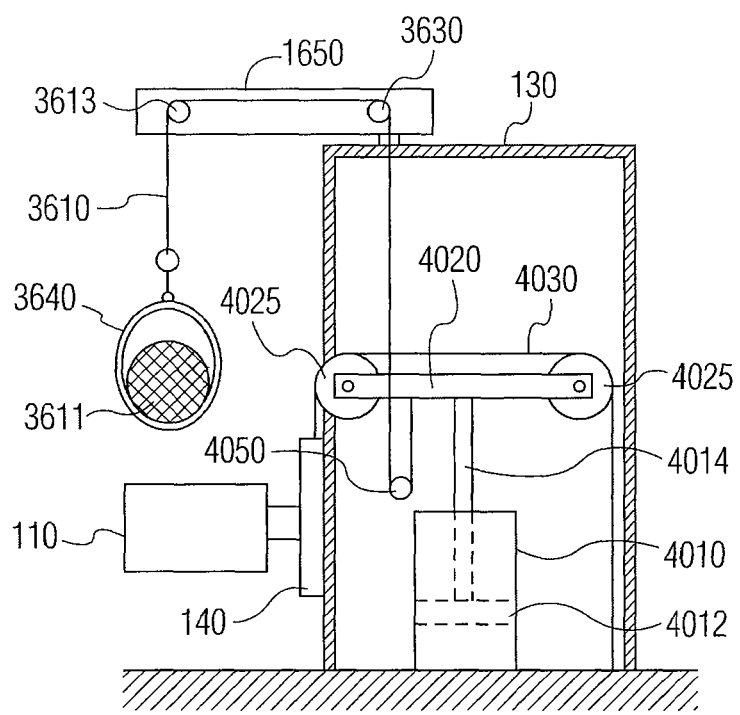

FIG. 29B illustrates an exemplary embodiment in which tether 3610 is led below lift carriage 4020, passed 180 degrees around pulley 4050, and is finally terminated on lift carriage 4020. Sling 3640 and cable 3611 move in the same direction as lift carriage 4020 in FIG. 29B. This is because the direction of tether 3610 is reversed in comparison to FIG. 29A when it terminates at lift carriage 4020. As in FIG. 29A, sling 3640 and cable 3611 move half the distance that test head 110 moves. Thus, the configuration illustrated by FIG. 29B provides a tether that moves a cable half the distance that the test head moves and in the same direction.

Figure 29C:
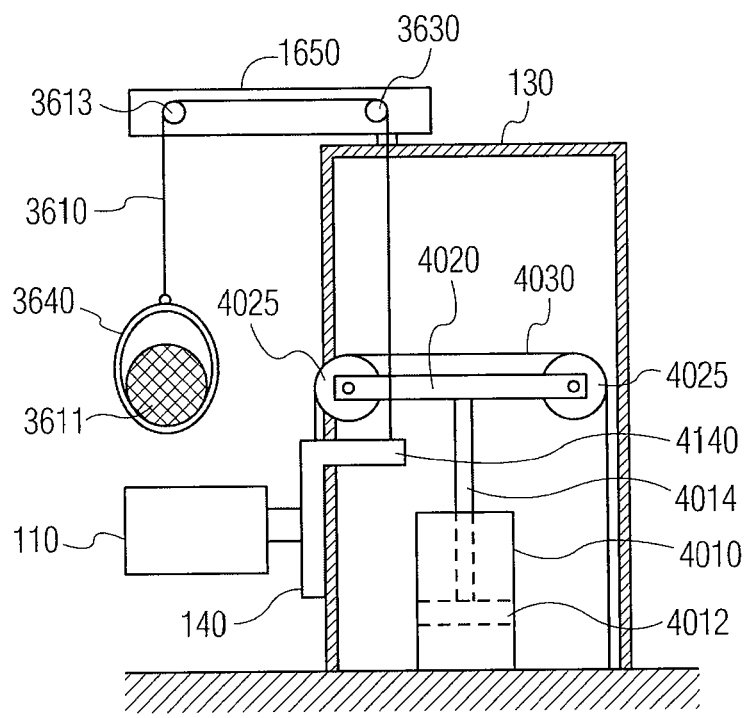
Figure 29D:
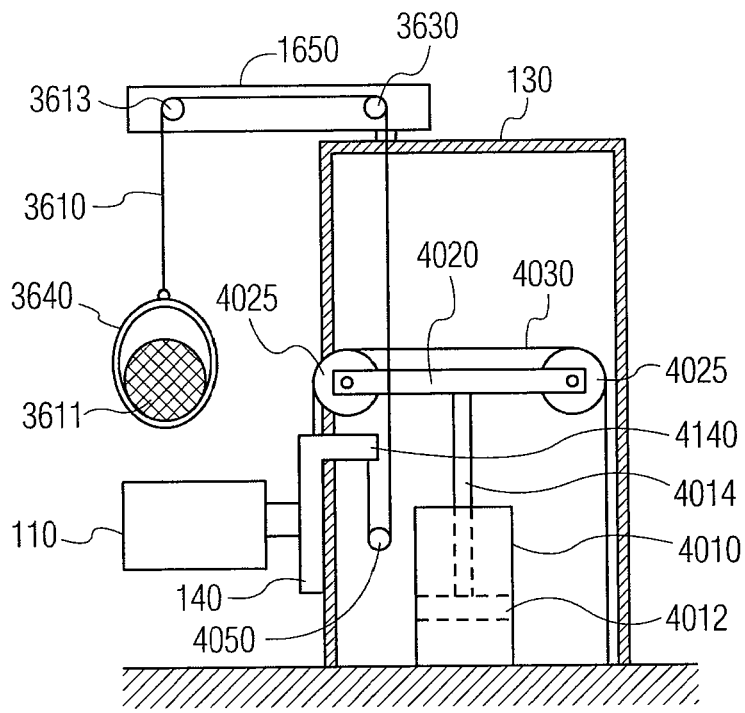

In FIGS. 29C and 29D, tether attachment bracket 4140 has been added to arm unit 140. Attachment bracket 4140 extends inside column 130 so that tether 3610 may be attached to it. Thus, in FIG. 29C tether 3610 is attached directly to attachment bracket 4140 so that sling 3640 and cable 3611 will move the same distance as arm unit 140 and test head 110, but in the opposite direction. In FIG. 29D, the direction of tether 3610 is reversed before it is attached to attachment bracket 4140. Thus, in this case sling 3640 and cable 3611 will move the same distance and in the same direction as arm unit 140 and test head 110. Thus, the configuration illustrated by FIG. 29C provides a tether that moves a cable the same distance that the test head moves but in the opposite direction. Also, the configuration illustrated by FIG. 29D provides a tether that moves a cable the same distance that the test head moves and in the same direction.

The concepts illustrated in the exemplary embodiments of FIGS. 29A through 29D may, of course be applied to any reasonable number of tethers within one system. In systems having independent tethers as described in relation to FIG. 27, each individual tether may have a unique routing and termination within column 130 so that the characteristics of each tether may, accordingly, be different from one another. Further, the concept of multiple tethers and different possible tether behaviors is not restricted to manipulators of the type used in the exemplary embodiments. By incorporating various pulleys and mechanical advantage devices they may be readily adapted to other pneumatic-operated manipulators as well as counterbalanced and "hard-driven" manipulators. Further, the invention is not limited to the possibilities that were presented. By incorporating various mechanical advantage devices such a ball screws, stepped pulleys, multi-part tackles, etc., an endless variety of options is available in providing cable support motions in the same of opposite directions as the test head and at speeds or distances traveled the same, a multiple of, or a fraction of the test head's.

Referring to FIGS. 30 through 33E, a similar cable handling assembly is shown and described for a counterbalanced manipulator system. Referring to FIGS. 30-32, tethers 8610 and 8615 are provided with appropriate coupling gear 8611 and 8616, such as slings or elastic cords, to support electrical wiring cables and coolant tubing or ducts which are coupled to the test head. Tethers 8610 and 8615 extend from boom 7650, which is rotatably coupled to the top of column 130 by means of swivel coupling 8640. Thus, boom 7650 may pivot about a vertical axis extending through column 130. Accordingly, as the test head is moved through its motion envelope, boom 7650 may rotate with it in order to maintain a near constant distance between the points of support for the cables and the test head.

The present exemplary embodiment shown in FIGS. 30-32 provides two tethers 8610 and 8615 as supports. Tethers 8610 and 8615 are routed, through appropriate openings, up into boom 7650 where they encounter pulleys which direct them along boom 7650 towards swivel coupling 8640. Tethers 8610 and 8615 are then directed downwards into column 130 where they are routed and terminated to produce the desired motion effect.

FIG. 32 provides a schematic illustration of the above. Two cable entities 8611 and 8616 are supported by tethers 8610 and 8615, respectively. Tethers 8610 and 8615 pass through respective openings 8614 and 8619 in the bottom of boom 7650 and then engage respective pulleys 8613 and 8618. Thus, tethers 8610 and 8615 are directed generally horizontally along boom 7650 towards column 130. In the present exemplary embodiment, requirements can be satisfied by having both tethers behave in the same fashion. Thus, both tethers 8610 and 8615 move in unison; and both simultaneously engage single pulley 8630, which directs them downwards through swivel coupling 8640 into column 130. Because, pulley 8630 is located approximately directly above swivel coupling 8640, boom 7650 may pivot approximately 90 degrees or more about swivel coupling 8640 without undue resistance from tethers 8610 and 8615 and without adversely effecting tethers 8610 and 8615.

If tethers 8610 and 8615 are made of a material that is round in cross section, such as rope, pulley 8630 may be one of a style that allows tethers 8610 and 8615 to ride it side-by-side (perhaps each having its own groove to prevent harmful over rides). However, in a preferred version of this exemplary embodiment, tethers 8610 and 8615 are made of a flat, woven strapping. In this case pulley 8630 may have a flat surface and tethers 8610 and 8615 may round pulley 8630 stacked one on top of another. If the diameter of pulley 8630 is relatively large in comparison to the thickness of the strapping, any slippage between adjacent straps will be minimal.

While two tethers are described and illustrated herein, any number of tethers may be accommodated, for example from just one to as many as four or more. Thus, a system may be designed and manufactured so that it can be adapted to handle any reasonable number of tethers according to application and situational needs that are not known a priori. In FIG. 30, for example, a number of pulley mounting points 7652 are shown, which enable a variable number of pulleys and pulley locations, enabling the system to be adapted to different situations and changing needs.

In FIG. 31, which is a detailed rear view of column 130 with the rear door removed, it is seen that tethers 8610 and 8615 are directed downwards and are fastened to an eyebolt attached to the upper surface of counterweight assembly 1500. Thus, the test head load, the counterweights and the tethers will all move vertically as a single unit. The situation is illustrated schematically for a single tether, say tether 8610, in FIG. 33A.

Figure 33A:
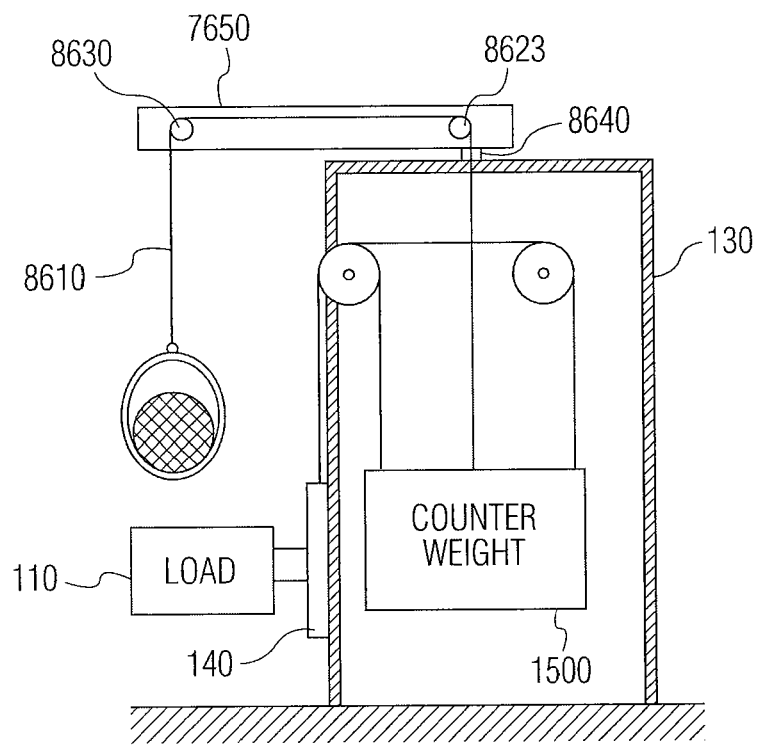

In FIG. 33A, a load 110 is supported by vertical carriage 140 that may move vertically along column 130. As can be seen, as the load 110 moves upwards, the counterweights 1500 move downwards and vice versa. The illustrated cable entity is supported by tether 8610. Tether 8610 passes over pulleys 8623 and 8630 within boom 7650 and is finally attached to the counterweights 1500. Thus, for example, as the load 110 is moved up a distance X, the counterweights 1500 move down the same distance X, causing the cable entity to be raised the distance X. Accordingly, this arrangement causes the cable support to be moved in the same direction and the same distance as the test head as desired.

Figure 33B:
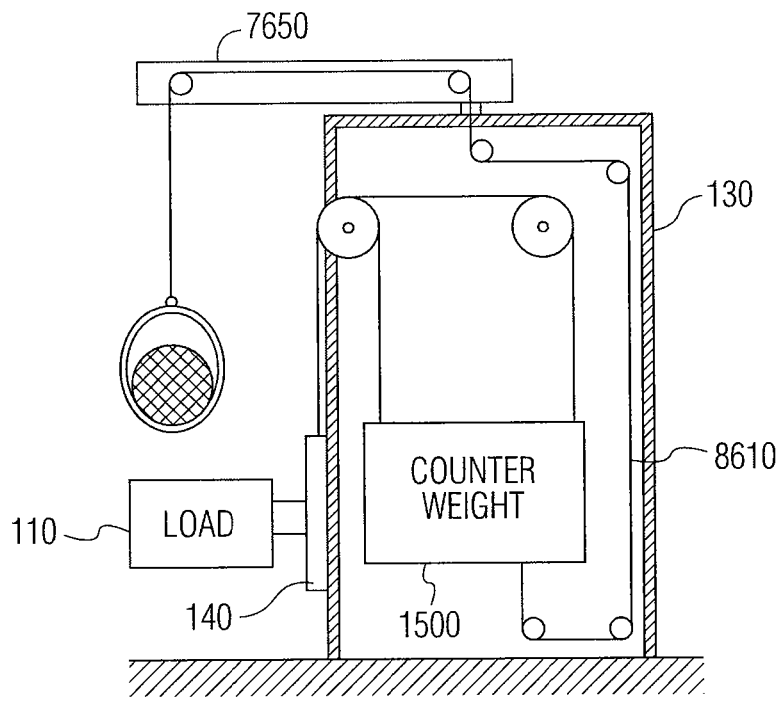

In the embodiment illustrated in FIG. 33B, the tether 8610 passes around further pulleys and is attached to the lower surface of the counterweights 1500. As such, this arrangement causes the cable support to be moved the same distance as the test head, but in the opposite direction.

Figure 33C:
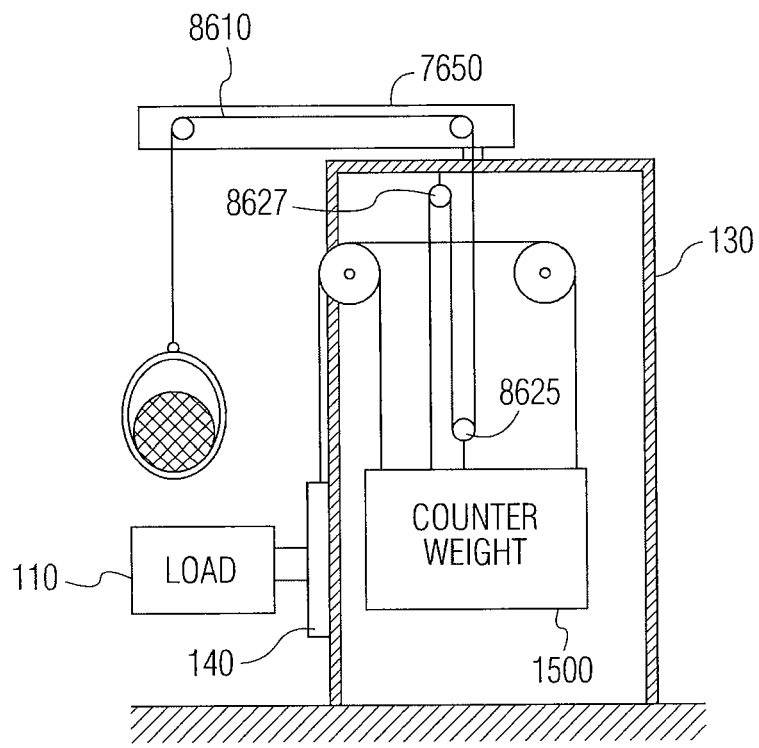

In the embodiment illustrated in FIG. 33C, the tether 8610 passes around additional pulleys 8625 and 8625 between the boom 7650 and the upper surface of counterweights 1500. The two additional pulleys 8625 and 8627 provide a three fold mechanical advantage. As such, this arrangement causes the cable support to be moved in the same direction as the test head and three times the distance as the test head.

Figure 33D:
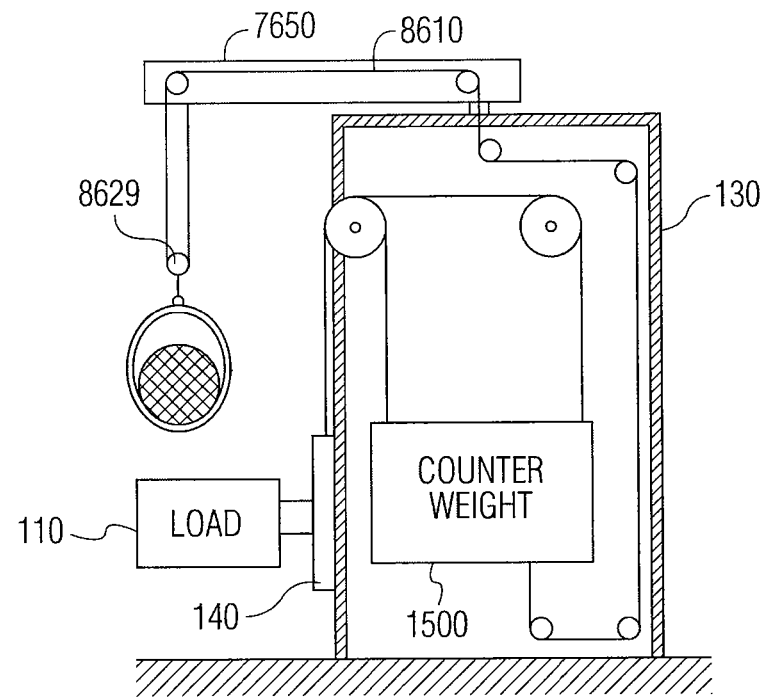

In the embodiment illustrated in FIG. 33D, the tether 8610 passes around an additional pulley 8629 between the boom 7650 and the cable entity. The tether 8610 is also connected to the lower surface of the counterweights 1500. As such, this arrangement causes the cable support to be moved half the distance as the test head and in the opposite direction.

Figure 33E:
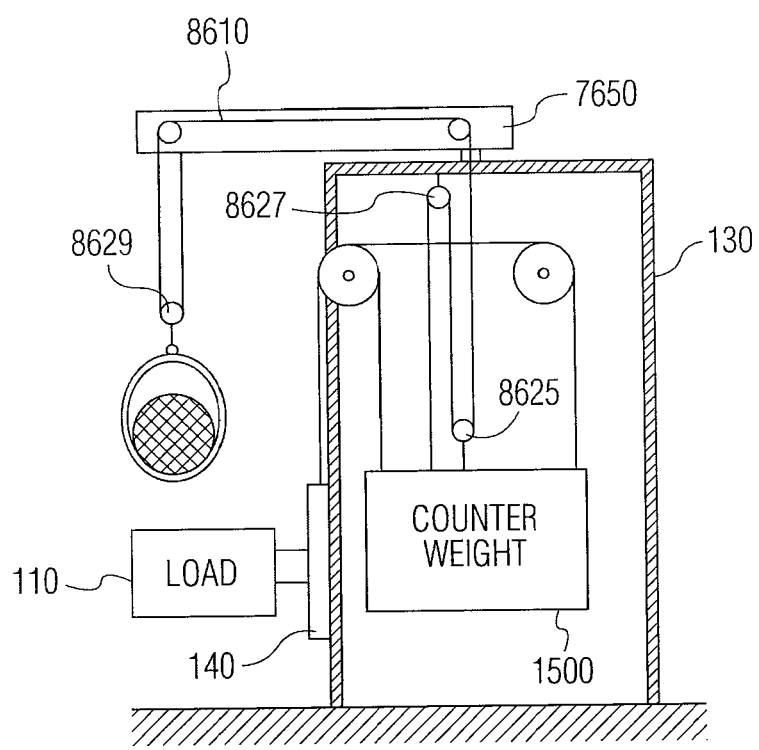

In the embodiment illustrated in FIG. 33E, the tether 8610 passes around additional pulleys 8625 and 8625 between the boom 7650 and the upper surface of counterweights 1500 and about additional pulley 8629 between the boom 7650 and the cable entity. As such, this arrangement causes the cable support to be moved in the same direction as the test head and one and one-half times the distance as the test head. These arrangements are for illustrative purposes only. Various configurations of pulleys and tethers may be utilized to obtain a desired relationship between load movement and cable movement.

While exemplary embodiments of the invention have been shown and described herein, it will be understood that such embodiments are provided by way of example only. Numerous variations, changes and substitutions will occur to those skilled in the art without departing from the spirit of the invention.

Accordingly, it is intended that the appended claims cover all such variations as fall within the spirit and scope of the invention.

What is claimed:

1. A cable support sustem comprising;
   a support column which includes a lift carriage which moves up and down;
   an arm adapted to support a test head, said arm moves with said lift carriage; and
   one or more tethers configured to support a cable, said one or more tethers coupled to the lift carriage and which moves when the lift carriage moves, wherein the one or more tethers move the supported cable in the same or opposite direction as the test head moves at a rate that is different than the rate of motion at which the test head moves up and down.

2. A cable support system as in claim 1 wherein each tether depends from a boom pivotally supported on the support column at a swivel coupling.

3. A cable support system as in claim 2 wherein each tether extends through the boom, over at least one boom pulley, through the swivel coupling and into the support column.

4. A cable support system as in claim 3 wherein each tether is attached to a test head counter force within the support column.

5. A cable support system as in claim 4 wherein the test head counter force is provided by a fluid cylinder.

6. A cable support system as in claim 4 wherein the test head counter force is provided by a counterweight.

7. A cable support system as in claim 3 wherein each tether extends over a separate boom pulley and each boom pulley is located approximately directly above the swivel coupling.

8. A cable support system as in claim 3 wherein all of the tethers extend over a single boom pulley and the boom pulley is located approximately directly above the swivel coupling.

9. A cable support system as in claim 8 wherein the boom pulley defines distinct paths for the tethers.

10. A cable support system as in claim 8 wherein the boom pulley includes a single path for the tethers and the tethers overlap one another.

11. A cable support system as in claim 4 wherein one or more secondary pulleys are positioned between the boom pulley and the test head counter force, the boom pulley and the supported cable, or a combination thereof to control the direction of travel and the constant.

* * * * *